(12) United States Patent
Kajitani et al.

(10) Patent No.: US 7,414,907 B2
(45) Date of Patent: Aug. 19, 2008

(54) SEMICONDUCTOR MEMORY DEVICE

(75) Inventors: Yasuyuki Kajitani, Yokohama (JP); Daisuke Kato, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/766,486

(22) Filed: Jun. 21, 2007

(65) Prior Publication Data
US 2007/0258303 A1 Nov. 8, 2007

Related U.S. Application Data

(62) Division of application No. 11/490,234, filed on Jul. 21, 2006, now Pat. No. 7,251,176, which is a division of application No. 11/095,883, filed on Apr. 1, 2005, now Pat. No. 7,102,947.

(30) Foreign Application Priority Data

| Apr. 9, 2004 | (JP) | ............................. 2004-115700 |
| Jan. 21, 2005 | (JP) | ............................. 2005-014180 |

(51) Int. Cl.
*G11C 7/02* (2006.01)
(52) U.S. Cl. ...................................... 365/207; 365/205
(58) Field of Classification Search ................. 365/207, 365/205, 149
See application file for complete search history.

(56) References Cited

U.S. PATENT DOCUMENTS

| 4,799,197 A * | 1/1989 | Kodama et al. ............. 365/205 |
| 5,091,885 A | 2/1992 | Ohsawa |
| 5,426,603 A * | 6/1995 | Nakamura et al. .......... 365/149 |
| 5,708,616 A * | 1/1998 | Choi ........................... 365/205 |
| 5,936,898 A | 8/1999 | Chi |
| 5,953,259 A | 9/1999 | Yoon et al. |
| 6,016,279 A | 1/2000 | Chi |
| 6,147,925 A | 11/2000 | Tomishima et al. |
| 6,345,006 B1 | 2/2002 | Ingalls et al. |

(Continued)

FOREIGN PATENT DOCUMENTS

JP 9-55482 2/1997

(Continued)

*Primary Examiner*—Anh Phung
(74) *Attorney, Agent, or Firm*—Oblon, Spivak, McClelland, Maier & Neustadt, P.C.

(57) ABSTRACT

A semiconductor memory device including a memory cell array which has a plurality of memory cells arranged in a matrix form, a plurality of bit line pairs which transfer data among the memory cells, a sense amplifier bank which includes a plurality of sense amplifiers, the plurality of sense amplifiers including a plurality of sense amplifier circuits, and the plurality of sense amplifier circuits being connected respectively to the plurality of bit line pairs to amplify data transferred to the bit line pairs, a plurality of word lines connected to the memory cells, a plurality of wirings disposed respectively corresponding to the plurality of word lines and above the plurality of word lines, and a plurality of stitch portions which connect the plurality of word lines to the plurality of wirings every predetermined intervals. Two active areas in which the sense amplifier circuit is formed respectively in both sides of a stitch area corresponding to each of the stitch portions in the sense amplifier bank are connected to each other, and a dummy transistor is disposed on the connected active areas.

1 Claim, 41 Drawing Sheets

U.S. PATENT DOCUMENTS 6,522,579 B2 2/2003 Hoenigschmid
6,584,027 B2 * 6/2003 Shinozaki ................... 365/205

FOREIGN PATENT DOCUMENTS

| JP | 2907226 | 4/1999 |
| JP | 3004177 | 11/1999 |
| JP | 2000-231790 | 8/2000 |
| JP | 2001-168302 | 6/2001 |
| JP | 3202580 | 6/2001 |
| JP | 2002-208277 | 7/2002 |

* cited by examiner

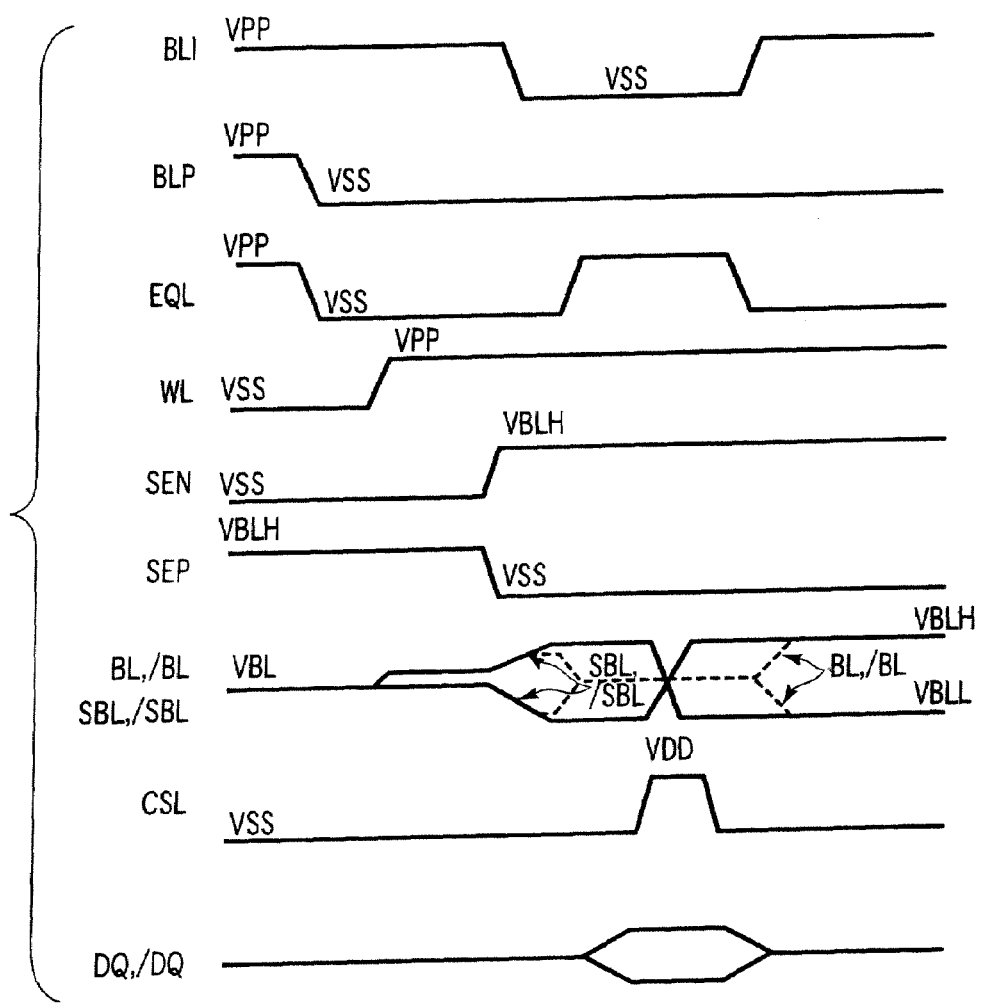
F I G. 19

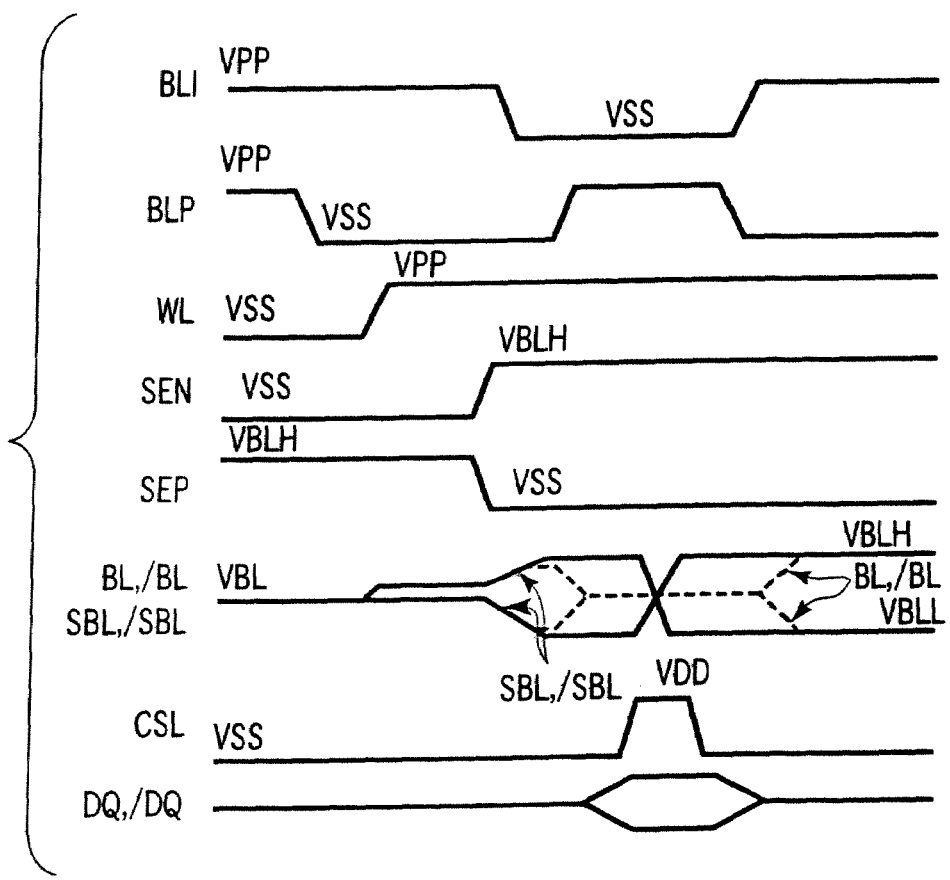
F I G. 20

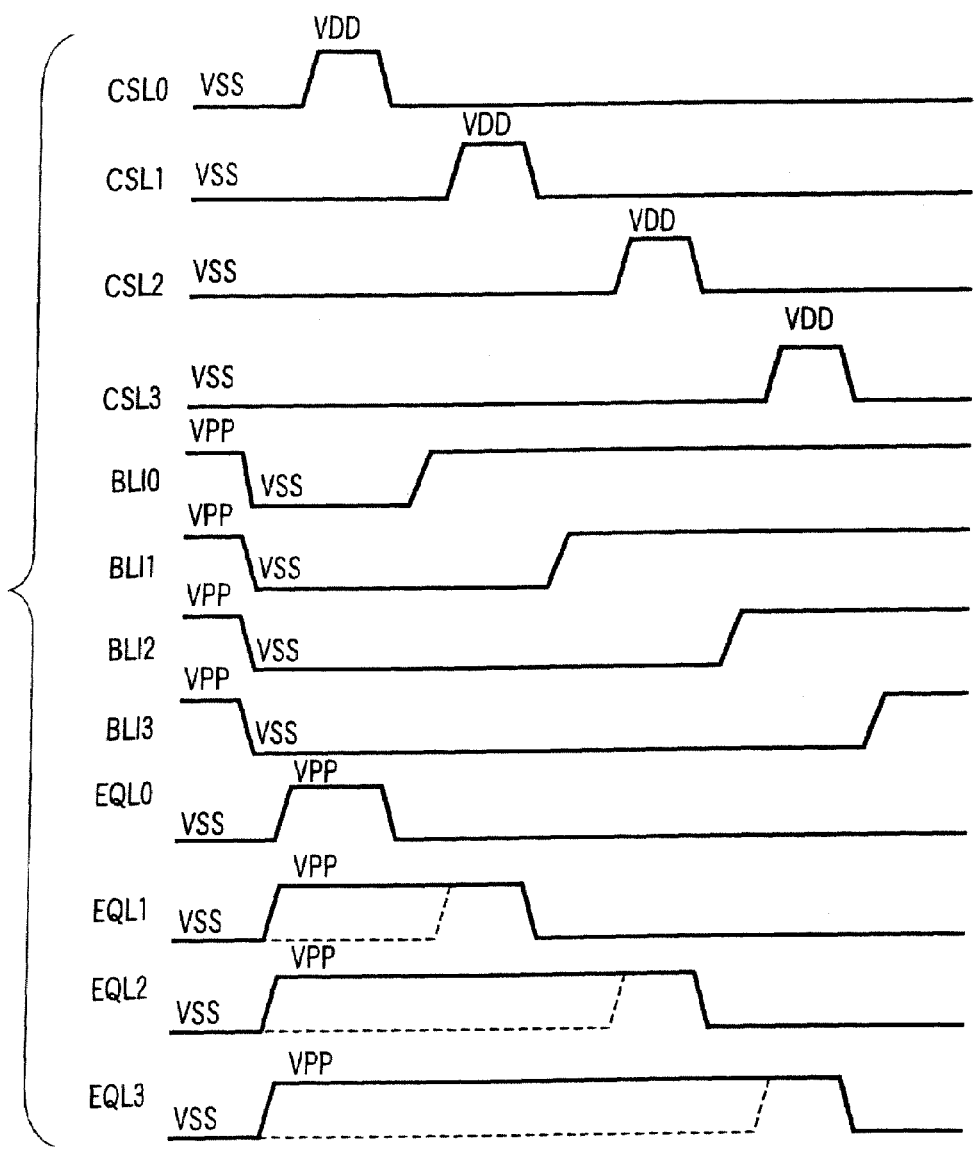
F I G. 22

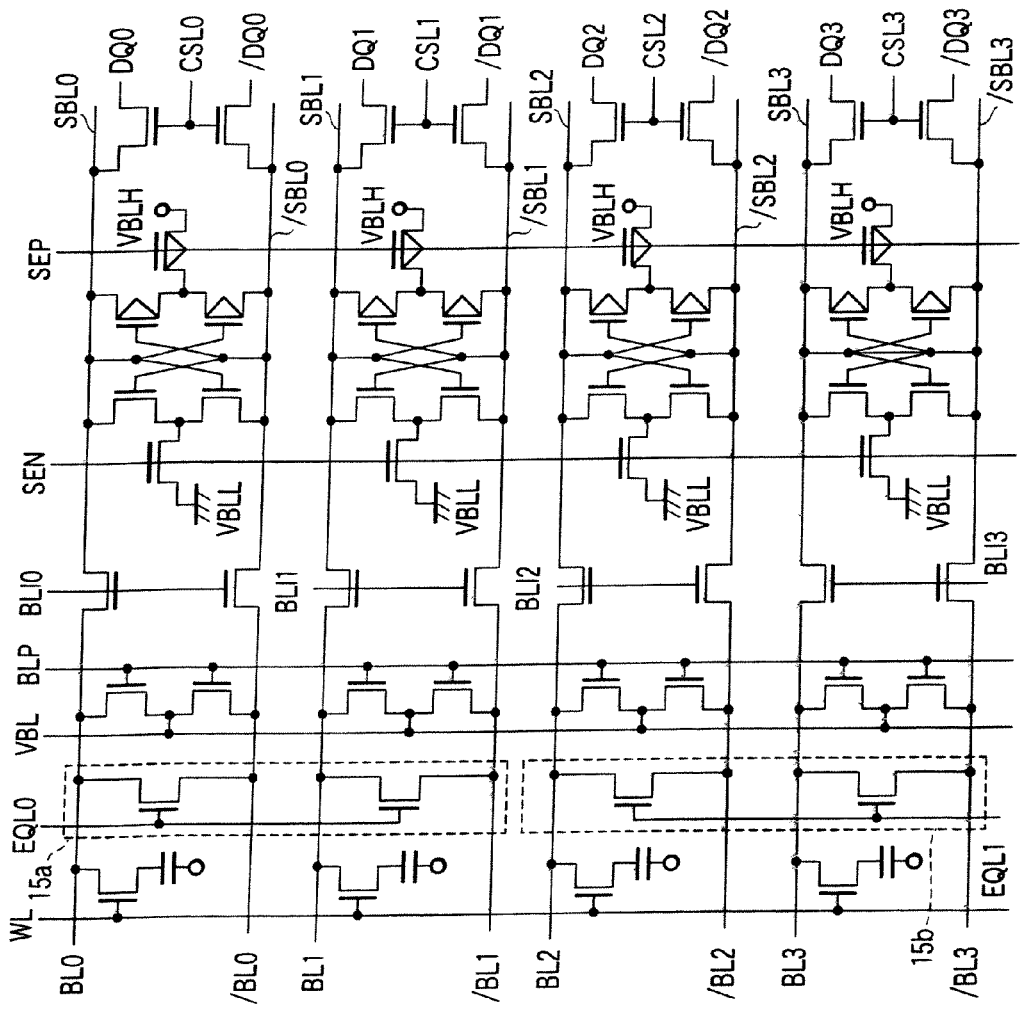
F I G. 23

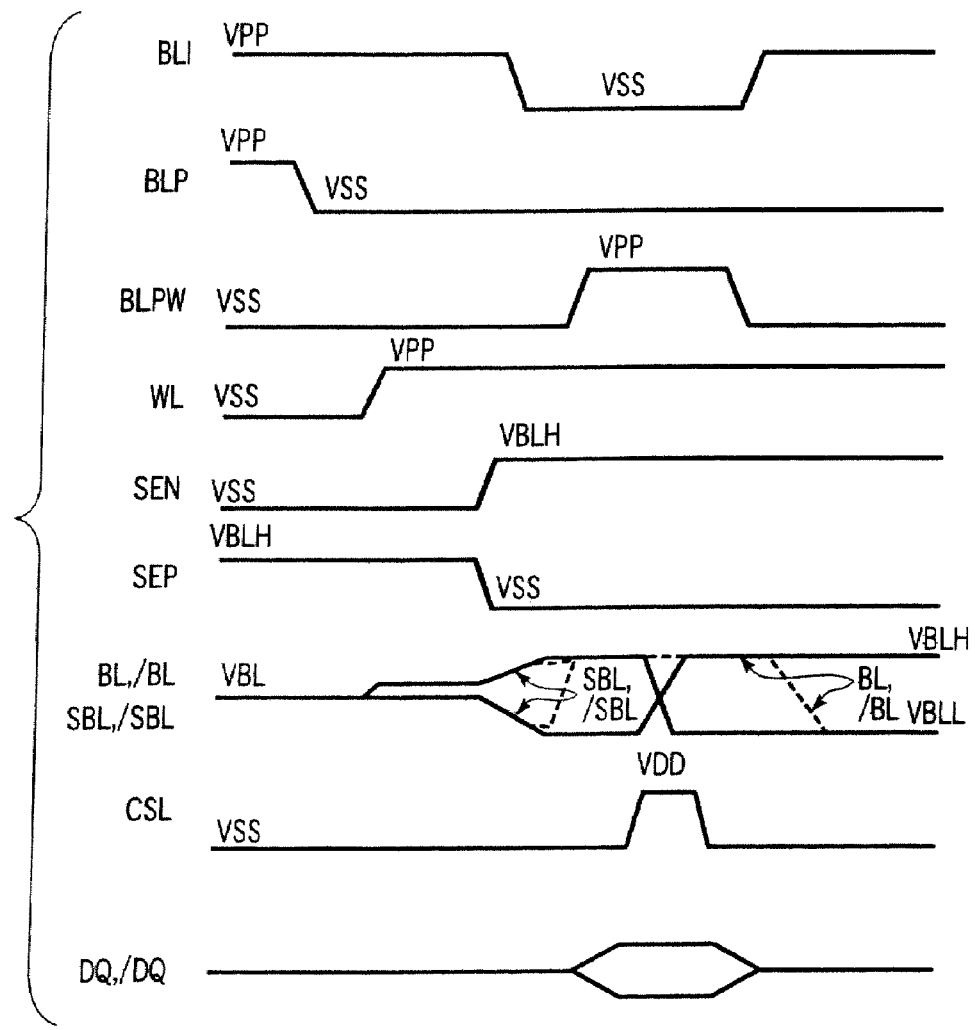
F I G. 27

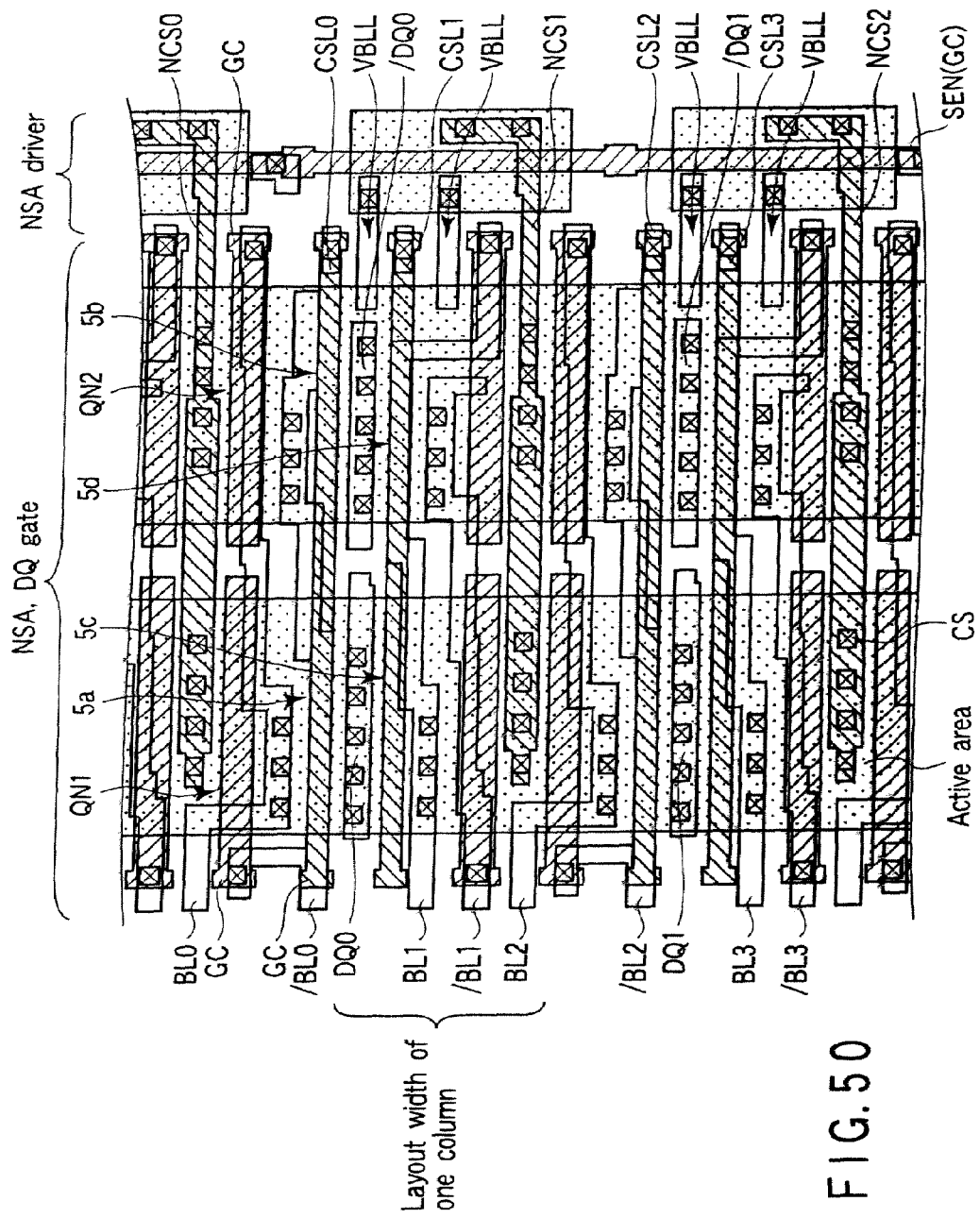
F I G. 50

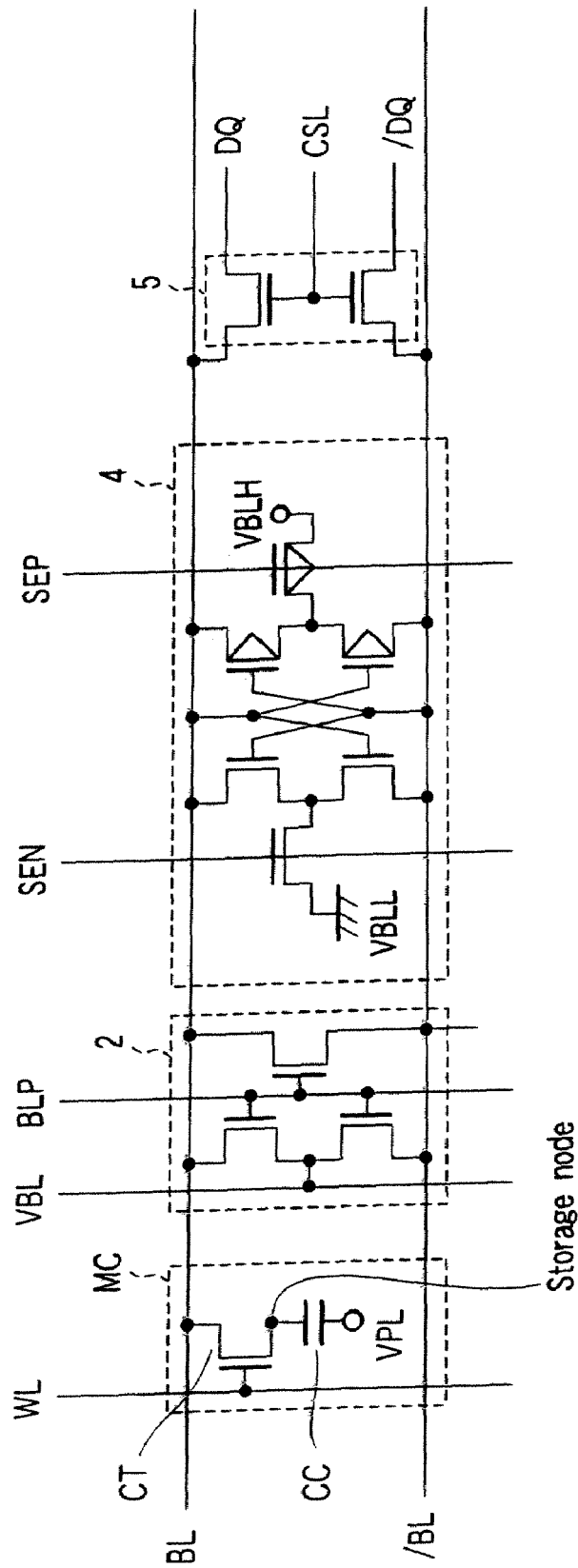
F I G. 57

SEMICONDUCTOR MEMORY DEVICE

CROSS-REFERENCE OF RELATED APPLICATIONS

This application is a divisional of and claims priority to U.S. application Ser. No. 11/490,234, filed on Jul. 21, 2006, now U.S. Pat. No. 7,251,176, issued on Jul. 31, 2007, which is a divisional of U.S. Pat. No. 7,102,947 issued Sep. 5, 2006 and further claims priority to prior Japanese Patent Application No. 2004-115700, filed Apr. 9, 2004; and No. 2005-014180, filed Jan. 21, 2005. The entire contents of these applications are incorporated herein by reference.

BACKGROUND OF THE INVENTION

1. Field of the Invention

The present invention relates to a semiconductor memory device, and more particularly to a semiconductor memory device which comprises a circuit for writing data to a memory cell.

2. Description of the Related Art

A writing operation of a conventional semiconductor memory device such as a dynamic random access memory (DRAM) will be described. FIG. 57 is a circuit diagram showing a part of a DRAM configuration. This DRAM comprises a memory cell array in which memory cells MC are arranged in a matrix form, a plurality of bit line pairs BL, /BL, a plurality of word lines, a precharge circuit 2, a sense amplifier circuit 4, a DQ gate 5, and data line pairs DQ, /DQ (only one memory cell is representatively shown).

The memory cell MC is configured by serially connecting a cell transistor CT and a capacitor CC. A reference voltage VPL is supplied to the memory cell MC. A precharge voltage VBL is supplied to the precharge circuit 2. The precharge circuit 2 supplies VBL to the bit line pair BL, /BL by activating a bit line precharge signal BLP. At this time, the VBL is equal to a high-level bit line voltage VBLH, (VBLH−VBLL)/2, a low-level bit line voltage VBLL, another other potential or the like.

The high-level bit line voltage VBLH and the low-level bit line voltage VBLL are supplied to the sense amplifier circuit 4. The sense amplifier circuit 4 amplifies data of the bit line pair BL, /BL by activating sense amplifier activation signals SEN and SEP. The DQ gate 5 transfers data between the data line pair DQ, /DQ and the bit line pair BL, /BL by activating a column selection signal CSL.

FIG. 58 is a timing chart of the DRAM shown in FIG. 57. It is to be noted that VDD represents a power supply voltage of a peripheral logic portion, VPP represents a word line driving voltage boosting the VDD, and VSS represents a ground voltage.

The bit line precharge signal BLP changes from a "H" level (e.g., VPP, VBLH, VDD) to a "L" level (VSS) to release the precharging of the bit line pair BL, /BL. When a word line WL changes from a "L" level (VSS) to a "H" level (VPP), data stored in the memory cell MC appear in the bit line pair BL, /BL.

After the passage of certain time, the signal SEN is changed from a "L" level (VSS) to a "H" level (e.g., VBLH, VDD), and the signal SEP is changed from a "H" level (e.g., VBLH) to a "L" level (VSS), whereby the data appearing in the bit line pair BL, /BL are amplified.

Accordingly, the bit line of the high-level side becomes VBLH, while the bit line of the low-level side becomes VBLL (VSS normally). Then, by changing the column selection signal CSL from a "L" level (VSS) to a "H" level (e.g., VDD, VBLH), the data of the bit line pair BL, /BL are transferred to the data line pair DQ, /DQ in the case of reading. On the other hand, in the case of writing, the data of the data line pair DQ, /DQ are transferred to the bit line pair BL, /BL. Thus, a writing operation is performed.

Meanwhile, to meet a demand for high device performance (high-speed operation, suppression of power consumption), miniaturization based on a scaling rule has progressed, and a power supply voltage applied to the transistor in the chip has been lowered from generation to generation. With further miniaturization in the future, however, the fall of power supply voltage will probably become a large problem in designing of a semiconductor memory.

The fall of power supply voltage must be accompanied by a fall of threshold voltage of the transistor. However, for example, an increase of cell leakage caused by the fall of threshold voltage becomes a problem in a static random access memory (SRAM). In the DRAM, the progress in miniaturization has brought about a difficulty of securing a cell capacity or suppressing leakage current. Consequently, when the power supply voltage (high-level bit line voltage VBLH) is lowered, the amount of charges accumulated in the cell is reduced, deteriorating data saving performance.

To deal with the problem, the power supply voltage of the memory cell portion will have to be set higher than that of the peripheral logic portion in the future. In such a case, as shown in FIG. 59, external circuits (including DQ buffer) outside the data line pair DQ, /DQ operate by the same voltage VDD as that of the peripheral logic portion to suppress power consumption, while the sense amplifier circuit 4 operates by VBLH or the like, which is a voltage higher than the voltage VDD.

When a transistor of a type different from that of the peripheral logic portion is used in the memory cell portion of a high power supply voltage (e.g., transistor used at a low voltage has characteristics such as a short gate length, a thin gate oxide film and the like for the purpose of achieving a high speed), from the standpoint of reliability, the voltage VBLH used for the sense amplifier circuit 4 must not be applied to the circuits outside the data line pairs DQ, /DQ.

A simplest method as countermeasures is to drive the signal CSL by VDD. Then, when data reverse to that held in the sense amplifier circuit 4 is written to the memory cell MC at the time of writing, i.e., when the data of the bit line pair BL, /BL must be reversed, the data held in the sense amplifier circuit 4 by a voltage VBLH must be reversed by the DQ gate 5 driven by VDD lower than the VBLH. Thus, the data cannot be reversed unless a size of the transistor constituting the DQ gate 5 is set very large.

As other countermeasures, a method of making sizes of transistors (sense amplifier pair transistor, sense amplifier driver) constituting the sense amplifier circuit 4 small may be employed. In this case, however, a transition speed of the bit line pair BL, /BL becomes slow. Thus, unless deactivation timing of the word line WL is delayed, a voltage level of data stored in the memory cell MC during restoring (rewriting of data read to the bit line) and writing to the memory cell MC is lowered.

Conventional configurations of an sense amplifier driver (SA driver) and a common source line (NCS, PCS) are as follows.

To begin with, when only one SA driver (NSA driver, PSA driver) is arranged in a sense amplifier control circuit or the like for a sense amplifier bank (SA bank) constituted of a plurality of sense amplifiers, as shown in FIG. 60, sense amplifier circuits of all columns in the SA bank must be connected to one common source line connected to the SA driver. As shown in FIG. 61, for example, the sense amplifier control circuits are arranged in areas adjacent to the SA bank and a row decoder.

Next, when a plurality of SA drivers are arranged in the SA bank, the plurality are arranged corresponding to WL stitch areas (in the case of a layered WL configuration, area in which the SA bank and a sub WL driver area intersect each other) present in a plurality of places in the SA bank. In this case, at least the sense amplifiers of all the columns in the SA bank must be classified for each WL stitch area, and each classified sense amplifier group must be connected to the common source line connected to the SA driver arranged in each WL stitch area. Further, for a reason below, the sense amplifier circuits of all the columns in the SA bank are connected to one common source line.

When a plurality of SA drivers are arranged in the SA bank, in a period until potentials (high-level/low-level) of the bit line pairs BL, /BL determine by activating the sense amplifier circuit, the sense amplifier circuits of all the columns simultaneously perform sense operations. Thus, during this period, driving efficiency of all the plurality of SA drivers is distributed and assigned to all the columns.

However, in the case of a writing operation, normally, data of only a column to which writing is carried out from a state in which potentials (high-level/low-level) of bit line pairs BL, /BL of all the columns in the SA bank determined by activating the sense amplifier circuit is rewritten. At this time, if the plurality of SA drivers are all connected to the common source line connected to the sense amplifier circuit of the column to which the writing is carried out, the driving efficiency of all the plurality of SA drivers can be concentrated on the column to which the writing is carried out, and a writing speed can be made fast (especially, in the PSA driver). Thus, to achieve the highest writing speed, the sense amplifier circuits of all the columns and all the SA drivers are connected to one common source line.

As the common source line is connected to the sense amplifier circuits of all the columns, the SA drivers may be arranged in any places on the common source line. Such high layout freedom of the SA drivers enables optimization of the layout of the entire SA bank as a result, making it possible to minimize an area of the entire SA bank.

For example, in Document 1 (Published Japanese Patent No. 3202580) and Document 2 (Jpn. Pat. Appln. KOKAI Publication No. 2002-208277), by setting an arranging pitch of a layout repeating unit in the SA bank smaller than a pitch of a bit line, a space is created in the SA bank, and the SA driver is arranged therein to make an area of the entire bank very compact. If the sense amplifier circuits of all the columns and all the SA drivers are connected to one common source line in the SA bank, such a layout can be easily realized.

Further reasons that the sense amplifier circuits of all the columns in the SA bank must be connected to one common source line are as follows.

If there is a leakage source (e.g., junction leakage due to a crystal defect) somewhere in the common source line, a potential of the common source line is somehow set equal to a well potential (e.g., P well potential (VSS or the like) in the case of NCS). This potential change of the common source line is similar to that of the common source line during the sense amplifier circuit operation. Thus, if the leakage causes a fall of the potential of the common source line to a certain level, before a sufficient signal is output from the cell to the bit line BL after the precharging of the BL is released, a sense operation is started (slowly), creating a possibility of an erroneous operation.

Thus, to prevent such an erroneous operation, the common source line must be precharged while the sense amplifier circuit is inactive. In other words, by precharging the common source line, even if leakage occurs in the commons source line, the potential of the common source line can be maintained at a level for preventing unintended operation start of the sense amplifier circuit. In reality, in the precharge period of a ½ VBLH precharge system, by short-circuiting the NCS of a VSS potential and the PCS of a VBLH potential, and connecting them to a VBL power source (bit line precharge power source, equal to ½ VBLH here), they are quickly precharged to VBL potentials. Accordingly, the precharge potential of the common source line is equal to the precharge potential VBL (not necessarily ½ VBLH) of the bit line.

Incidentally, the precharge transistor (FIG. 62) of the common source line is originally designed to compensate for a leakage current which is not large and to maintain the common source line at the VBL potential. Thus, its size does not need to be large. Arrangement of such a small precharge transistor for each column, or for some columns leads to low layout efficiency. That is, because of a design rule and to guarantee device characteristics, even if very small transistors are arranged for some columns, sizes thereof may be larger than necessary.

Even if transistors of necessary sizes can be arranged for some columns, a layout space in which nothing is arranged may be formed between the precharge transistors. Accordingly, by connecting the sense amplifier circuits of all the columns in the SA bank to the common source line, and arranging the precharge transistor in the sense amplifier circuit or the WL stitch area to be shared by many columns, an area increase caused by the arrangement of precharge transistors can be virtually eliminated.

As the common source line is connected to the sense amplifier circuits of all the columns, the precharge transistor may be arranged in any place on the common source line. For example, even in the case of arrangement in the WL stitch area, it is not necessary to arrange precharge transistors in all the WL stitch areas. In this case, other devices can be arranged in the WL stitch areas in which precharge transistors are not arranged.

As described above, as long as the common source line is connected to the sense amplifier circuits of all the columns, the layout freedom of the precharge transistors can be increased. As a result, the layout of the entire SA bank can be optimized, making it possible to minimize the layout area of the entire SA bank.

As described above, the power supply voltage of the memory cell portion will have to be set higher than that of the peripheral circuit portion (logic portion), making difficult the writing operation of the semiconductor memory in the future. Under such circumstances, connecting of the sense amplifier circuits of all the columns and all the SA drivers in the SA bank to the common source line to achieve a high writing speed makes the writing operation more difficult. Then, in reality, there will be no practical solutions.

Furthermore, when the miniaturization is accompanied by a fall of potential amplitude of the bit line connected to the memory cell, the threshold voltage of the NMOS sense amplifier transistor or the PMOS sense amplifier transistor must be lowered to realize a stable sense operation. When the threshold voltage falls to a certain level or lower, a reduction of a signal on the bit line BL during signal development due to an influence of a leakage current via the NMOS sense amplifier transistor or the PMOS sense amplifier transistor cannot be ignored any more, and this influence is larger as the number of columns connected to the common source line is larger.

BRIEF SUMMARY OF THE INVENTION

According to a first aspect of the present invention, there is provided a semiconductor memory device comprising: a memory cell array which has a plurality of memory cells arranged in a matrix form; a plurality of first bit line pairs which transfer data among the memory cells; a plurality of second bit line pairs disposed respectively corresponding to the plurality of first bit line pairs; a plurality of variable resistance elements disposed respectively to connect the plurality of first bit line pairs to the plurality of second bit line pairs; a plurality of data line pairs disposed respectively corresponding to the plurality of second bit line pairs; a plurality of input/output gates which transfer data respectively between the plurality of second bit line pairs and the plurality of data line pairs; a plurality of sense amplifier circuits which respectively amplify data transferred to the plurality of second bit line pairs; and a bit line isolation control circuit which controls resistance values of the plurality of variable resistance elements, wherein the plurality of variable resistance elements comprise a plurality of first groups respectively including at least one variable resistance element, and the bit line isolation control circuit controls the resistance values of the variable resistance elements in units of the first groups.

According to a second aspect of the present invention, there is provided a semiconductor memory device comprising: a memory cell array which has a plurality of memory cells arranged in a matrix form; a plurality of first bit line pairs which transfer data among the memory cells; a plurality of second bit line pairs disposed respectively corresponding to the plurality of first bit line pairs; a plurality of variable resistance elements disposed respectively to connect the plurality of first bit line pairs to the plurality of second bit line pairs; a plurality of data line pairs disposed respectively corresponding to the plurality of second bit line pairs; a plurality of input/output gates which transfer data respectively between the plurality of second bit line pairs and the plurality of data line pairs; a plurality of sense amplifier circuits which respectively amplify data transferred to the plurality of second bit line pairs; and a bit line isolation control circuit which controls resistance values of the plurality of variable resistance elements, wherein the bit line isolation control circuit sets the resistance values of the variable resistance elements to first resistance value, and sets the resistance values of the variable resistance elements to second resistance value lower than the first resistance value by using as a trigger a first trigger signal which determines operation timing of the input/output gates or a second trigger signal generated based on the first trigger signal.

According to a third aspect of the present invention, there is provided a semiconductor memory device comprising: a memory cell array which has a plurality of memory cells arranged in a matrix form; a plurality of first bit line pairs which transfer data among the memory cells; a plurality of second bit line pairs disposed respectively corresponding to the plurality of first bit line pairs; a plurality of variable resistance elements disposed respectively to connect the plurality of first bit line pairs to the plurality of second bit line pairs; a plurality of data line pairs disposed respectively corresponding to the plurality of second bit line pairs; a plurality of input/output gates which transfer data respectively between the plurality of second bit line pairs and the plurality of data line pairs; a plurality of sense amplifier circuits which respectively amplify data transferred to the plurality of second bit line pairs; and a bit line isolation control circuit which controls resistance values of the plurality of variable resistance elements, wherein operation timing of the input/output gates synchronizes with a clock, and the bit line isolation control circuit sets the resistance values of the variable resistance elements to first resistance value, and sets the resistance values of the variable resistance elements to second resistance value lower than the first resistance value by using as a trigger a first clock with which the operation timing of the input/output gates synchronizes or a subsequent second clock.

According to a fourth aspect of the present invention, there is provided a semiconductor memory device comprising: a memory cell array which has a plurality of memory cells arranged in a matrix form; a plurality of first bit line pairs which transfer data among the memory cells; a plurality of second bit line pairs disposed respectively corresponding to the plurality of first bit line pairs; a plurality of variable resistance elements disposed respectively to connect the plurality of first bit line pairs to the plurality of second bit line pairs; a plurality of data line pairs disposed respectively corresponding to the plurality of second bit line pairs; a plurality of input/output gates which transfer data respectively between the plurality of second bit line pairs and the plurality of data line pairs; a plurality of sense amplifier circuits which respectively amplify data transferred to the plurality of second bit line pairs; a bit line isolation control circuit which controls resistance values of the plurality of variable resistance elements; and a precharge circuit which supplies a first voltage other than an intermediate voltage of a high-level bit line voltage and a low-level bit line voltage supplied to the sense amplifier circuits to the plurality of first bit line pairs, wherein the bit line isolation control circuit electrically cuts off the first bit line pairs and the second bit line pairs from each other by setting the resistance values of the variable resistance elements from second resistance value to higher first resistance value, and the precharge circuit supplies the first voltage to the first bit line pairs while the first bit line pairs and the second bit line pairs are electrically cut off from each other.

According to a fifth aspect of the present invention, there is provided a semiconductor memory device comprising: a memory cell array which has a plurality of memory cells arranged in a matrix form; a plurality of bit line pairs which transfer data among the memory cells; a sense amplifier bank which includes a plurality of sense amplifiers, the plurality of sense amplifiers including a plurality of sense amplifier circuits, and the plurality of sense amplifier circuits being connected respectively to the plurality of bit line pairs to amplify data transferred to the bit line pairs; a plurality of common source lines, each connected to a predetermined number of sense amplifiers among the plurality of sense amplifiers in the sense amplifier bank, to supply first voltage to the sense amplifiers; and a plurality of column selection lines which select the sense amplifiers, wherein the predetermined number of sense amplifiers are connected respectively to different column selection lines.

According to a sixth aspect of the present invention, there is provided a semiconductor memory device comprising: a memory cell array which has a plurality of memory cells arranged in a matrix form; a plurality of bit line pairs which transfer data among the memory cells; a sense amplifier bank which includes a plurality of sense amplifiers, the plurality of sense amplifiers including a plurality of sense amplifier circuits, and the plurality of sense amplifier circuits being connected respectively to the plurality of bit line pairs to amplify data transferred to the bit line pairs; and a plurality of common source lines which supply a first voltage to the sense amplifiers, each of the common source lines being connected to only two sense amplifiers.

According to a seventh aspect of the present invention, there is provided a semiconductor memory device comprising: a memory cell array which has a plurality of memory cells arranged in a matrix form; a plurality of bit line pairs which transfer data among the memory cells; a sense amplifier bank which includes a plurality of sense amplifiers, the plurality of sense amplifiers including a plurality of sense amplifier circuits, and the plurality of sense amplifier circuits being connected respectively to the plurality of bit line pairs to amplify data transferred to the bit line pairs; a plurality of word lines connected to the memory cells; a plurality of wirings disposed respectively corresponding to the plurality of word lines and above the plurality of word lines; and a plurality of stitch portions which connect the plurality of word lines to the plurality of wirings every predetermined intervals, wherein two active areas in which the sense amplifier circuit is formed respectively in both sides of a stitch area corresponding to each of the stitch portions in the sense amplifier bank are connected to each other, and a dummy transistor is disposed on the connected active areas.

BRIEF DESCRIPTION OF THE SEVERAL VIEWS OF THE DRAWING

FIG. 19 is a timing chart of the semiconductor memory device shown in FIG. 18;

FIG. 20 is a timing chart of a semiconductor memory device which uses a precharge circuit 2 as an equalizer circuit;

FIG. 22 is a timing chart of the semiconductor memory device shown in FIG. 21;

FIG. 23 is a circuit diagram showing a main portion of a semiconductor memory device configured so that signals EQL and signals BLI can correspond to each other by 1 to 2;

FIG. 27 is a timing chart of the semiconductor memory device shown in FIG. 26;

FIG. 50 is a layout diagram showing the configuration of the SA bank shown in FIG. 49;

FIG. 57 is a circuit diagram showing an example of a DRAM;

DETAILED DESCRIPTION OF THE INVENTION

Figure 1:
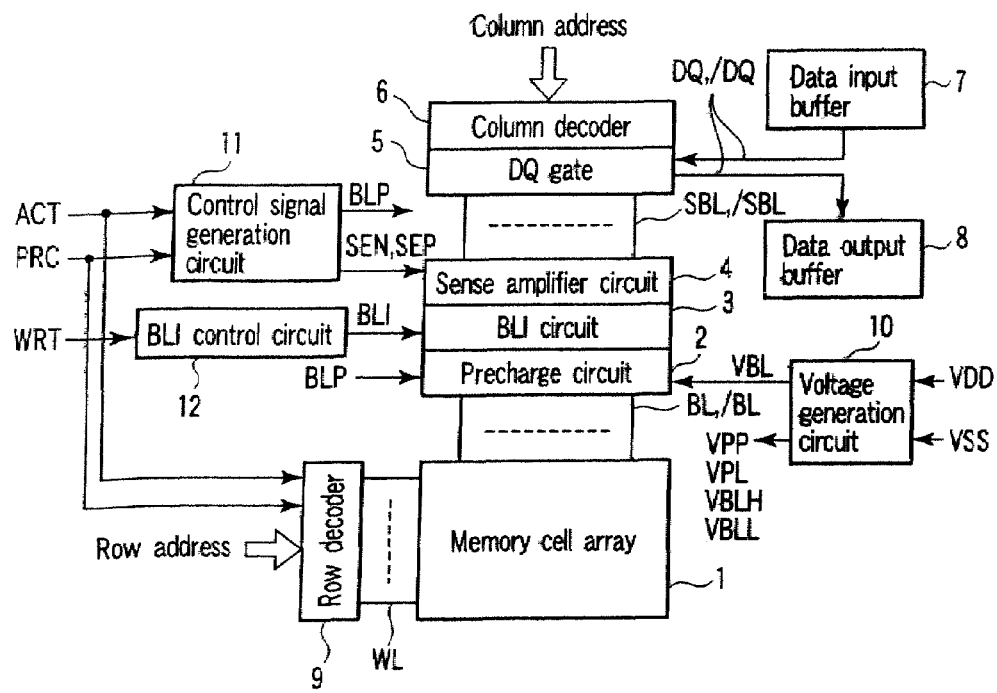
FIG. 1 is a block diagram showing a main portion of a semiconductor memory device according to a first embodiment of the present invention.

Next, embodiments of the present invention will be described with reference to the accompanying drawings. In the description below, components similar in function and configuration will be denoted by similar reference numerals, and repeated explanation will be made only when necessary.

First Embodiment

FIG. 1 is a block diagram showing a main portion of a semiconductor memory device according to a first embodiment of the invention. This semiconductor memory device comprises a memory core unit constituted of a memory cell array, a row decoder, a sense amplifier circuit, a precharge circuit and a bit line isolation (BLI) circuit, and another peripheral logic portion. Referring to FIG. 1, the memory cell array 1 is disposed by arranging memory cells MC in a matrix form. The precharge circuit 2 is connected to the memory cell array 1 via a bit line pair BL, /BL. The precharge circuit 2 precharges a bit line to a precharge voltage VBL.

A sense amplifier bit line pair SBL, /SBL is disposed corresponding to each bit line pair BL, /BL. The bit line pair BL, /BL and the bit line pair SBL, /SBL are interconnected by the bit line isolation (BLI) circuit 3. The sense amplifier circuit 4 is connected to the bit line pair SBL, /SBL. The sense amplifier circuit 4 amplifies data of the bit line pair SBL, /SBL, and holds the amplified data.

A column address output from an address buffer (not shown) for receiving an address input from the outside is input to a column decoder 6. The column decoder 6 activates a column selection signal CSL for selecting a bit line based on the column address. This column selection signal CSL is input to a DQ gate 5. Upon the reception of the column selection signal CSL, the DQ gate 5 interconnects a data line pair DQ, /DQ and the bit line pair SBL, /SBL.

Write data is input to a data input buffer 7. The write data output from the data input buffer 7 is transferred to the bit line pair SBL, /SBL via the DQ gate 5. The data read to the bit line pair SBL, /SBL is output from a data output buffer 8 to the outside via the DQ gate 5.

The row decoder 9 is connected to the memory cell array 1 via the word line WL. A row address output from the address buffer is input to the row decoder 9. Additionally, a signal ACT for determining activation timing and a signal PRC for determining a deactivation timing of the word line WL output from a command decoder (not shown) are input to the row decoder 9.

A word line driving voltage VPP for driving the word line is input to the row decoder 9. The row decoder 9 activates the word line WL based on the row address and the signal ACT, and deactivates the word line WL based on the signal PRC.

A power supply voltage VDD of the peripheral logic portion and a ground voltage VSS are input from the outside to a power generation circuit 10. The voltage generation circuit generates the word line driving voltage VPP boosting the VDD, the precharge voltage VBL, a reference voltage VPL supplied to the memory cell MC, a high-level bit line voltage VBLH, and a low-level bit line voltage VBLL. The voltages may be supplied from the outside. The voltage VBLL may be a voltage VSS.

A control signal generation circuit 11 generates various control signals. A signal ACT for determining activation timing and a signal PRC for determining deactivation timing of the word line WL are input to the control signal generation circuit 11. The control signal generation circuit 11 generates sense amplifier activation signals SEN and SEP for activating the sense amplifier circuit 4, and a bit line precharge signal BLP for activating the precharge circuit 2, based on the signals ACT and PRC.

A BLI control circuit 12 generates a bit line isolation signal BLI for controlling a resistance value of a BLI circuit 3, and supplies this signal BLI to the BLI circuit 3.

Figure 2:
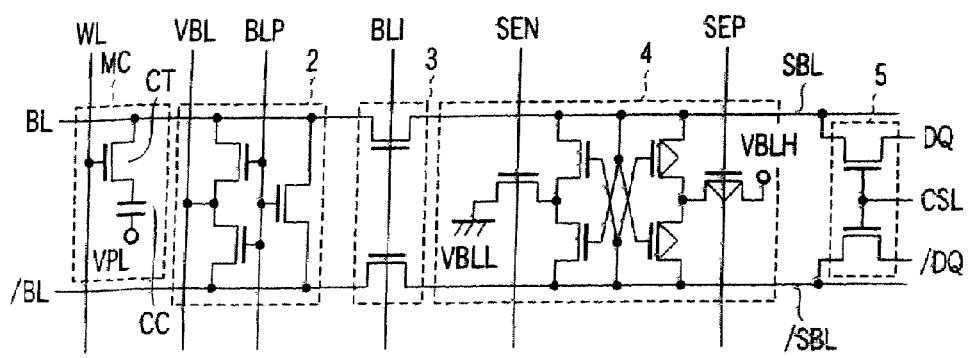
FIG. 2 is a circuit diagram showing the main portion of the semiconductor memory device shown in FIG. 1.

FIG. 2 is a circuit diagram showing a main portion of the semiconductor memory device shown in FIG. 1. The word line WL and the bit line pair BL, /BL are arranged to intersect each other in the memory cell array 1, and the memory cells MC are disposed at intersections thereof. The memory cell MC is configured by serially connecting a cell transistor CT and a capacitor CC. The reference voltage VPL is supplied to one terminal of the memory cell MC, and the other terminal is connected to the bit line BL.

The precharge circuit 2 comprises three N type MOS transistors. The bit line precharge signal BLP is input to a gate of each N type MOS transistor of the precharge circuit 2. Upon activation of the signal BLP, the precharge circuit 2 supplies the precharge voltage VBL to the bit line pair BL, /BL.

The sense amplifier bit line pair SBL, /SBL is disposed corresponding to the bit line pair BL, /BL. The sense amplifier circuit 4 includes an NMOS sense amplifier pair transistor (NSA pair transistor) which cross-couples two N-channel MOS transistors (referred to as NMOS transistors, hereinafter), and a PMOS sense amplifier pair transistor (PSA pair transistor) which cross-couples two P-channel MOS transistors (PMOS transistors, hereinafter). The low-level bit line voltage VBLL is supplied to the NSA pair transistor via a further NMOS transistor.

The high-level bit line voltage VBLH is supplied to the PSA pair transistor via yet another PMOS transistor. The signals SEN and SEP are input to the sense amplifier circuit 4. By activating the signal SEN, the voltage VBLL is supplied to the NSA pair transistor. By activating the signal SEP, the voltage VBLH is supplied to the PSA pair transistor.

The DQ gate 5 comprises two NMOS transistors. One NMOS transistor interconnects the bit line SBL and the data line DQ, and the other NMOS transistor interconnects the bit line /SBL and the data line /DQ. The signal CSL is input to gates of the two NMOS transistors constituting the DQ gate 5. This signal CSL is activated to transfer data between the bit line pair SBL, /SBL and the data line pair DQ, /DQ.

The BLI circuit 3 comprises two NMOS transistors. The BLI circuit 3 is provided to connect the bit line BL to the SBL and the bit line /BL to the /SBL. The signal BLI is input to gates of the two NMOS transistors constituting the BLI circuit 3.

Figure 3:
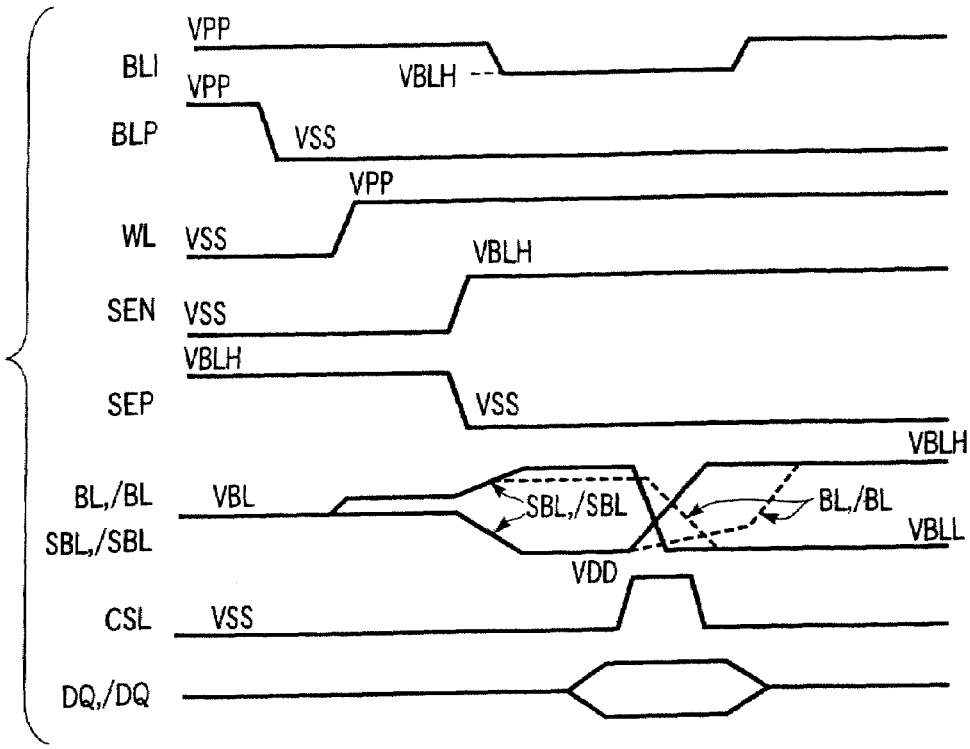
FIG. 3 is a timing chart showing the semiconductor memory device shown in FIG. 2.

Now, a data writing operation of the semiconductor memory device thus configured will be described. FIG. 3 is a timing chart of the semiconductor memory device shown in FIG. 2. Here, the description will be made by way of example in which data reverse to data held in the sense amplifier circuit 4 is written to the memory cell array 1, i.e., data of the bit line must be reversed (load of the writing operation is largest).

At the standby time, the BLI control circuit 12 generates a bit line isolation signal BLI having a VPP potential, and supplies it to the BLI circuit 3. Accordingly, the NMOS transistors constituting the BLI circuit 3 are set in low-resistance states, the bit line BL and the sense amplifier bit line SBL are made conductive to each other, and potential changes of the bit lines SBL and BL follow each other. The same holds true for the bit lines /BL and /SBL.

The signal BLP supplied to the precharge circuit 2 is changed from a "H" level (e.g., VPP) to a "L" level (VSS). Accordingly, precharging of the bit line pair BL, /BL is released. By changing the word line WL from a "L" level (VSS) to a "H" level (VPP), the data stored in the memory cell array 1 is read to the bit line pair BL, /BL.

Next, the signal SEN is changed from a "L" level (VSS) to a "H" level (e.g., VBLH), and the signal SEP is changed from a "H" level (e.g., VBLH) to a "L" level (VSS), whereby the data read to the bit line pair BL, /BL is amplified, the bit line of the high-level side changes toward a voltage VBLH, and the bit line of the low-level side changes toward a voltage VBLL.

Next, the BLI control circuit 12 lowers a potential of the signal BLI to an intermediate potential (e.g., VBLH, VBL, VPL, VDD or the like) lower than the VPP in a period immediately after activation of the sense amplifier circuit to activation of the signal CSL. Accordingly, the BLI circuit 3 is set in a higher resistance state compared with a conductive state, and the bit line pair BL, /BL and the bit line pair SBL, /SBL are subjected to high-resistance isolation.

Upon the change of the signal CSL from a "L" level (VSS) to a "H" level (e.g., VDD), the data of the bit line pair SBL, /SBL is reversed by the data transferred from the data line pair DQ, /DQ, and the reversed data is held in the sense amplifier circuit 4. Then, the potential change of the bit line BL (or /BL) for low-level writing follows the potential change of the SBL (or /SBL) to a certain extent. However, the potential change of the bit line /BL (or BL) for high-level writing does not necessarily follow the potential change of the /SBL (or SBL).

This is because the potential of the bit line /BL (or BL) for high-level writing rises only to a level obtained by subtracting (a threshold voltage of the transistor constituting the BLI circuit 3) from (the potential of the signal BLI).

The BLI control circuit 12 returns the potential of the signal BLI to the VPP immediately after the data of the bit line pair SBL, /SBL is reversed. Accordingly, the bit line pair BL, /BL is connected to the bit line pair SBL, /SBL by low resistance, and the potential of the bit line pair BL, /BL rapidly changes toward the potential of the bit line pair SBL, /SBL.

In the aforementioned data writing operation, when the signal CSL is activated, the bit line pair BL, /BL and the bit line pair SBL, /SBL are isolated from each other by high resistance because the signal BLI is at the intermediate potential.

Accordingly, compared with the conventional case in which the BLI circuit 3 is not provided between the bit line pair BL, /BL and the sense amplifier bit line pair SBL, /SBL, but the bit line pair BL, /BL directly becomes a bit line pair SBL, /SBL, or the case in which the bit line pair BL, /BL and the sense amplifier bit line pair SBL, /SBL are connected to each other by low resistance, an apparent capacity of the bit line pair SBL, /SBL is smaller. Thus, the bit line pair SBL, /SBL allows easy reversal even within a short time.

Therefore, for example, even when VDD as an operation voltage of the DQ gate 5 is lower than VBLH as an operation voltage of the sense amplifier circuit 4, highly reliable and high-speed writing can be performed without setting a large transistor size of the DQ gate 5. Additionally, it is not necessary to make sizes of the sense amplifier pair transistor (SA pair transistor) and the sense amplifier driver (SA driver) constituting the sense amplifier circuit 4 small. Thus, it is possible to suppress a fall of voltage level of the write data to the memory cell array 1.

Furthermore, an operation frequency will become higher as the miniaturization progresses and a pulse width of the signal CSL (period in which CSL is activated) will become shorter in the future. Even in such a case, a stable writing operation will be guaranteed.

Figure 4:
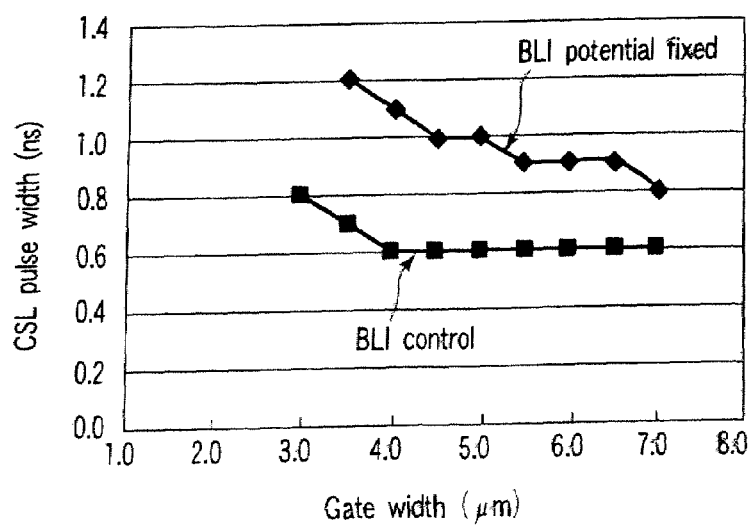
FIG. 4 is a graph showing a simulation result of comparison of writing speeds between the case of always fixing a potential of a signal BLI at VPP and the case of clock control of the embodiment.

FIG. 4 is a graph showing a simulation result of comparison of writing speeds between the case of always fixing a potential of the signal BLI at VPP and the case of bit line isolation (BLI) control of the embodiment. In FIG. 4, an abscissa represents a transistor size of the DQ gate 5, and an ordinate represents a minimum value of a pulse width of the signal CSL necessary for writing data to the memory cell array 1.

For example, it can be understood that if a BLI potential is fixed when a gate width is 4 μm, writing cannot be performed unless a pulse width of the signal CSL is 1.1 ns or wider, while writing is enabled up to 0.6 ns when BLI control is executed. Thus, by performing the BLI control, a high-speed writing operation is possible even without setting a large transistor size of the DQ gate 5.

As described above, according to the embodiment, the bit line pair BL, /BL to which the memory cell array 1 is connected and the bit line pair SBL, /SBL to which the sense amplifier circuit 4 is connected are divided, and the bit line pair BL, /BL and the bit line pair SBL, /SBL are connected to each other via the BLI circuit 3. Then, by setting the BLI circuit 3 to high resistance when data is written to the memory cell array 1, the bit line pair BL, /BL and the bit line pair SBL, /SBL are isolated from each other by high resistance.

Immediately after the data is transferred from the data line pair DQ, /DQ to the bit line pair SBL, /SBL and the data is held in the sense amplifier circuit 4, the BLI circuit 3 is set to low resistance, and the data of the bit line pair SBL, /SBL is transferred to the bit line pair BL, /BL.

Thus, according to the embodiment, even when the operation voltage, e.g., VDD, of the DQ gate 5 is set to a low voltage, it is possible to surely transfer the data of the data line pair DQ, /DQ to the bit line pair SBL, /SBL. Accordingly, a low voltage of the peripheral circuit can be flexibly dealt with.

High-speed writing is enabled even without setting a large transistor size of the DQ gate 5, i.e., without setting a large chip size. Moreover, it is not necessary to make the sizes of the SA pair transistor and the SA driver constituting the sense amplifier circuit 4 small. Thus, it is possible to suppress a fall of the voltage level of the write data to the memory cell array 1.

Even during the data reading, if the BLI circuit 3 is set in a high-resistance state immediately after the sense amplifier circuit is activated, the transition speed of the bit line pair SBL, /SBL after the activation of the sense amplifier circuit becomes faster, making it possible to set faster activation timing of the signal CSL. Further, the small capacity of the bit line pair SBL, /SBL enables suppression of the source noise, guaranteeing a stable sense operation.

When the BLI circuit 3 is controlled only during the data writing, power consumption necessary for controlling the BLI circuit 3 during the data reading can be suppressed, and thus power consumption of the chip can be suppressed. During the reading/refreshing operation, when the BLI circuit 3 is set in a high-resistance state, the bit line potential of the high-level side does not rise to VBLH in this period. Thus, by preventing the high-resistance state of the BLI circuit 4 during the reading/refreshing operation, it is possible to secure the longest restoring time to the memory cell.

According to the embodiment, the NMOS transistor is used as a variable resistance element. However, the invention can be implemented by using a PMOS transistor. In this case, to transfer the VBLL as a low-level voltage of the bit line from the bit line SBL to the BL or from the /SBL to the /BL, a voltage of the signal BLI in a low-resistance state must be set lower than a potential obtained by subtracting (an absolute threshold voltage of the PMOS transistor) from (the low-level voltage VBLL of the bit line). Thus, for example, as long as the low-level potential of the word line WL is lower than the VBLL and equal to/lower than the above value, this low-level potential of the word line WL may be used.

Second Embodiment

According to a second embodiment, a BLI circuit 3 comprises a transfer gate constituted of NMOS and PMOS transistors.

Figure 5:
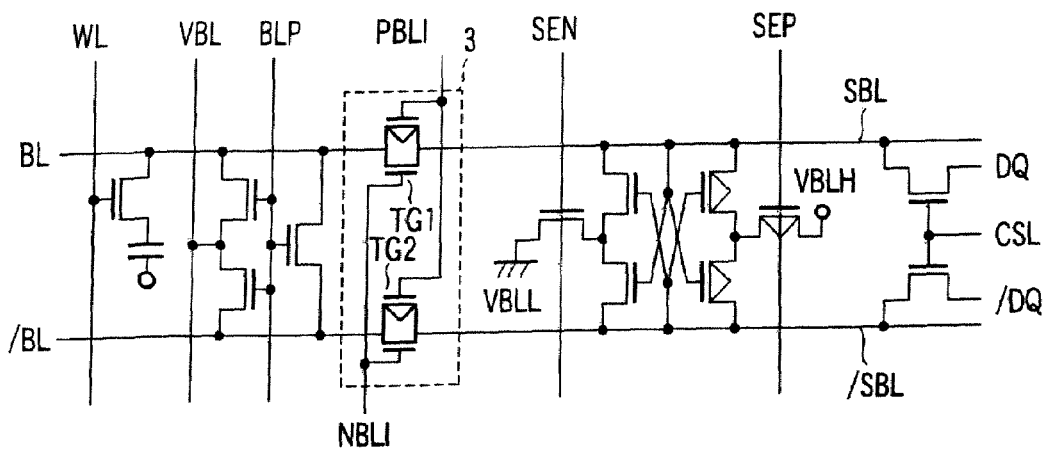
FIG. 5 is a circuit diagram of a semiconductor memory device according to a second embodiment of the invention.

FIG. 5 is a circuit diagram of a semiconductor memory device according to the second embodiment of the invention. Referring to FIG. 5, the BLI circuit 3 comprises two transfer gates TG1, TG2. The transfer gates TG1, TG2 are configured by connecting NMOS and PMOS transistors in parallel.

A BLI control circuit 12 generates bit line isolation signals NBLI and PBLI for controlling resistance values of the transfer gates TG1, TG2. The signal NBLI is input to gates of the NMOS transistors of the transfer gates TG1, TG2. The signal PBLI is input to gates of the PMOS transistors of the transfer gates TG1, TG2. Other components are similar to those of FIG. 1, and thus a block diagram thereof will be omitted.

Figure 6:
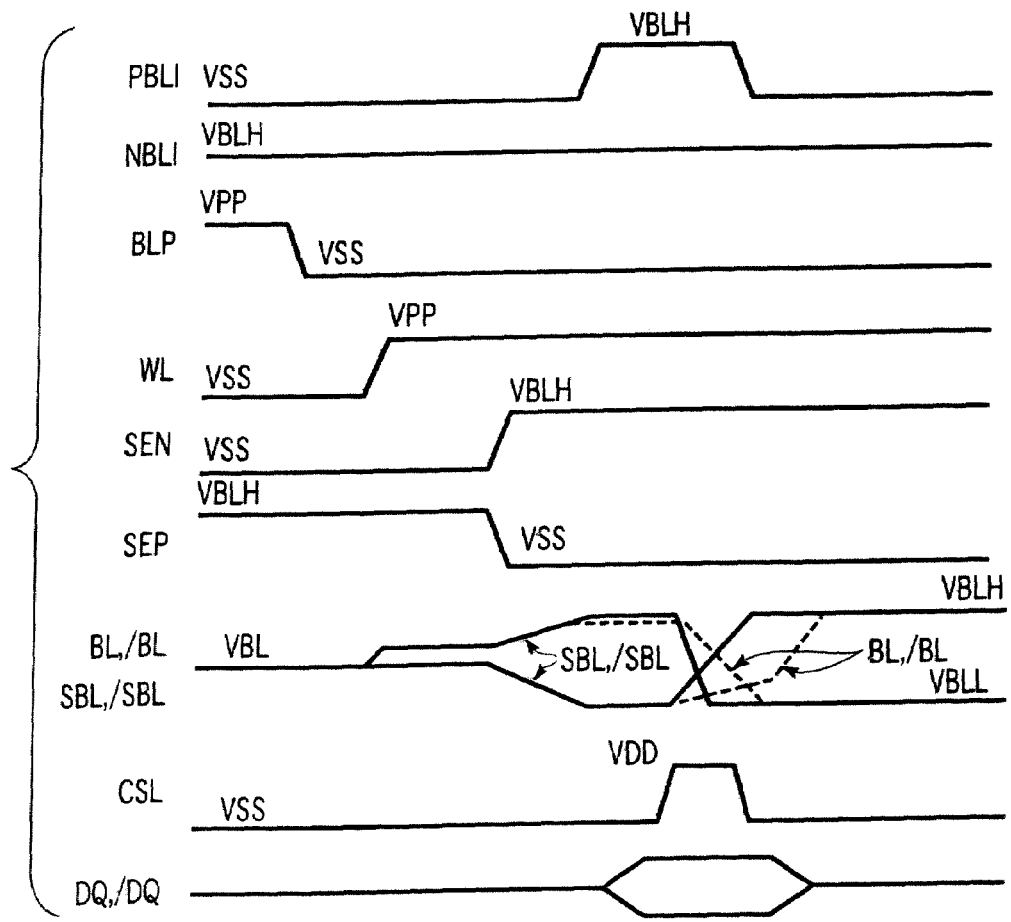
FIG. 6 is a timing chart of the semiconductor memory device shown in FIG. 5.

FIG. 6 is a timing chart of the semiconductor memory device shown in FIG. 5. The BLI control circuit 12 normally generates a bit line isolation signal NBLI having a potential of a "H" level (e.g., VBLH), and supplies it to the NMOS transistors of the transfer gates TG1, TG2. The BLI control circuit 12 generates a bit line isolation signal PBLI having a potential of a "L" level (VSS), and supplies it to the PMOS transistors TG1, TG2. Accordingly, the transfer gates TG1, TG2 constituting the BLI circuit 3 are set in low-resistance states.

The BLI control circuit 12 raises the potential of the signal PBLI to a "H" level (e.g., VBLH) in a period immediately after activation of the sense amplifier circuits to writing of data in the bit line pair SBL, /SBL. Accordingly, the BLI circuit 3 is set in a higher resistance state compared with a conductive state, and the bit line pair BL, /BL and the bit line pair SBL, /SBL are subjected to high-resistance isolation.

Upon the change of a signal CSL from a "L" level (VSS) to a "H" level (e.g., VDD), the data of the bit line pair SBL, /SBL is reversed by data transferred from the data line pair DQ, /DQ, and the reversed data is held in the sense amplifier circuit 4. Then, the potential change of the bit line BL (or /BL) for low-level writing follows the potential change of the SBL (or /SBL) to a certain extent. However, the potential change of the bit line /BL (or BL) for high-level writing does not necessarily follow the potential change of the /SBL (or SBL).

This is because the potential of the bit line /BL (or BL) for high-level writing rises only to a level obtained by subtracting (a threshold voltage of the NMOS transistor constituting the BLI circuit 3) from (the potential of the signal NBLI).

The BLI control circuit 12 returns the potential of the signal PBLI to the VSS immediately after the data of the bit line pair SBL, /SBL is reversed. Accordingly, the bit line pair BL, /BL is connected to the bit line pair SBL, /SBL by low resistance, and the potential of the bit line pair BL, /BL rapidly changes toward the potential of the bit line pair SBL, /SBL.

In the aforementioned data writing operation, when the signal CSL is activated, the bit line pair BL, /BL and the bit line pair SBL, /SBL are isolated from each other by high resistance. Accordingly, compared with the conventional case in which no BLI circuit is provided between the bit line pair BL, /BL and the sense amplifier bit line pair SBL, /SBL, but the bit line pair BL, /BL directly becomes a bit line pair SBL, /SBL, or the case in which the bit line pair BL, /BL and the sense amplifier bit line pair SBL, /SBL are connected to each other by low resistance, an apparent capacity of the bit line pair SBL, /SBL is smaller. Thus, the bit line pair SBL, /SBL allows easy reversal even within a short time.

Therefore, as in the case of the first embodiment, for example, even when VDD as an operation voltage of the DQ gate 5 is lower than VBLH as an operation voltage of the sense amplifier circuit 4, highly reliable and high-speed writing can be performed without setting a large transistor size of the DQ gate 5.

Additionally, it is not necessary to make sizes of the SA pair transistor and the SA driver constituting the sense amplifier circuit 4 small. Thus, it is possible to suppress a fall of voltage level of the write data to the memory cell array 1.

When the NMOS transistor is used as a variable resistance element as in the case of the first embodiment, to transfer VBLH as a high-level voltage of the bit line from the bit line SBL to the BL or from the /SBL to the /BL, for example, a voltage VPP higher than a potential obtained by adding (a threshold voltage of the NMOS transistor) to (a high-level voltage VBLH of the bit line) must be used for a gate voltage of the NMOS transistor.

According to the embodiment, however, by changing the gate voltage of the PMOS transistor constituting the transfer gate to a potential (e.g., VSS) lower than a potential obtained by subtracting (an absolute threshold voltage of the PMOS transistor) from (the high-level voltage VBLH of the bit line), the voltage VBLH can be transferred to the bit line BL or /BL.

By setting a gate voltage of the NMOS transistor equal to/higher than its threshold voltage, a VBLL (e.g., equal to VSS) as a low-level voltage of the bit line can be transferred from the bit line SBL to the bit line BL or from the bit line /SBL to the bit line /BL. Thus, VPP power consumption can be reduced since it is not necessary to use the VPP for controlling the transfer gate. In other words, in the case of internally generating VPP by a pump circuit, a circuit area of a VPP generation circuit can be reduced.

When a transistor type varies depending on a used voltage (i.e., gate oxide film thickness varies), a space wider than that between transistors of the same type is necessary between transistors of different types. If the BLI circuit 3 comprises a transfer gate constituted of NMOS and PMOS transistors, a transistor of the same type as that of the transistor constituting the sense amplifier circuit 4 can be used for the BLI circuit 3.

On the other hand, if the BLI circuit 3 comprises an NMOS transistor only, since a high voltage (e.g., VPP) is used for a gate voltage, a transistor of a type (gate oxide film is thicker) different from that of the sense amplifier circuit 4 must be used. Compared with the former, a wide space for separately forming oxide films different in thickness is necessary between the BLI circuit 3 and the sense amplifier circuit 4.

Thus, when a space necessary between transistors of different types is large because of a design rule, a layout size may be smaller in the case of constituting the BLI circuit of two types of NMOS and PMOS transistors than in the case of constituting the BLI circuit of a transistor of one type of NMOS transistors different in oxide film thickness.

Third Embodiment

Figure 7:
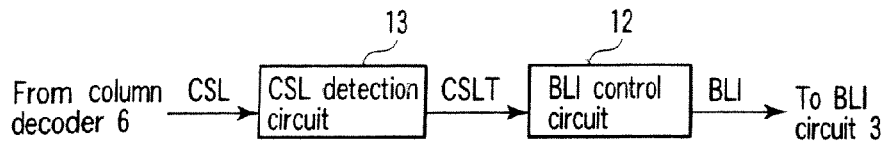
FIG. 7 is a block diagram showing a main portion of a semiconductor memory device according to a third embodiment of the invention.

FIG. 7 is a block diagram showing a main portion of a semiconductor device according to a third embodiment of the invention.

The semiconductor memory device comprises a CSL detection circuit 13. A column selection signal CSL generated by a column decoder 6 is input to the CSL detection circuit 13. The CSL detection circuit 13 detects timing of deactivating a signal CSL. In other words, it detects falling of the signal CSL. The CSL detection circuit 13 inputs a trigger signal CSLT to a BLI control circuit 12.

Upon reception of the signal CSLT from the CSL detection circuit 13, the BLI control circuit 12 returns a potential of the signal BLI from VBLH to VPP.

Figure 8:
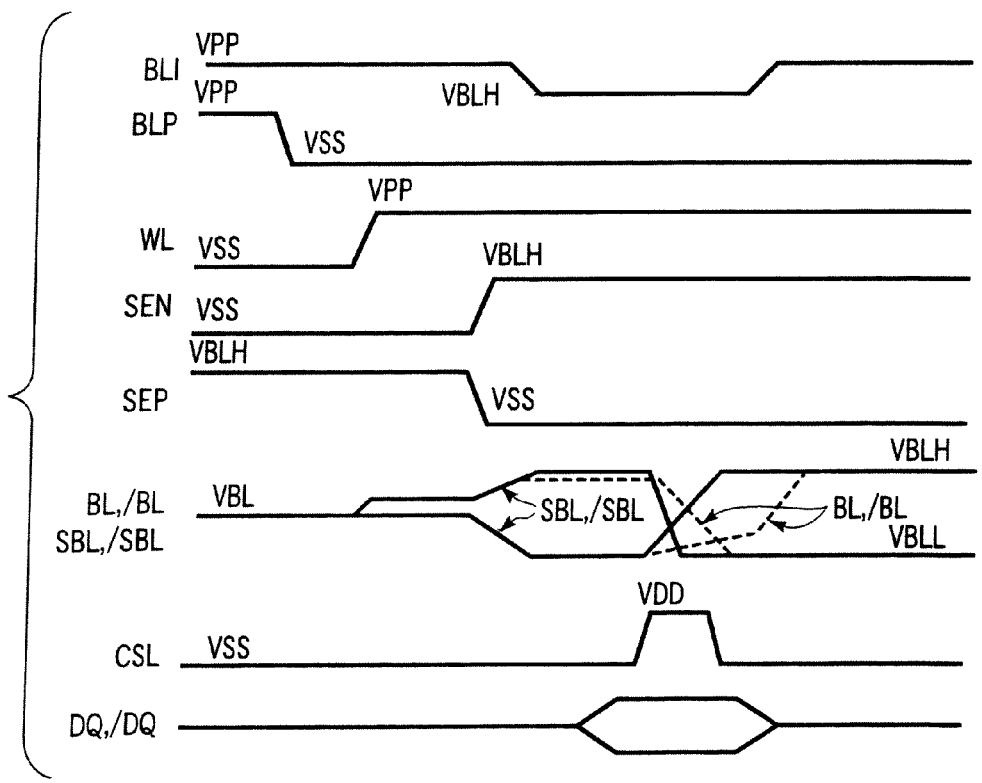
FIG. 8 is a timing chart of the semiconductor memory device shown in FIG. 7.

FIG. 8 is a timing chart of the semiconductor memory device shown in FIG. 7.

When the signal CSL is changed from a "L" level (VSS) to a "H" level (e.g., VDD), data of the bit line pair SBL, /SBL is reversed by data transferred from the data line pair DQ, /DQ, and the reversed data is held in the sense amplifier circuit 4. Then, a potential of the bit line pair BL, /BL slowly follows a potential of the bit line pair SBL, /SBL. Next, when the signal CSL is changed from VDD to VSS, the CSL detection circuit 13 detects this operation, and generates a signal CSLT. Then, the signal CSLT is input to the BLI control circuit 12.

Upon the reception of the signal CSLT from the CSL detection circuit 13, the BLI control circuit 12 returns the potential of the signal BLI from VBLH to VPP. Accordingly, the bit line pair BL, /BL is connected to the bit line SBL, /SBL by low resistance, and the potential of the bit line pair BL, /BL rapidly changes toward the potential of the bit line pair SBL, /SBL.

When the BLI circuit 3 is changed from a high-resistance state to a low-resistance state while the signal CSL is activated, a time of reversing data of the bit line pair SBL, /SBL is delayed. When the BLI circuit 3 is changed from the high-resistance state to the low-resistance state after a passage of time from deactivation of the signal CSL, in the high-resistance state, i.e., while the potential of the signal BLI is at VBLH, a bit line of a high-level side does not change to VBLH and thus a writing time in the memory array 1 is cut.

However, according to the embodiment, control is performed to change the BLI circuit 3 from the high-resistance state to the low-resistance state immediately after the signal CSL is deactivated. Thus, the data of the bit line pair SBL, /SBL can be easily reversed, and the longest data writing time from the bit line pair BL, /BL to the memory cell array 1 can be secured.

According to the embodiment, the CSL detection circuit 13 detects the deactivation timing of the signal CSL. However, the CSL detection circuit 13 may detect activation timing of the signal CSL to generate a signal CSLT.

For example, in the case of large internal delays in the CSL detection circuit 13 and the BLI control circuit 12, when the CSL detection circuit 13 generates a signal CSLT upon deactivation of the signal CSL, a time from the deactivation of the signal CSL to setting of the BLI circuit 3 to a low-resistance state is made longer, accordingly cutting a data writing time to the memory cell array 1. If a pulse width of the signal CSL is long, the BLI circuit 3 is maintained in the high-resistance state until the signal CSL is deactivated even after the data of the bit line pair SBL, /SBL is reversed. In this case, the writing time to the memory cell array 1 is cut. Thus, by detecting the activation timing of the signal CSL to generate the signal CSLT, it is possible to secure a long data writing time to the memory cell array 1.

Figure 9:
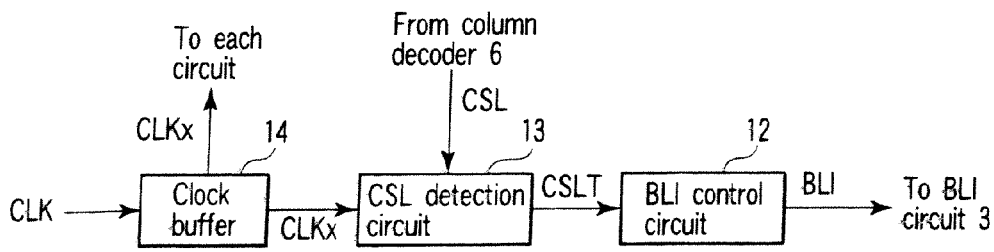
FIG. 9 is a block diagram showing another configuration example of the third embodiment.

When an operation of rising/falling of the signal CSL synchronizes with a clock, a configuration may be employed in which the signal BLI is returned to VPP upon reception of falling (or rising) of a clock which is a trigger for deactivating the signal CSL or rising/falling of a subsequent clock (but clock before a clock for determining precharge timing), and the signal BLI only needs to be returned to the VPP immediately after the deactivation of the signal CSL. FIG. 9 is a block diagram showing the main portion of the semiconductor memory device thus configured.

The semiconductor memory device comprises a clock buffer 14 for receiving a clock CLK input from the outside or a clock CLK generated in the chip. The clock buffer 14 supplies the input clock CLK to each circuit in the semiconductor memory device. The column decoder 6 operates in synchronization with a clock CLKx, and outputs a signal CSL based on the clock CLKx.

The CSL detection circuit 13 detects deactivation of the signal CSL, and inputs a trigger signal CSLT to the BLI control circuit 12 upon rising/falling of a clock after the clock with which the signal CSL synchronizes to operate after the deactivation of the signal CSL. Upon the reception of the signal CSLT from the CSL detection circuit 13, the BLI control circuit 12 returns a potential of the signal BLI from VBLH to VPP. Also with this configuration of the semiconductor memory device, effects similar to the above can be obtained.

Figure 10:
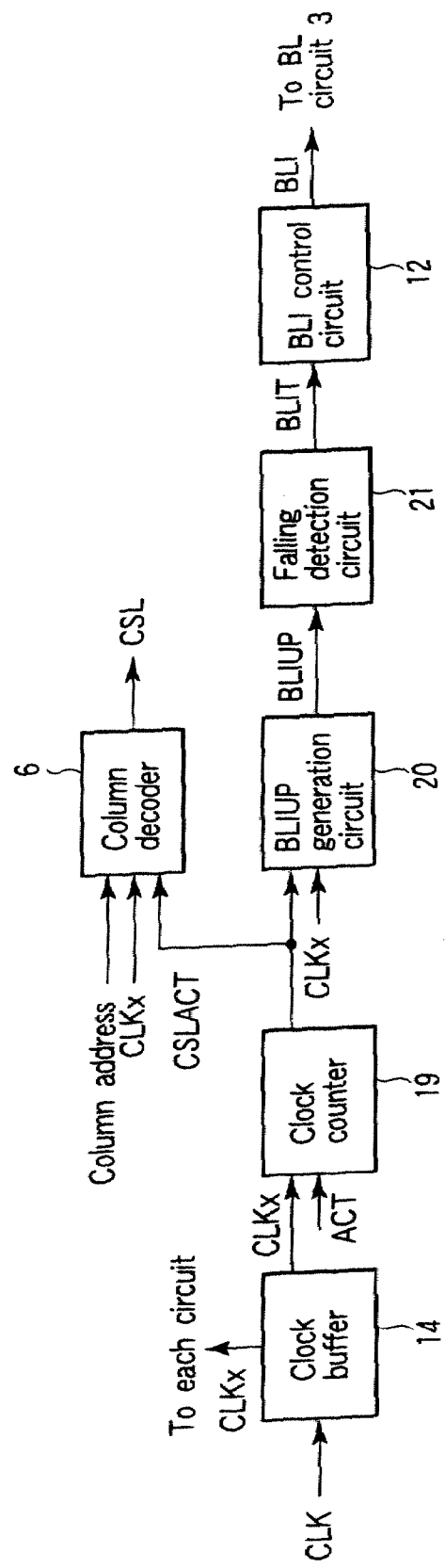
FIG. 10 is a block diagram showing yet another configuration example of the third embodiment.

FIG. 10 is a block diagram showing another configuration example of the embodiment. A circuit shown in FIG. 10 is configured, when rising/falling of the signal CSL synchronizes with rising/falling of a clock, to return the signal BLI to VPP upon reception of the clock with which the signal CSL synchronizes to operate.

The clock CLKx supplied from the clock buffer 14 and a signal ACT for determining activation timing of the word line WL are input to a clock counter 19. The clock counter 19 counts the number of clocks CLKx after activation of the signal ACT, and generates a pulse signal CSLACT in synchronization with the clocks CLKx after the predetermined number of times.

A column address, the signal CSLACT and the clock CLKx are input to the column decoder 6. The column decoder 6 outputs a pulse signal CSL in synchronization with the clock CLKx input while the signal CSLACT is activated.

The signal CSLACT and the clock CLKx output from the clock counter are input to a BLIUP generation circuit 20. The BLIUP generation circuit 20 generates a pulse signal BLIUP in synchronization with the clock CLKx input while the signal CSLACT is activated. In other words, the clock CLKx with which the pulse signal CSL synchronizes and the clock CLKx with which the pulse signal BLIUP synchronizes are the same clock CLKx.

The pulse signal BLIUP is input to a falling detection circuit 21. Upon falling of the signal BLIUP, the falling detection circuit 21 inputs a trigger signal BLIT to the BLI control circuit 12. Then, the BLI control circuit 12 that has received the trigger signal BLIT returns the potential of the signal BLI from the VBLH to the VPP. Also with this configuration of the semiconductor memory device, effects similar to the above can be obtained.

That is, according to the embodiment, upon reception of a signal (clock in the example) for determining falling timing of the signal CSL or its delay signal (the subsequent clock in the example), the signal BLI is returned from the VBLH to the VPP.

Furthermore, upon reception of a signal for determining a rising timing of the signal CSL or its delay signal, the signal BLI may be returned from the VBLH to the VPP. For example, in the case of a large internal delay in the BLI control circuit 12 or the like, or the case of a long pulse width of the signal CSL, the embodiment is effective for securing a long data writing time to the memory cell array 1.

Fourth Embodiment

According to a fourth embodiment, the bit line BL, /BL and the bit line SBL, /SBL are electrically cut off from each other before data writing to the memory cell array 1.

Figure 11:
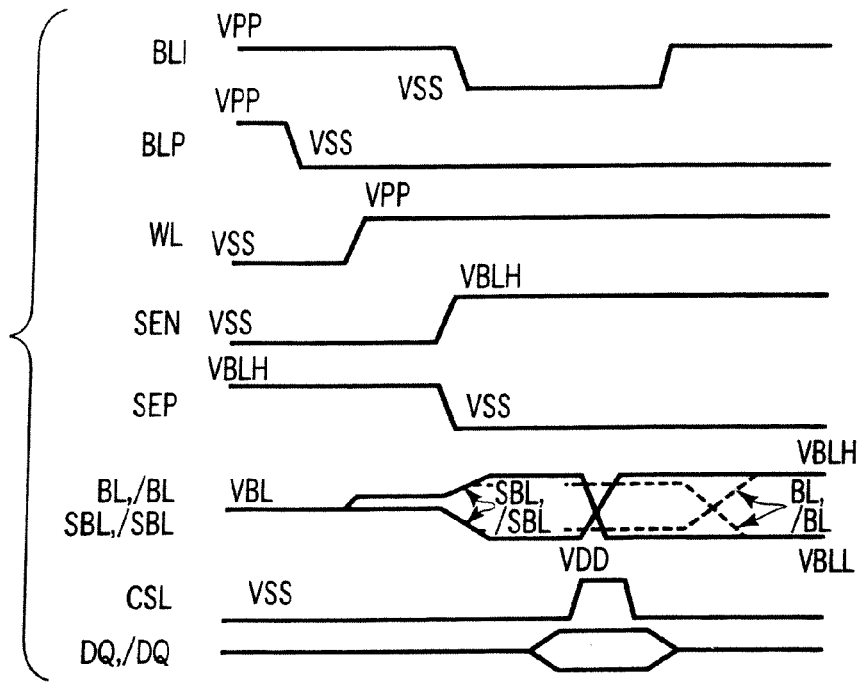
FIG. 11 is a timing chart of a semiconductor memory device according to a fourth embodiment.

FIG. 11 is a timing chart of a semiconductor memory device according to the fourth embodiment. The BLI control circuit 12 controls to lower a potential of a signal BLI from VPP to VSS when the signal BLI is subjected to clocking. In other words, when an NMOS transistor is used as a variable resistance element, the BLI control circuit 12 supplies a ground voltage VSS to a gate of the NMOS transistor.

When the signal BLI is lowered from the VPP to the VSS, the bit line pair BL, /BL and the bit line pair SBL, /SBL are electrically cut off from each other. Thus, after the potential of the signal BLI is lowered to the VSS, the potential of the bit line BL, /BL is not changed. In this case, as shown in FIG. 11, when a signal CSL is activated, data of the bit line SBL, /SBL is changed by data supplied to the data line pair DQ, /DQ, and the potential of the bit line pair BL, /BL is not changed at all.

The BLI control circuit 12 returns the potential of the signal BLI to the VPP immediately after the data of the bit line pair SBL, /SBL is reversed. Accordingly, the bit line pair BL, /BL and the bit line pair SBL, /SBL are connected to each other by low resistance, and the potential of the bit line pair BL, /BL rapidly changes toward a potential of the bit line pair SBL, /SBL.

In the aforementioned data writing operation, when the signal CSL is activated, the signal BLI is at a ground potential VSS, and thus the bit line pair BL, /BL and the bit line pair SBL, /SBL are electrically cut off from each other. Accordingly, a capacity of the bit line pair BL, /BL is separated from the bit line pair SBL, /SBL, the data of the bit line pair SBL, /SBL is reversed more easily compared with the case of writing in a high-resistance isolated state of the bit line pair BL, /BL and the bit line pair SBL, /SBL, and high-speed writing is enabled.

It is not necessary to make sizes of the SA pair transistor and the SA driver constituting the sense amplifier circuit 4 small. Thus, it is possible to suppress a reduction in voltage level of write data to the memory cell array 1.

Conversely, compared with the case of writing in the high-resistance isolated state of the bit line pair BL, /BL and the bit line pair SBL, /SBL, the data can be reversed even when a size of the transistor constituting the sense amplifier circuit 4 is enlarged. Accordingly, by setting a large transistor size, it is possible to make the voltage level of write data to the memory cell array 1 high.

The potential of the bit line pair BL, /BL is not changed in the period from the falling of the potential of the signal BLI to the VSS to the return to the VPP. Thus, the bit line pair BL, /BL may not be completely changed to the VBLH or the VBLL before the start of writing. In such a case, power consumption of the VBLH is reduced because of a small potential change when the date is reversed and written, and the bit line pair BL, /BL rapidly reaches the VBLH or VBLL level. Accordingly, it is possible to set a high writing level to the memory cell MC.

Furthermore, the semiconductor memory device may be configured by using a PMOS transistor for the BLI circuit 3. In this case, a potential of the signal BLI is set to VBLH while data is written to the bit line pair SBL, /SBL. Thus, the bit line pair BL, /BL and the bit line pair SBL, /SBL can be electrically cut off from each other.

In this case, to transfer VBLL, which is a low-level voltage of the bit line, from the bit line SBL to the BL or from the bit line /SBL to the /BL, a voltage of the signal BLI in a low-resistance state must be set lower than a potential obtained by subtracting (an absolute threshold voltage of the PMOS transistor) from (a low-level voltage VBLL of the bit line). However, for example, if a low-level potential of the word line WL is lower than the VBLL and equal to/lower than the above value, the low-level potential of the word line WL may be used. Also with this configuration, effects similar to the above can be obtained.

Fifth Embodiment

According to a fifth embodiment, there is a plurality of signals BLI, and control is performed for each of the signals BLI.

Figure 12:
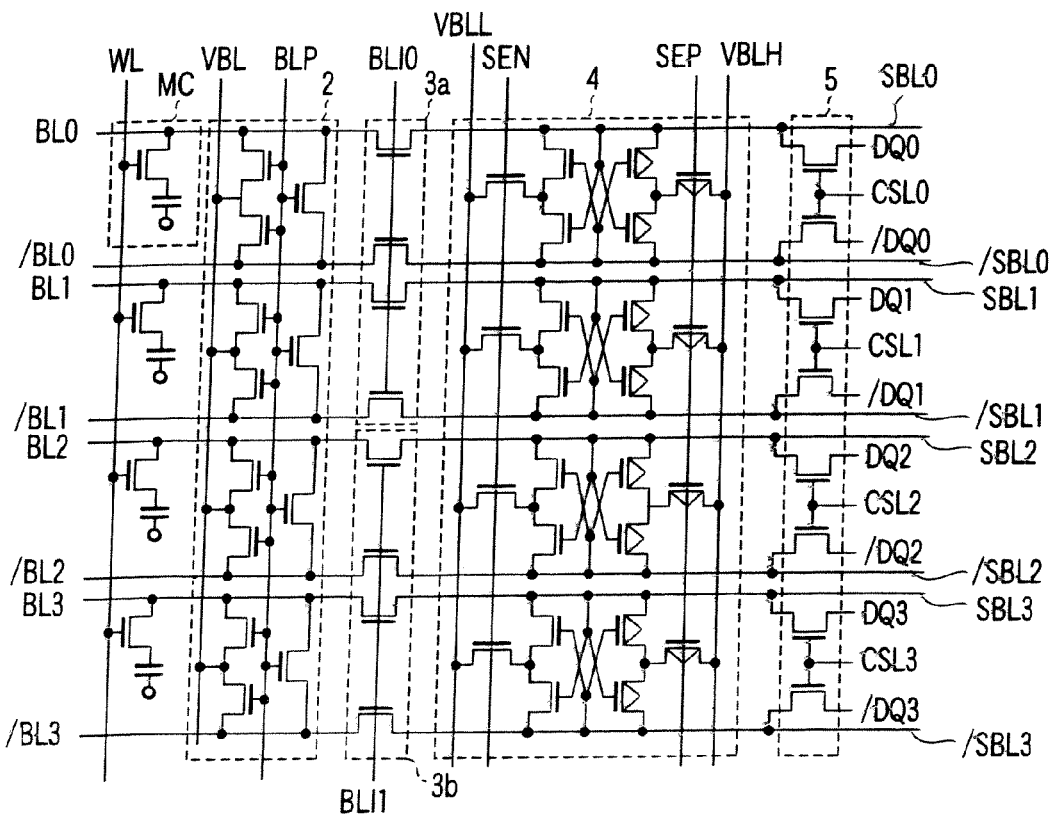
FIG. 12 is a circuit diagram showing a main portion of a semiconductor memory device according to a fifth embodiment of the invention.

FIG. 12 is a circuit diagram showing a main portion of a semiconductor memory device according to the fifth embodiment of the invention. A block diagram will be omitted because it is similar to the block diagram of FIG. 1. FIG. 12 shows only a portion in the semiconductor memory device. Normally, the circuit of FIG. 12 is repeatedly arranged in the semiconductor memory device.

Referring to FIG. 12, bit line pairs BL0 and /BL0, BL1 and /BL1, BL2 and /BL2, and BL3 and /BL3 are arranged, and sense amplifier bit line pairs SBL0 and /SBL0, SBL1 and /SBL1, SBL2 and /SBL2, and SBL3 and /SBL3 are arranged corresponding to the above bit line pairs. Additionally, column selection signals CSL0 to CSL3 are supplied corresponding to the above bit line pairs.

One BLI circuit 3a is disposed corresponding to the CSL0 and CSL1. One BLI circuit 3b is disposed corresponding to the CSL2 and CSL3. The BLI control circuit 12 generates bit line isolation signals BLI0 and BLI1, and inputs them to the BLI circuits 3a and 3b. Then, the BLI control circuit 12 performs bit line isolation control for the BLI circuits 3a and 3b.

Figure 13:
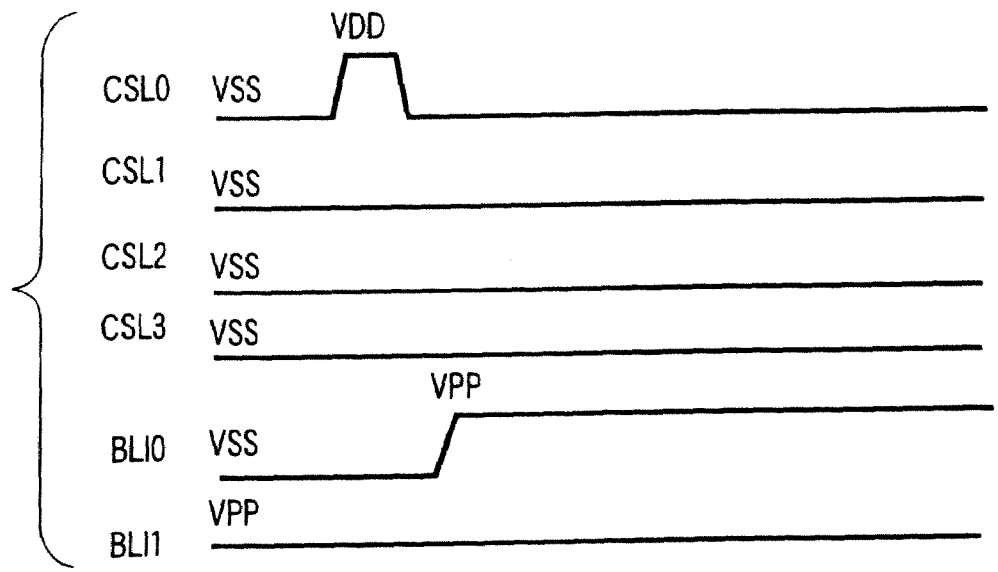
FIG. 13 is a timing chart of the semiconductor memory device shown in FIG. 12.

FIG. 13 is a timing chart of the semiconductor memory device shown in FIG. 12. Referring to FIG. 13, when the signal CSL0 alone is activated, the BLI control circuit 12 performs clocking only for the signal BLI0 of the BLI circuit 3a, but does not perform clocking for the signal BLI1 of a column corresponding to the inactivated CSL2 and CSL3.

Figure 14:
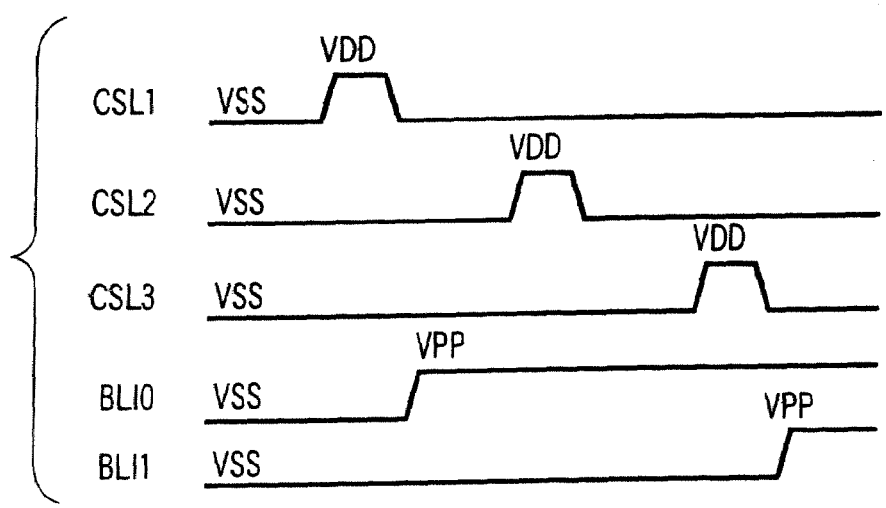
FIG. 14 is a timing chart of a burst operation of the semiconductor memory device shown in FIG. 12.

FIG. 14 is a timing chart of a burst operation for a continuous writing operation. In the data writing operation, for example, if the CSL1, the CSL2 and the CSL3 are activated in this order, the BLI control circuit 12 changes the signal BLI0 from VSS to VPP immediately after the CSL1 is activated and data of the bit line pair SBL1, /SBL1 corresponding to the CSL1 is reversed.

Next, the CSL2 is activated. However, since the columns corresponding to the CSL2 and the CSL3 share the signal BLI1, the BLI control circuit 12 changes the signal BLI1 from VSS to VPP immediately after data of the bit line pair SBL3, /SBL3 is reversed.

In the aforementioned writing operation, among the plurality of signals BLI, the signal BLI to be subjected to clocking is limited to the signal BLI alone corresponding to the column to which writing is actually carried out. Accordingly, compared with the case in which there is only one signal BLI, the number of BLI circuits for performing clocking is reduced, making it possible to reduce power consumption during writing. Additionally, for a column to which writing is not carried out, i.e., a column to which a restoring operation is carried out, the signal BLI is not subjected to clocking, and thus it is possible to secure a long restoration time.

Writing timing to the bit line of the memory cell array 1 is shifted by setting the signals BLI subjected to clocking to VPP in order from the signal BLI corresponding to a column to which writing is started. Thus, for the column to which the writing is carried out first, a longer writing time can be set.

For the column to which the writing is carried out later, the time is shifted from that of the column to which the writing is carried out previously. Accordingly, a current flowing to the power supply VBLH or VBLL can be dispersed timewise. Thus, a fluctuation in the power supply VBLH or VBLL is suppressed to secure a sufficient writing level.

Compared with the case in which there is only one signal BLI, the number of transistors connected to the wiring for a signal BLI is reduced, reducing a capacity of the gate connected to the wiring. Thus, a transition speed of the signal BLI can be made fast, which is suitable for a high-speed operation.

The embodiment is described by using the VSS for the potential of the signal BLI during the writing. However, an intermediate potential other than the VSS may be used.

Furthermore, by similarly controlling the BLI circuit 3 alone corresponding to the column to which a reading operation is carried out during data reading, a transition speed of the bit line pair SBL, /SBL becomes faster after activation of the sense amplifier circuit, making it possible to make activation timing of the signal CSL faster. Moreover, source noise is suppressed to guarantee a stable sense operation because of a smaller capacity of the bit line pair SBL, /SBL.

Sixth Embodiment

According to a sixth embodiment, a semiconductor memory device is configured by matching the number of signals CSL and the number of signals BLI with each other and correlating them one to one.

Figure 15:
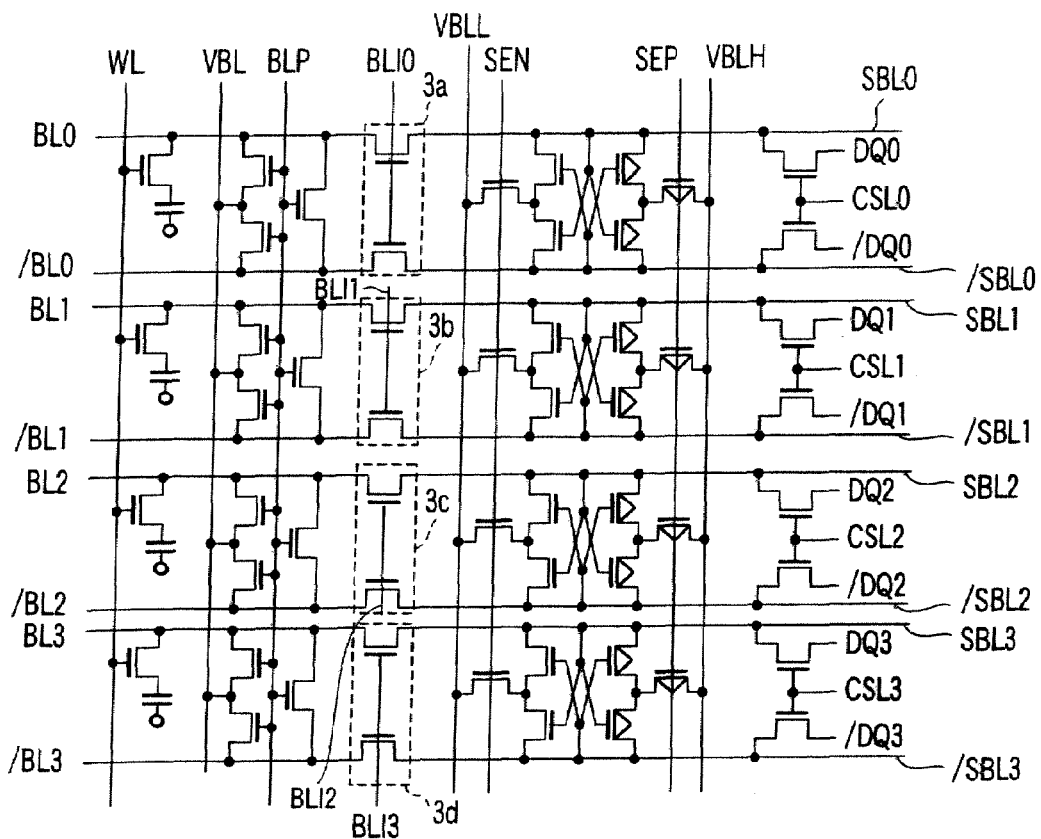
FIG. 15 is a circuit diagram showing a main portion of a semiconductor memory device according to a sixth embodiment of the invention.

FIG. 15 is a circuit diagram showing a main portion of the semiconductor memory device according to the sixth embodiment of the invention. A block diagram will be omitted because it is similar to the block diagram of FIG. 1.

Referring to FIG. 15, BLI circuits 3a, 3b, 3c and 3d are arranged in columns corresponding to four signals CSL0, CSL1, CSL2 and CSL3. The BLI control circuit 12 supplies bit line isolation signals BLI0, BLI1, BLI2 and BLI3 to the BLI circuits 3a, 3b, 3c and 3d. It is to be noted that a plurality of bit line pairs are normally connected to each of the signal CSL and the signal BLI.

Figure 16:
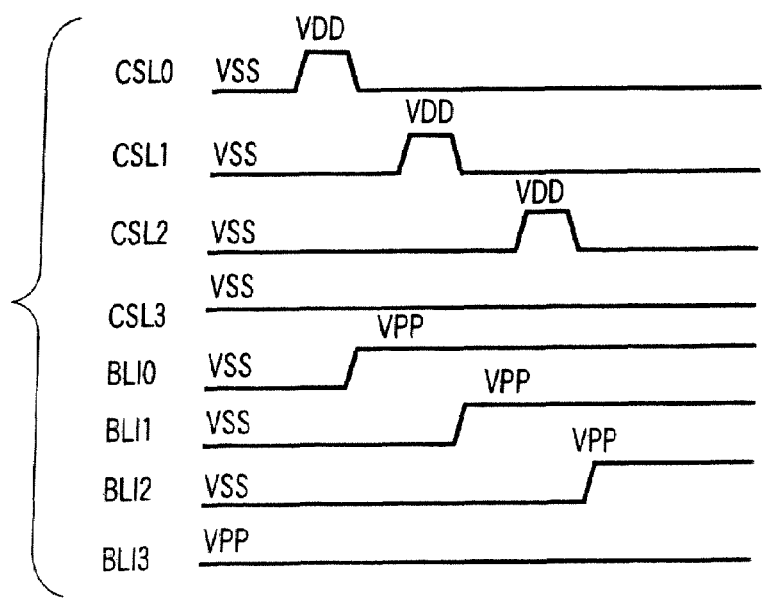
FIG. 16 is a timing chart of a burst operation of the semiconductor memory device shown in FIG. 15.

FIG. 16 is a timing chart of a burst operation in the semiconductor memory device shown in FIG. 15. When the signal CSL0 is activated, the corresponding signal BLI0 alone is subjected to clocking, while clocking is not performed for the signal BLI of a column to which writing is not carried out. When the signals CSL0, CSL1 and CSL2 are activated in this order as shown in FIG. 16, the BLI control circuit 12 changes the signals BLI0, BLI1 and BLI2 to VPP in this order immediately after the corresponding signal CSL is deactivated. The signal BLI3 of a column to which writing is not carried out is not subjected to clocking.

In the aforementioned writing operation, the column to which the signal BLI is subjected to clocking is only a column to which writing is actually carried out. Thus, it is possible to suppress power consumption of BLI control to a minimum during writing.

For example, in the case of a specification in which writing is carried out simultaneously by multiple bits in mixed memories or the like, the number of signals CSL is small, and thus the number of corresponding signals BLI is small. Accordingly, only small numbers of BLI control circuits and BLI wirings are necessary, making it possible to reduce areas of a BLI control circuit and a BLI circuit. This similarly applies to the fifth embodiment.

Furthermore, if the number of signals CSL is small (the number of columns connected to one signal CSL is large), a wiring of the signal CSL is normally laid in the same direction of the word line. Thus, the wirings of the signals CSL and BLI are laid in the same direction in the layout, and relative timing between the signals CSL and BLI is easily matched in all the columns, which is suited to a stable operation.

The embodiment is described by using the VSS for the potential of the signal BLI during writing. However, an intermediate potential other than the VSS may be used.

Seventh Embodiment

Figure 17:
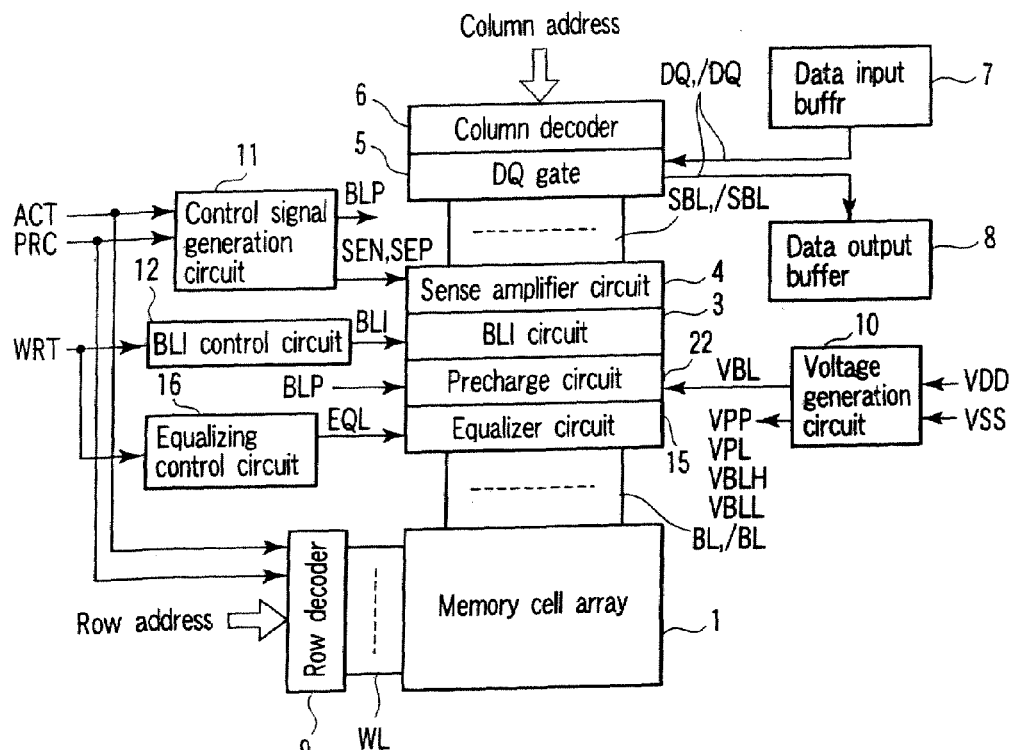
FIG. 17 is a block diagram showing a main portion of a semiconductor memory device according to a seventh embodiment of the invention.

FIG. 17 is a block diagram showing a main portion of a semiconductor memory device according to a seventh embodiment of the invention. According to the embodiment, in place of the precharge circuit 2 of the block diagram shown in FIG. 1, a precharge circuit 22, an equalizer circuit 15, and an equalizing control circuit 16 are disposed.

Upon activation of a signal BLP, the precharge circuit 22 supplies a precharge voltage VBL to the bit line pair BL, /BL. The equalizer circuit 15 equalizes the bit lines BL and /BL. The equalizing control circuit 16 generates an equalizing signal EQL, and controls an operation of the equalizer circuit 15.

Figure 18:
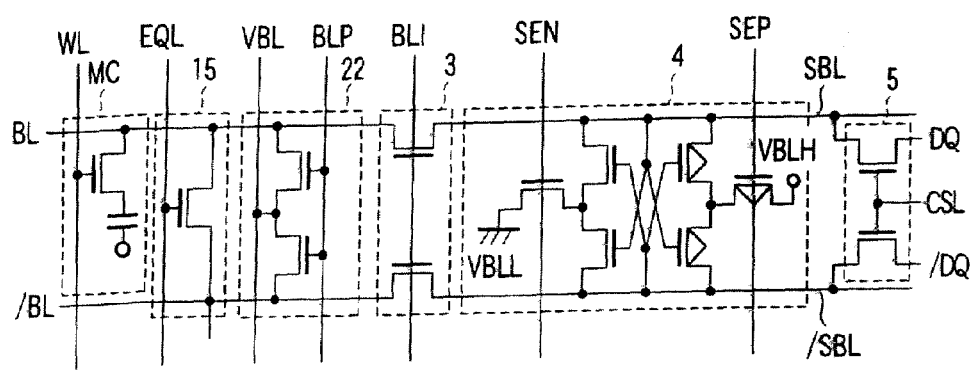
FIG. 18 is a circuit diagram showing the main portion of the semiconductor memory device shown in FIG. 17.

FIG. 18 is a circuit diagram showing a main portion of the semiconductor memory device shown in FIG. 17. The equalizer circuit 15 is configured by removing the transistor for short-circuiting the bit lines BL and /BL from the precharge circuit 2, and comprises one NMOS transistor. A signal EQL output from the equalizing control circuit 16 is supplied to a gate of the NMOS transistor.

FIG. 19 is a timing chart of the semiconductor memory device shown in FIG. 18. Referring to FIG. 19, the equalizing control circuit 16 sets the signal EQL at VPP while the signal BLI is VSS. Then, the bit lines BL and /BL are electrically connected to each other. Accordingly, the bit line pair BL, /BL changes to an intermediate potential of potentials of the bit lines BL and /BL immediately before the signal EQL is set to the VPP. For example, if potentials of the bit lines BL and /BL are respectively VBLH and VBLL (equal to VSS) immediately before the signal EQL is set to the VPP, then the bit line pair BL, /BL is set near (VBLH+VBLL)/2.

Data is written from the data line pair DQ, /DQ to the bit line pair SBL, /SBL corresponding to the activated signal CSL. Then, the equalizing control circuit 16 sets the signal EQL to VSS before the signal BLI is changed to VPP.

Then, the bit line pair BL, /BL and the bit line pair SBL, /SBL are connected to each other, and the bit line pair BL, /BL changes toward a potential of the bit line pair SBL, /SBL.

An operation of writing data reverse to data read to the bit lines BL and /BL is classified into an operation of equalizing potentials of the bit lines BL and /BL during reading and an operation of subsequently changing the potentials thereof in a reverse direction. According to the embodiment, the potentials of the bit lines BL and /BL are equalized before the signal BLI is changed to the VPP, and thus a first half of the operation of writing the reverse data is completed. Thus, since the bit lines BL and /BL reach the levels of VBLH and VBLL quickly, it is possible to set a high writing level to the memory cell MC.

When the signal BLI is changed to the VPP, if writing to the bit lines SBL, /SBL is insufficient and a potential difference between the bit lines SBL and /SBL is small, there is a possibility of destroying the data if a potential difference of a reverse direction is present between the bit lines BL and /BL. According to the embodiment, the bit lines BL, /BL are at equal potentials before the signal BLI is changed to the VPP, and thus such data destruction can be prevented.

Incidentally, if the above signal BLP is controlled at the same timing as that of the above signal EQL by using the above precharge circuit 2, potentials of the bit lines BL and /BL immediately before the signal BLI is changed to the voltage VPP can be set equal to each other and to VBL, which is a bit line precharge potential. Thus, effects similar to the above can be obtained. FIG. 20 is a timing chart of the semiconductor memory device in such a case.

In the precharge circuit 2, the signal BLP is changed to VPP while the signal BLI is changed to VSS. After the change of the signal BLP to the VPP, the bit line pair BL, /BL is precharged to a voltage VBL while being equalized. Data is written from the data line pair DQ, /DQ to the bit line pair SBL, /SBL corresponding to the activated signal CSL. Then, before the signal BLI is changed to the VPP, in the precharge circuit 2, the signal BLP is changed to VSS, and the precharging of the bit line pair BL, /BL is released.

Subsequently, the bit line pair BL, /BL and the bit line pair SBL, /SBL are connected to each other, and the bit line pair BL, /BL changes toward a potential of the bit line pair SBL, /SBL. At this time, the bit lines BL, /BL are at equal potentials, and start to be changed from near VBL. Thus, as in the case in which the precharge circuit 2 and the equalizer circuit are separately disposed, it is possible to set a high writing level to the memory cell array 1 and to prevent data destruction when the signal BLI is changed to the VPP. Moreover, since it is not necessary to provide a new equalizing control circuit, there is an effect of suppressing an increase in circuit size.

If the precharge circuit and the equalizer circuit are separately disposed as described above, only the equalizer circuit needs to be controlled when data is written, and the number of transistors connected to the signal EQL is smaller than that of transistors connected to the signal BLP when the precharge circuit 2 is used. Thus, a capacity of the gate connected to the signal EQL is smaller, and power consumption by equalizing control can be reduced. Additionally, a transition speed of the signal EQL can be made faster, which is suited to a high-speed operation.

Next, description will be made of a case in which there is a plurality of signals BLI.

When there is one signal BLI, the signal BLI must be changed from VSS to VPP in accordance with a column to which last writing is carried out during a burst operation, and the signal EQL is controlled to change from VPP to VSS immediately before the signal BLI is changed to the VPP. On the other hand, when a plurality of signals BLI are provided and the signals BLI are changed to VPP in order from those corresponding to columns to which writing is completed as in the case of the fifth embodiment for the purpose of making a writing level high or the like, if there is one signal EQL, equalizing must be released in accordance with a first writing operation.

Then, equalizing is released for columns to which writing is carried out later, i.e., columns in which the signal CSL is deactivated and the signal BLI is changed to VPP later, making longer a time of an electrically disconnected state of the corresponding bit line pair BL, /BL.

In this case, there is a possibility that in the electrically disconnected state, the bit lines BL, /BL will change to different potentials due to noise from the other bit line pair, leakage of the bit lines BL, /BL or the like, becoming unequal potentials. However, by disposing a plurality of equalizer circuits corresponding to the signals BLI, it is possible to release equalizing in accordance with the writing operation of each signal.

Figure 21:
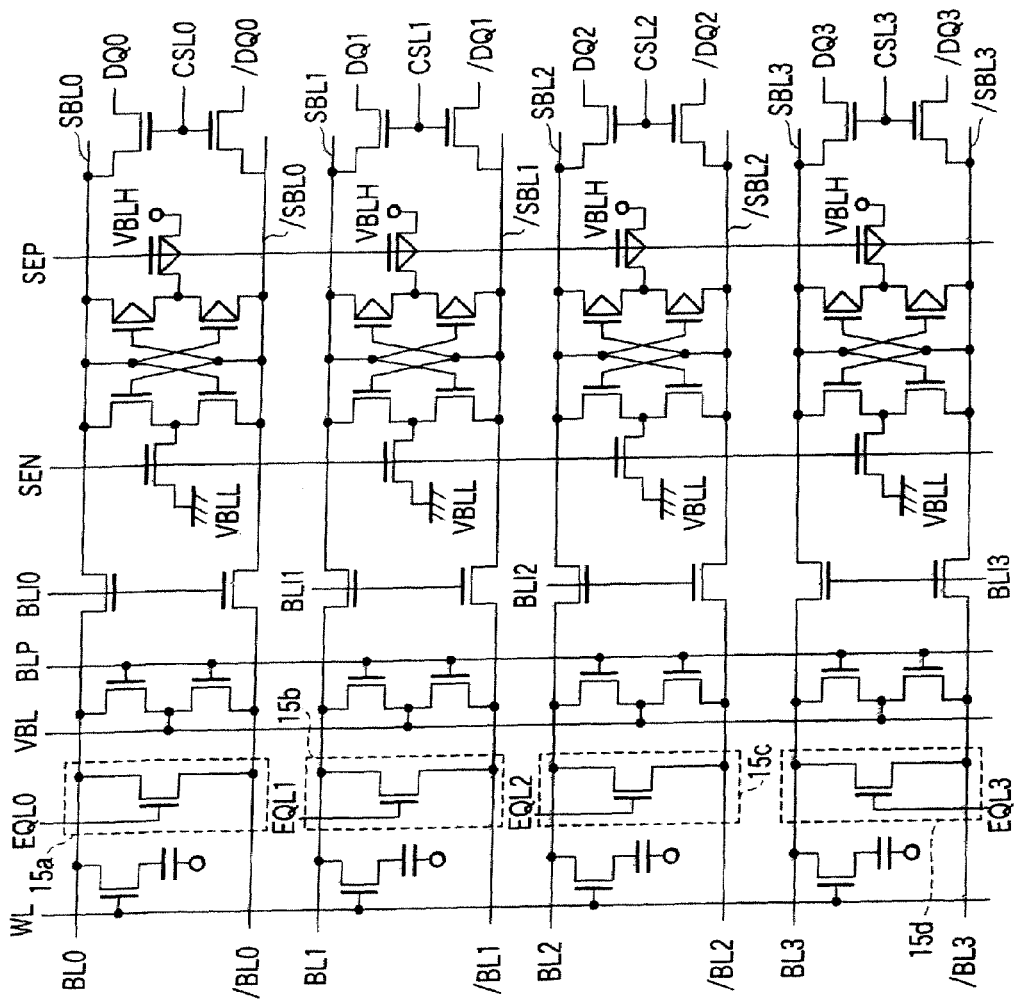
FIG. 21 is a circuit diagram showing a main portion of a semiconductor memory device in which an equalizer circuit is disposed corresponding to a signal BLI.

FIG. 21 is a circuit diagram showing a main portion of the semiconductor memory device in which a plurality of equalizer circuits are disposed corresponding to a plurality of signals BLI. Referring to FIG. 21, equalizer circuits 15a, 15b, 15c, and 15d are arranged in columns corresponding to signals CSL0, CSL1, CSL2 and CSL3. The equalizing control circuit 16 supplies equalizing signals EQL0, EQL1, EQL2 and EQL3 to the equalizer circuits 15a, 15b, 15c and 15d.

FIG. 22 is a timing chart of the semiconductor device shown in FIG. 21. After the change of the signal BLI from VPP to VSS, the equalizing control circuit 16 changes the signal EQL corresponding to the signal BLI from VSS to VPP. For timing of changing the signal EQL from the VSS to the VPP, all the signals may be controlled in accordance with the timing of changing the signal BLI to the VSS simultaneously, or sequentially in accordance with writing timing of each signal (activation timing of the signal CSL) as indicated by a broken line in FIG. 22. Additionally, the equalizing control circuit 16 sequentially changes the signals EQL from the VPP to the VSS before the corresponding signals BLI are changed from the VSS to the VPP.

With this configuration, equalizing of all the bit lines for writing can be released immediately before the signals BLI become VPP. Thus, it is possible to shorten the time of the electrically disconnected state of the bit line pair BL, /BL.

Since the equalizer circuit alone of the system corresponding to the column to which writing is carried out can be controlled, power consumption by equalizing control during writing can be suppressed. Moreover, wasteful consumption of a current by equalizing the column to which writing is not carried out can be prevented, and a long restoration time can be secured for the column to which writing is not carried out.

In the case of using the above precharge circuit 2, by disposing a plurality of signals BLP corresponding to the plurality of signals BLI, precharging of all the bit lines can be released immediately before the signals BLI become VPP. However, as shown in FIG. 21, power consumption can be reduced more in the case in which the precharge circuit and the equalizer circuit are separately disposed and a plurality of equalizer circuits only are disposed. Moreover, because of no precharge transistor to VBL for which a plurality are not always necessary, a layout area is reduced and can realize a compact sense amplifier.

Figure 24:
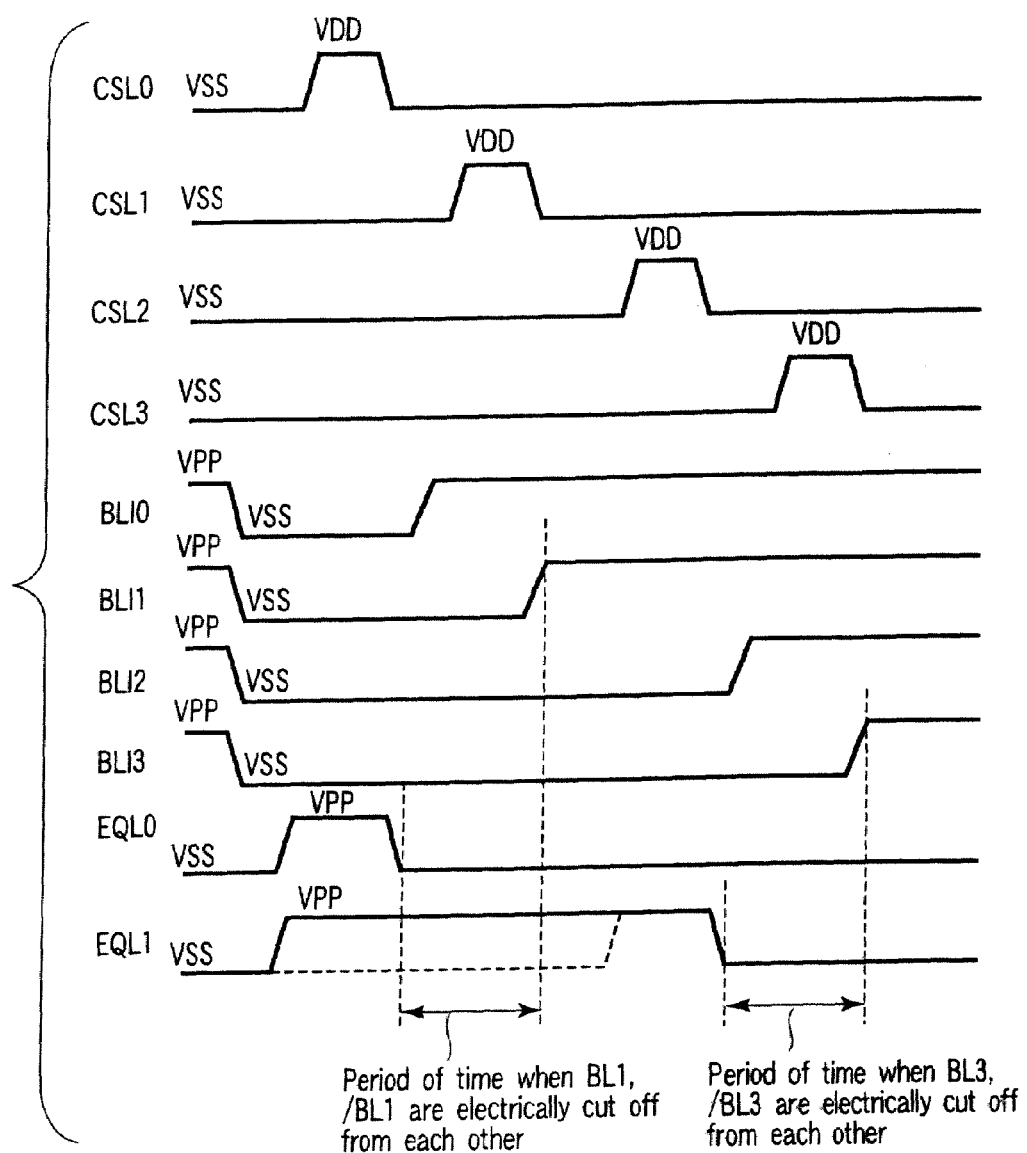
FIG. 24 is a timing chart of the semiconductor memory device shown in FIG. 23.

Furthermore, correspondence between the signals EQL or BLP and the signals BLI may be 1 to a plurality. FIG. 23 is a circuit diagram showing a main portion of the semiconductor memory device, for example, when correspondence between the signals EQL and the signals BLI is 1 to 2. FIG. 24 is a timing chart of the semiconductor device shown in FIG. 23.

With this configuration, compared with the case of only one signal EQL, it is possible to shorten the time of the electrically disconnected state of the bit line pair BL, /BL.

Eighth Embodiment

Figure 25:
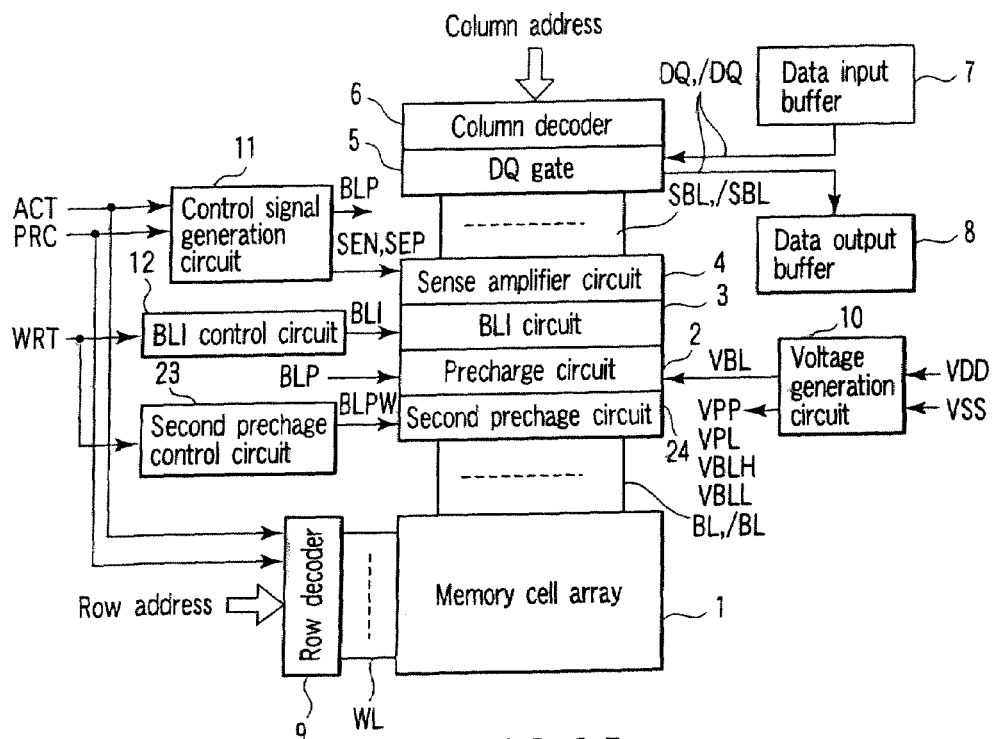
FIG. 25 is a block diagram showing a main portion of a semiconductor memory device according to an eighth embodiment of the invention.

FIG. 25 is a block diagram showing a main portion of a semiconductor memory device according to an eighth embodiment of the invention. According to the embodiment, a second precharge circuit 24 and a second precharge control circuit 23 are newly added in the block diagram of FIG. 1. The second precharge circuit 24 precharges the bit lines BL, /BL to high-level bit line voltage VBLH. The second precharge control circuit 23 generates a signal BLPW, and controls an operation of the second precharge circuit 24.

Figure 26:
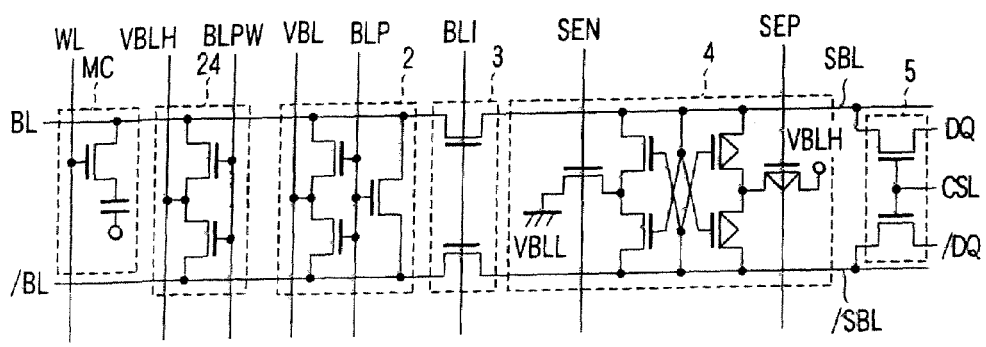
FIG. 26 is a circuit diagram showing a main portion of the semiconductor memory device shown in FIG. 25.

FIG. 26 is a circuit diagram showing the main portion of the semiconductor memory device shown in FIG. 25. The second precharge circuit 24 comprises two NMOS transistors. A precharge signal BLPW is input to a gate of each NMOS transistor of the second precharge circuit 24. A high-level bit line voltage VBLH is input to the second precharge circuit 24. The second precharge circuit 24 supplies a voltage VBLH to the bit line pair BL, /BL upon activation of the signal BLPW.

FIG. 27 is a timing chart of the semiconductor memory device shown in FIG. 26. The second precharge control circuit 23 changes the signal BLPW to VPP while the signal BLI is changed to VSS. After the change of the signal BLPW to the VPP, the bit lines BL, /BL are both precharged to VBLH. Data from the data line pair DQ, /DQ is written to the bit line pair SBL, /SBL corresponding to an activated signal CSL. The second precharge control circuit 23 changes the signal BLPW to VSS before the signal BLI is changed to the VPP. Accordingly, precharging of the bit line pair BL, /BL is released.

Subsequently, the bit line pair BL, /BL and the bit line pair SBL, /SBL are connected to each other, and the bit line pair BL, /BL changes toward a potential of the bit line pair SBL, /SBL. At this time, the bit line pair BL, /BL starts to be changed from near the VBLH.

In the case of using an NMOS transistor for a BLI circuit or a cell transistor, when high-level writing is performed to the bit line BL (or /BL) and the memory cell MC, compared with the case of low-level writing, a potential difference between the gate of the BLI circuit or the cell transistor and a source becomes small, delaying writing.

However, in the aforementioned writing operation, while the signal BLI is changed to the VSS, the high-level writing to the memory cell array 1 is started at a point of time of starting the precharging of the bit line pair BL, /BL to the VBLH, and thus a level of the high-level writing can be set very high. In the case of low-level writing, a change is made from near VBLH after the signal BLI is changed to the VPP. However, this is not a problem because of a large potential difference between the gate and the source. It is very effective for, for example, a system in which a writing time is short due to a short random cycle time or the like.

To make a low-level writing speed to the memory cell array 1 faster by constituting the BLI circuit or the cell transistor of a PMOS transistor or the like, the bit line pair BL, /BL only needs to be precharged to VSS or a low-level bit line voltage VBLL while the bit line pair BL, /BL and the bit line pair SBL, /SBL are electrically cut off from each other. This can be implemented by changing a voltage supplied to the second precharge circuit 24 to VSS or VBLL.

Precharging at once the bit lines BL, /BL finally made into a low-level (or high-level) to the VBLH (or VBLL) causes a power consumption loss. Thus, on the balance of a request of a writing speed and a request of a reduction of power consumption, the bit line pair can be precharged to (VBLH+VBLL)/2 or a proper intermediate potential between (VBLH+VBLL)/2 and VBLH (or VBLL).

The second precharge circuit 24 may comprise three NMOS transistors as in the case of the precharge circuit 2. In such a case, a transistor is added for equalizing the bit lines BL, /BL. Accordingly, while the signal BLI is changed to the VSS, if the signal BLPW is changed to the VPP, the bit lines BL, /BL are precharged to VBLH or VBLL and equalized to be surely set to equal potentials. Thus, it is possible to prevent data destruction when the signal BLI is changed to the VPP.

Next, description will be made of a case in which there is a plurality of signals BLI.

When there is one signal BLI, the signal BLI must be changed from VSS to VPP in accordance with a column to which last writing is carried out during a burst operation, and the signal BLPW is controlled to change from VPP to VSS immediately before the signal BLI is changed to the VPP.

On the other hand, when a plurality of signals BLI are provided and the signals BLI are changed to VPP in order from those corresponding to columns to which writing is completed as in the case of the fifth embodiment for the purpose of making a writing level high or the like, if there is one signal BLPW, precharging must be released in accordance with a first writing operation. Then, precharging is released for columns to which writing is carried out later, i.e., columns in which the signal CSL is deactivated and the signal BLI is changed to VPP later, making longer a time of a floating state of the corresponding bit line pair BL, /BL.

In this case, there is a possibility that in the floating state, the bit lines BL, /BL will change from precharged potentials (e.g., VBLH) to different potentials due to noise from the other bit line pair, leakage of the bit lines BL, /BL or the like. However, by disposing a plurality of second precharge circuits 24 corresponding to the signals BLI, it is possible to release precharging in accordance with the writing operation of each signal.

Figure 28:
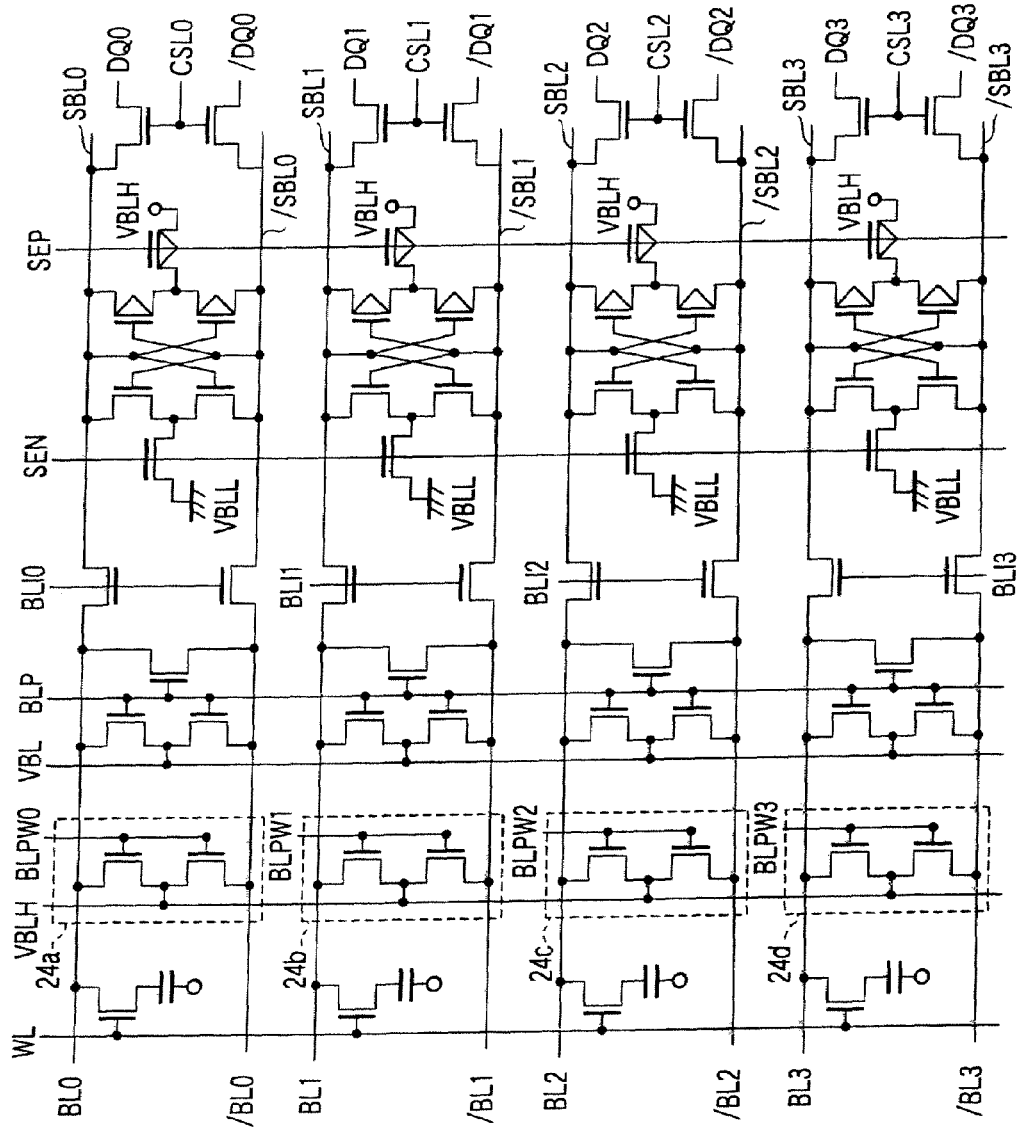
FIG. 28 is a circuit diagram showing a main portion of a semiconductor memory device in which a second precharge circuit 24 is provided corresponding to a signal BLI.

FIG. 28 is a circuit diagram showing a main portion of the semiconductor memory device in which a plurality of second precharge circuits 24 are disposed corresponding to a plurality of signals BLI. Referring to FIG. 28, second precharge circuits 24a, 24b, 24c, and 24d are arranged in columns corresponding to signals CSL0, CSL1, CSL2 and CSL3. The second precharge control circuit 23 supplies signals BLPW0, BLPW1, BLPW2 and BLPW3 to the second precharge circuits 24a, 24b, 24c and 24d.

With this configuration, precharging of all the bit lines for writing can be released immediately before the signals BLI become VPP. Thus, it is possible to shorten the time of the floating state of the bit line pair BL, /BL.

Since the second precharge circuit 24 alone of the system corresponding to the column to which writing is carried out can be controlled, power consumption by precharging control during writing can be suppressed. Moreover, wasteful consumption of a current by precharging the column to which writing is not carried out can be prevented, and a long restoration time can be secured for the column to which writing is not carried out.

Figure 29:
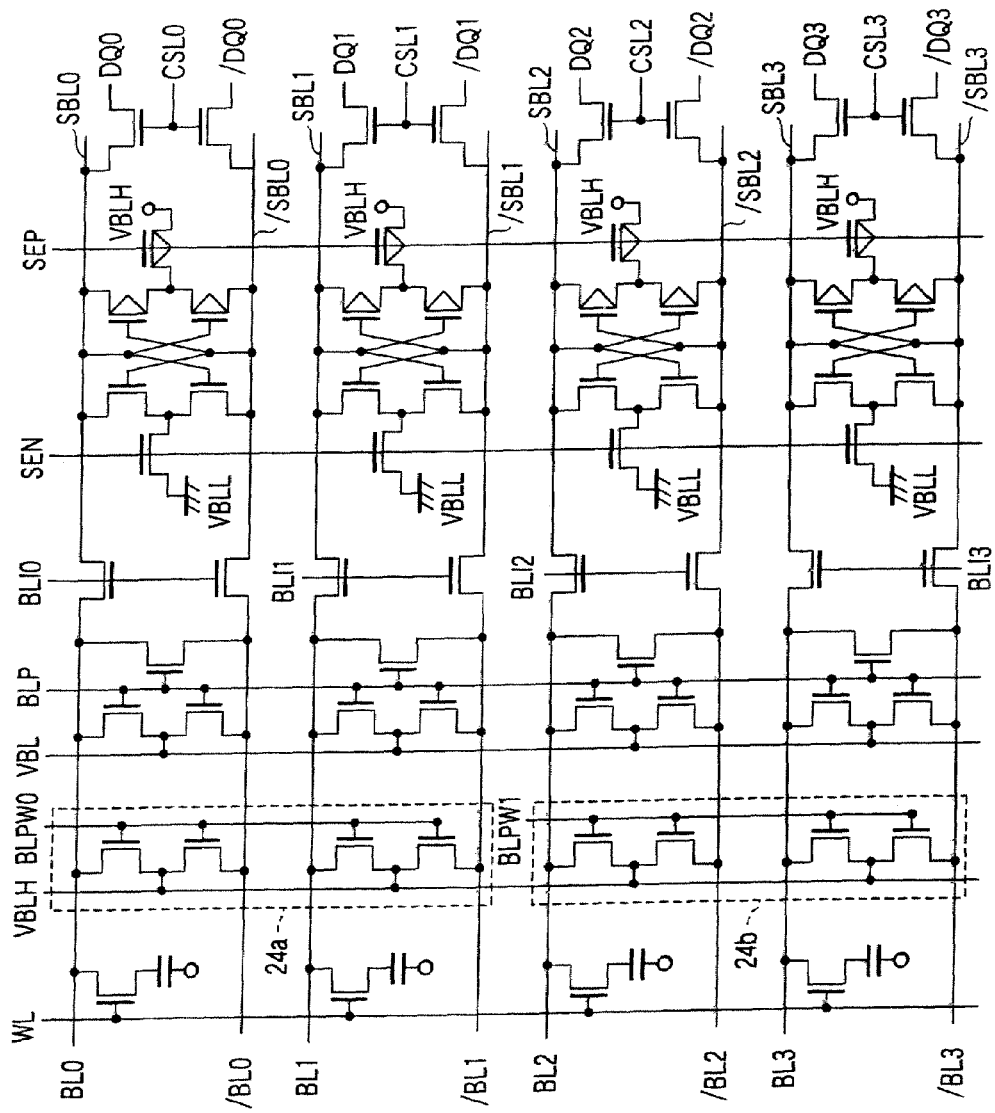
FIG. 29 is a circuit diagram showing a main portion of a semiconductor memory device configured so that signals BLPW and signals BLI can correspond to each other by 1 to 2.

Furthermore, correspondence between the signals BPLW and the signals BLI may be 1 to a plurality. FIG. 29 is a circuit diagram showing a main portion of the semiconductor memory device, for example, when correspondence between the signals BLPW and the signals BLI is 1 to 2. With this configuration, it is possible to shorten the time of the floating state of the bit line pair BL, /BL compared with the case of only one signal BLPW.

Ninth Embodiment

Figure 30:
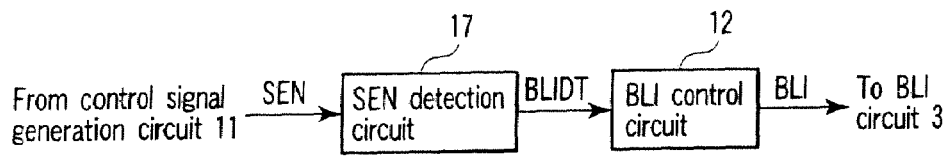
FIG. 30 is a block diagram showing a main portion of a circuit which determines falling timing of a signal BLI.

FIG. 30 is a block diagram showing a main portion of a circuit for determining falling timing of a signal BLI.

A semiconductor memory device comprises an SEN detection circuit 17. A sense amplifier activation signal SEN generated by a control signal generation circuit 11 is input to the SEN detection circuit 17. The SEN detection circuit 17 detects activation timing of a signal SEN. In other words, it detects rising of the signal SEN. Upon the detection of the rising of the signal SEN, the SEN detection circuit 17 generates a trigger signal BLIDT. Then, the signal BLIDT is output to the BLI control circuit 12.

Upon reception of the signal BLIDT from the SEN detection circuit 17, the BLI control circuit 12 changes a potential of the signal BLI from VPP to VSS or an intermediate potential (e.g., VBLH, VBL, VPL, or VDD). In other words, the bit line pair BL, /BL and the bit line pair SBL, /SBL are electrically cut off from each other or isolated from each other by high resistance immediately after the sense amplifier circuit 4 is activated. Other components are similar to those of the semiconductor memory device of the first embodiment.

If timing of the change of the potential of the signal BLI from the VPP to the VSS or the intermediate potential (e.g., VBLH, VBNL, VPL or VDD) is before the activation of the sense amplifier circuit 4, the following problems occur.

Data read to the bit line pair BL, /BL and the bit line pair SBL, /SBL are very small in a period from activation of the word line WL to activation of the sense amplifier circuit 4, and the data are amplified upon the activation of the sense amplifier circuit 4. When the signal BLI falls before the activation of the sense amplifier circuit 4, i.e., in a state in which there are only small potential differences between the bit lines BL and /BL and between the bit lines SBL and /SBL, if influences of falling noise of the signal BLI received by the bit lines SBL and /SBL are different, there is a possibility of destroying the read data.

When there is an unbalance in capacity between the bit lines SBL and /SBL, because of a considerable difference in transition speed of each potentials after the operation of the sense amplifier circuit, there is a possibility of destroying the read data. That is, when the signal SEN is activated, potentials of both of the bit lines SBL and /SBL changes toward VBLL temporarily. However, if the capacity of the bit line SBL (or /SBL) of the high-level side is extremely small, a potential relation between the bit lines SBL and /SBL is reversed in an initial sense operation.

In a writing operation, if columns to which clock control of the signal BLI is carried out include a column to which writing is not carried out, and data stored in the memory cell MC needs to be written again (refreshing or write mask operation of the column to which writing is not carried out), data destruction before the activation of the sense amplifier circuit 4 disables correct rewriting. During reading, if the data are destroyed before the activation of the sense amplifier circuit 4, it is impossible to perform a correct reading operation.

However, according to the embodiment, the bit line pair BL, /BL and the bit line pair SBL, /SBL are electrically cut off from each other or isolated from each other by high resistance immediately after the activation of the sense amplifier circuit 4. Thus, the signal BLI falls after a very small potential of the data read to the bit line pair SBL, /SBL is amplified, causing no data destruction.

In the case of falling of the signal BLI immediately after the activation of the sense amplifier circuit 4, the bit line pair BL, /BL is not changed to VBLH or VBLL. Accordingly, when reverse data is written, the write data of the bit lines SBL, /SBL are not destroyed by the read data of the bit lines BL, /BL after the signal BLI is changed to the VPP.

Additionally, because of small potential changes of the bit lines BL, /BL, it is possible to set a high writing level. The signal BLI must fall before the signal CSL is activated. Thus, the falling of the signal BLI immediately after the activation of the sense amplifier circuit 4 is important for a high-speed operation.

Figure 31:
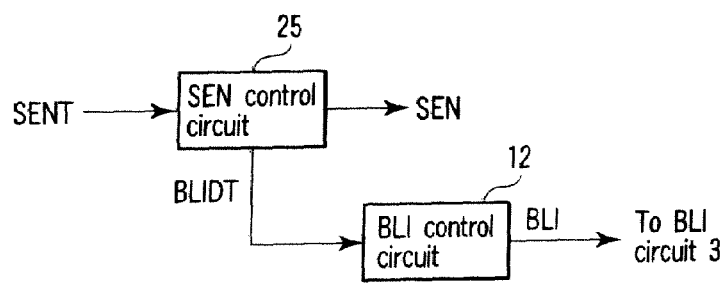
FIG. 31 is a block diagram showing another configuration example of a ninth embodiment.

With the configuration of FIG. 31, effects similar to the foregoing can be obtained. The SEN control circuit 25 receives a trigger signal SENT supplied from the outside to generate a signal BLIDT and a signal SEN. It is to be noted that for example, the SEN control circuit 25 is disposed in the control signal generation circuit 11. The BLI control circuit 12 receives the signal BLIDT to chance the signal BLI from VPP to VSS or an intermediate potential (e.g., VBLH, VBL, VPL, or VDD).

Figure 32:
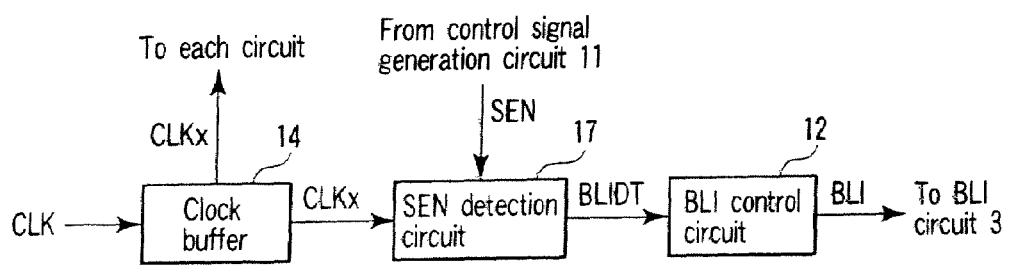
FIG. 32 is a block diagram showing another configuration example of the ninth embodiment.

If the signal SEN operates in synchronization with a clock, a configuration may be employed in which, upon rising (or falling) of a clock for activating the signal SEN or rising (or falling) of a subsequent clock, the signal BLI is changed from VPP to VSS or an intermediate potential (e.g., VBLH, VBL, VPL or VDD). FIG. 32 is a block diagram showing a main portion of the semiconductor memory device thus configured.

The semiconductor memory device comprises a clock buffer 14 for receiving a clock CLK input from the outside or a clock CLK generated in the chip. The clock buffer 14 supplies the input clock CLK to each circuit in the semiconductor memory device. The control signal generation circuit 11 operates in synchronization with a clock CLKx, and outputs a signal SEN based on the clock CLKx.

The SEN detection circuit 17 detects activation of the signal SEN, and inputs a trigger signal BLIDT to the BLI control circuit 12 upon rising/falling of a clock after the clock with which the signal SEN synchronizes to operate after the activation of the signal SEN. Also with this configuration of the semiconductor memory device, effects similar to the above can be obtained.

Figure 33:
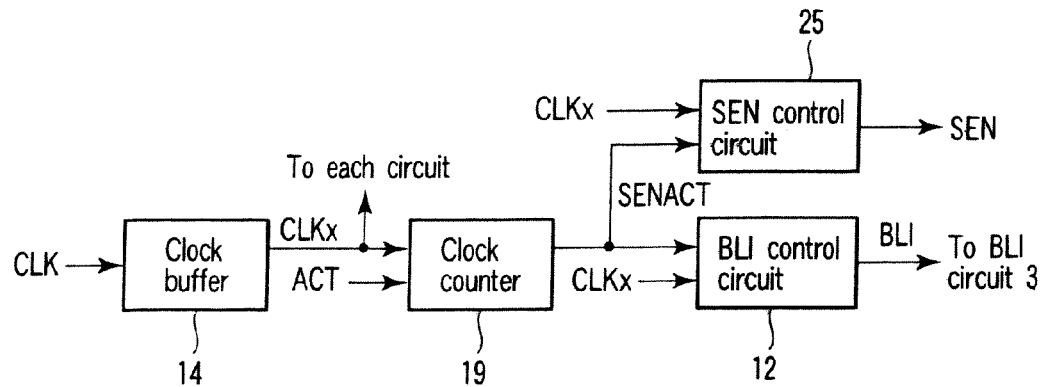
FIG. 33 is a block diagram showing another configuration example of the ninth embodiment.

FIG. 33 is a block diagram showing a main portion of the semiconductor memory device configured in such a manner that the signal BLI is changed from VPP to VSS or an intermediate potential (e.g., VBLH, VBL, VPL or VDD) upon reception of the clock with which activation timing of the signal SEN synchronizes.

The clock CLKx supplied from the clock buffer 14 and a signal ACT for determining activation timing of the word line WL are input to a clock counter 19. The clock counter 19 counts the number of clocks CLKx after activation of the signal ACT, and generates a pulse signal SENACT in synchronization with the clocks CLKx after the predetermined number of times. The signal SENACT is input to the SEN control circuit 25 in the control signal generation circuit 11 and the BLI control circuit 12.

Upon reception of the clock CLKx input after the activation of the signal SENACT, the SEN control circuit 25 activates the signal SEN. Upon reception of the clock CLKx input after the activation of the signal SENACT, the BLI control circuit 12 changes the signal BLI from VPP to VSS. At this time, if an internal delay in the BLI control circuit 12 is larger than that in the SEN control circuit 25, falling timing of the signal BLI is immediately after the activation of the signal SEN. With this configuration of the semiconductor memory device, effects similar to the above can be obtained.

Figure 34:
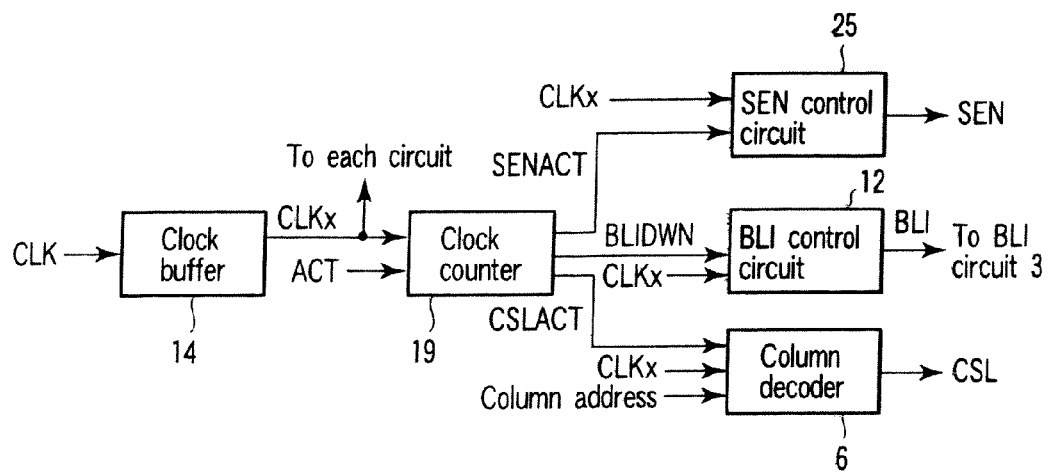
FIG. 34 is a block diagram showing a further another configuration example of the ninth embodiment.

FIG. 34 is a block diagram showing a main portion of the semiconductor memory device configured in such a manner that activation timing of the signal SEN synchronizes with rising (or falling) of a clock, rising of the signal CSL synchronizes with rising (or falling) of a clock, and the signal BLI is changed to VSS or an intermediate potential (e.g., VBLH, VBL, VPL or VDD) upon rising (or falling) of a clock between the synchronized clocks.

The clock counter 19 counts the number of clocks CLKx after activation of the signal ACT for determining activation timing of the word line WL, and generates a signal SENACT, a signal BLIDWN and a signal CSLACT in this order in synchronization with the clocks CLKx after the predetermined number of times. The SEN control circuit 25 activates the signal SEN upon reception of the clock CLKx input after activation of the signal SENACT. The BLI control circuit 12 changes the signal BLI to VSS or an intermediate potential (e.g., VBLH, VBL, VPL or VDD) upon reception of the clock CLKx input after activation of the signal BLIDWN.

A column decoder activates the signal CSL upon reception of the clock CLKx input after activation of the signal CSLACT. If there is a time difference of at least one cycle or more of the clock CLKx between the activation timing of the signal SEN synchronized with the clock CLKx and the activation timing of the signal CSL synchronized with the clock CLKx, with the aforementioned configuration, the signal BLI can be changed to VSS or an intermediate potential (e.g., VBLH, VBL, VPL or VDD) between the activation of the signal SEN and the activation of the signal CSL.

Tenth Embodiment

Figure 35:
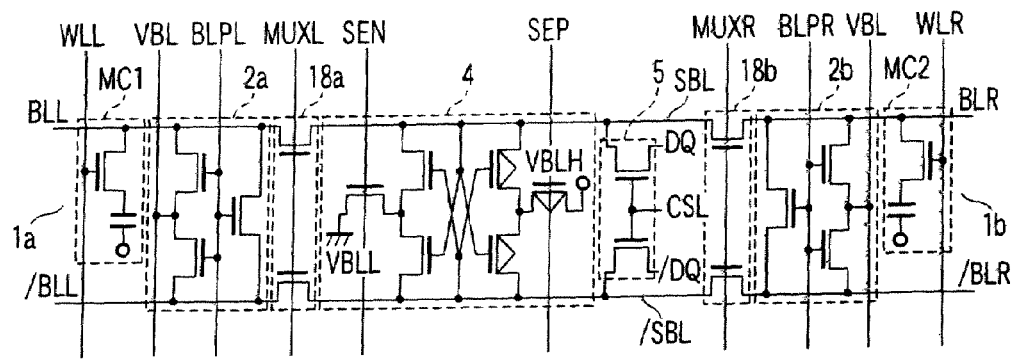
FIG. 35 is a circuit diagram showing a main portion of a semiconductor memory device according to a tenth embodiment of the invention.

FIG. 35 is a circuit diagram showing a main portion of a semiconductor memory device according to a tenth embodiment of the invention. The embodiment is a configuration example of a shared sense amplifier system in which one sense amplifier circuit 4 arranged in the center is shared by two memory cell arrays 1a, 1b.

The semiconductor memory device comprises a memory cell array 1a including a memory cell MC1 and a memory cell array 1b including a memory cell MC2. In the memory cell array 1a, a word line WLL and a bit line pair BLL, /BLL are arranged to intersect each other. In the memory cell array 1b, a word line WLR and a bit line pair BLR, /BLR are arranged to intersect each other.

A precharge circuit 2a is connected to the bit line pair BLL, /BLL. A precharge circuit 2b is connected to the bit line pair BLR, /BLR. A sense amplifier bit line pair SBL, /SBL is arranged between the memory cell arrays 1a and 1b. A sense amplifier circuit 4 and a DQ gate 5 are connected to the sense amplifier bit line pair SBL, /SBL.

In the semiconductor memory device, cell array selection circuits 18a, 18b are arranged for selectively connecting/disconnecting the memory cell arrays 1a and 1b in both sides of the sense amplifier circuit 4. Each cell array selection circuits 18a, 18b comprises two NMOS transistors. Cell array selection signals MUXL, MUXR are respectively input to the cell array selection circuits 18a, 18b. The cell array selection signals MUXL, MUXR are generated by a control signal generation circuit 11.

Figure 36:
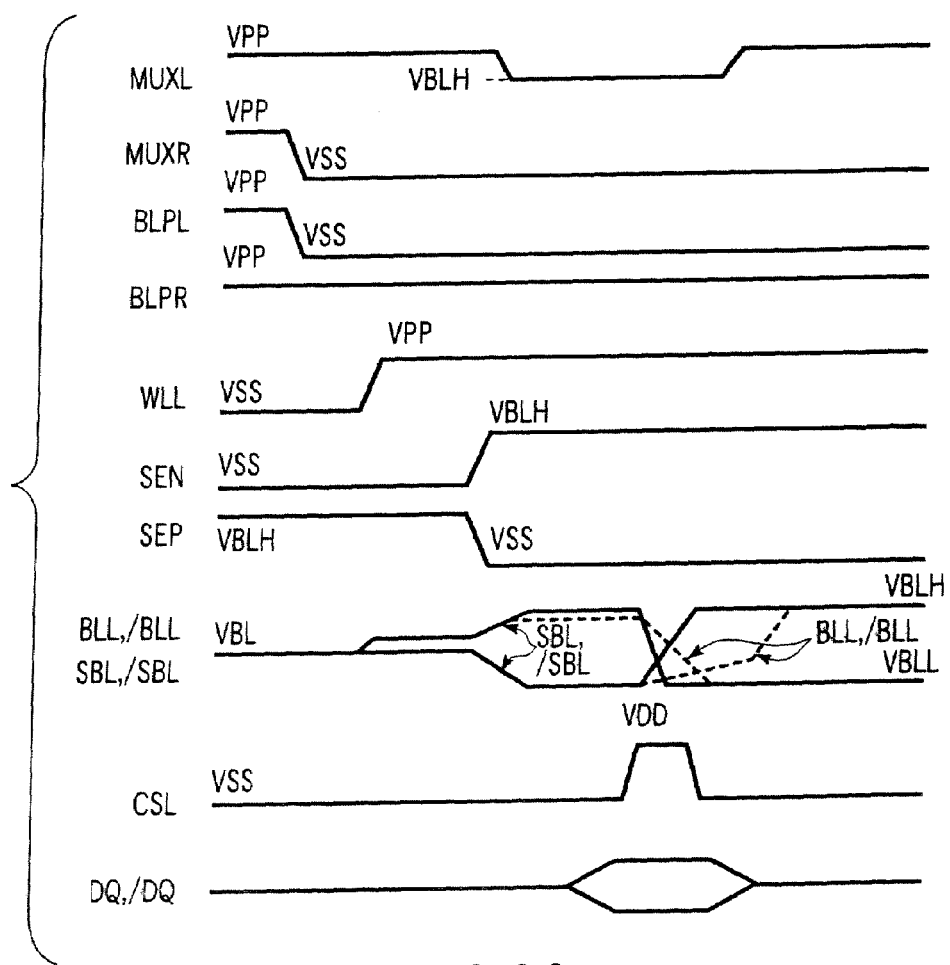
FIG. 36 is a timing chart of the semiconductor memory device shown in FIG. 35.

In the semiconductor memory device thus configured, bit line isolation control can be performed by using the cell array selection circuits 18a, 18b. FIG. 36 is a timing chart of the semiconductor memory device shown in FIG. 35.

Description will be made by taking an example in which data is written to the left memory cell array 1a. The control signal generation circuit 11 changes the cell array selection signal MUXR from VPP to VSS. Accordingly, the right memory cell array 1b is electrically cut off from the sense amplifier circuit 4, and a state of selecting the left memory cell array 1a is set.

A signal BLPL supplied to the precharge circuit 2a is changed from VPP to VSS. Thus, precharging of the bit line pair BLL, /BLL is released. Upon a change of the word line WLL from VSS to VPP, data stored in the memory cell array 1a is read to the bit line pair BLL, /BLL.

Next, a signal SEN is changed from VSS to VBLH, and a signal SEP is changed from VBLH to VSS. Accordingly, the data read to the bit line pair BLL, /BLL is amplified, and the bit line of the high-level side changes toward a voltage VBLH while the bit line of the low-level side changes toward a voltage VBLL.

Next, in a period immediately after activation of the sense amplifier circuit to writing data to the bit line pair SBL, /SBL, the control signal generation circuit 11 lowers a potential of the signal MUXL to an intermediate potential (e.g., VBLH, VBL, VPL or VDD) or VSS lower than VPP.

If the potential of the signal MUXL is lowered to the intermediate potential (e.g., VBLH, VBL, VPL or VDD), the cell array selection circuit 18a is set in a higher resistance state compared with a conductive state, and the bit line pair BLL, /BLL and the bit line pair SBL, /SBL are isolated from each other by high resistance. Then, when a signal CSL is changed from VSS to VDD, data of the bit ling pair SBL, /SBL is reversed by data transferred from a data line pair DQ, /DQ, and the reversed data is held in the sense amplifier circuit 4.

Then, a potential change of the bit line BLL (or /BLL) to which low-level writing is carried out follows the bit line SBL (or /SBL) to a certain extent. However, a potential change of the bit line /BLL (or BLL) to which high-level writing is carried out does not necessarily follow a potential change of the bit line /SBL (or SBL). This is because a potential of the bit line /BLL (or BLL) to which the high-level writing is carried out rises only to a level obtained by subtracting (a threshold voltage of a transistor constituting the cell array selection circuit 18a) from (the potential of the signal MUXL).

The control signal generation circuit 11 returns the potential of the signal MUXL to the VPP immediately after the data of the bit line pair SBL, /SBL is reversed. Accordingly, the bit line pair BLL, /BLL and the bit line pair SBL, /SBL are connected to each other by low resistance, and the potential of the bit line pair BLL, /BLL rapidly changes toward the potential of the bit line pair SBL, /SBL.

When the potential of the signal MUXL is lowered to the VSS, the bit line pair BLL, /BLL and the bit line pair SBL, /SBL are electrically cut off from each other. After the potential of the signal MUXL falls to the VSS, the potential of the bit line pair BLL, /BLL is not changed. Then, when the signal CSL is changed from the VSS to the VDD, the data of the bit line pair SBL, /SBL is reversed by the data transferred from the data line pair DQ, /DQ. However, the potential of the bit line pair BLL, /BLL is not changed at all.

The control signal generation circuit 11 returns the potential of the signal MUXL to the VPP immediately after the data of the bit line pair SBL, /SBL is reversed. Accordingly, the bit line pair BLL, /BLL and the bit line pair SBL, /SBL are connected to each other by low resistance, and the potential of the bit line pair BLL, /BLL rapidly changes toward the potential of the bit line pair SBL, /SBL.

As described above, in the configuration of the semiconductor memory device that employs the shared sense amplifier system, the bit line isolation control can be performed by using the cell array selection signals MUXL, MUXR.

Thus, even when the operation voltage, e.g., VDD, of the DQ gate 5 is set to a low voltage lower than VBLH which is an operation voltage of the sense amplifier circuit, it is possible to surely transfer the data of the data line DQ to the bit line SBL. Accordingly, a low voltage of the peripheral circuit can be flexibly dealt with.

High-speed writing is enabled even without setting a large transistor size of the DQ gate 5, i.e., without setting a large chip size. Moreover, it is not necessary to make the sizes of the SA pair transistor and the SA driver constituting the sense amplifier circuit 4 small. Thus, it is possible to suppress a fall of the voltage level of the write data to the memory cell arrays 1a, 1b.

It is not necessary to dispose any new BLI circuit 3. Accordingly, a circuit size can be made small.

Furthermore, by disposing the plurality of cell array selection signals MUXL, MUXR, it is possible to realize a configuration of the embodiment in which a plurality of bit line isolation signals BLI are set.

Eleventh Embodiment

Figure 37:
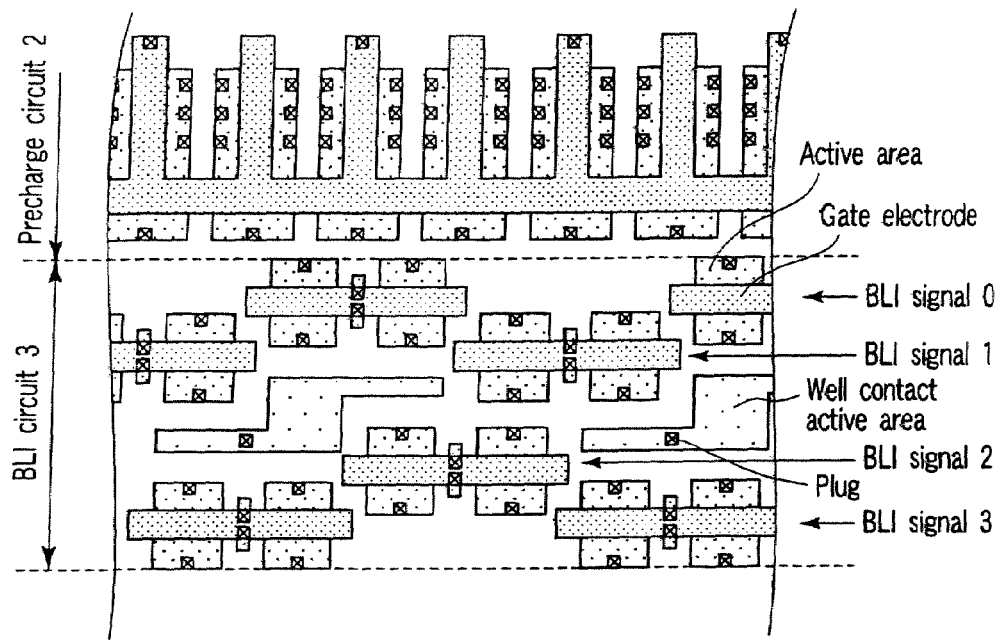
FIG. 37 is a layout diagram of a BLI circuit 3 when there is a plurality of signals BLI.

FIG. 37 is a layout diagram of a BLI circuit 3 when there is a plurality of signals BLI. It is to be noted that for example, an NMOS transistor is used as a variable resistance element constituting the BLI circuit 3. A case in which four bit line isolation signals BLI are provided is shown.

On a semiconductor substrate, a plurality of active areas constituting an NMOS transistor is formed. On the semiconductor substrate, a well contact active area is formed for supplying a power supply voltage to the substrate. An element isolation area is formed in the semiconductor substrate around the active areas and the well contact active area. On the active area, a gate electrode is disposed via a gate insulating film (not shown). Additionally, a plurality of plugs that is contacts with an upper wiring is arranged in the active area and the gate electrode.

When there is a plurality of signals BLI, there is a fear that an area of the BLI circuit 3 will increase compared with the case of only one signal BLI. Thus, according to the embodiment, normally, the well contact active area formed outside the area in which the NMOS transistor is formed is formed in the BLI circuit 3. That is, the well contact active area is formed in a space generated inside two lines (broken line of FIG. 37) of an outermost periphery of the active area constituting the NMOS transistor of the BLI circuit 3. Accordingly, the increased part of the area of the BLI circuit 3 by disposing the plurality of signals BLI can be absorbed by the decreased part of the well contact active area.

Each of the foregoing embodiments is described by using the transistor for the variable resistance element. However, not limited to the transistor, any element whose resistance value is variable can provide effects similar to those of the foregoing embodiments.

The embodiments are described by using the DRAM for the memory cell MC. Not limited to the DRAM, however, for example, such as a static random access memory (SRAM) or a flash memory, if it is the thing of a configuration of amplifying and latching data transmitted from the memory cell to a complementary bit line pair by an operational amplifier (sense amplifier), it can carry out similarly.

Twelfth Embodiment

Figure 38:
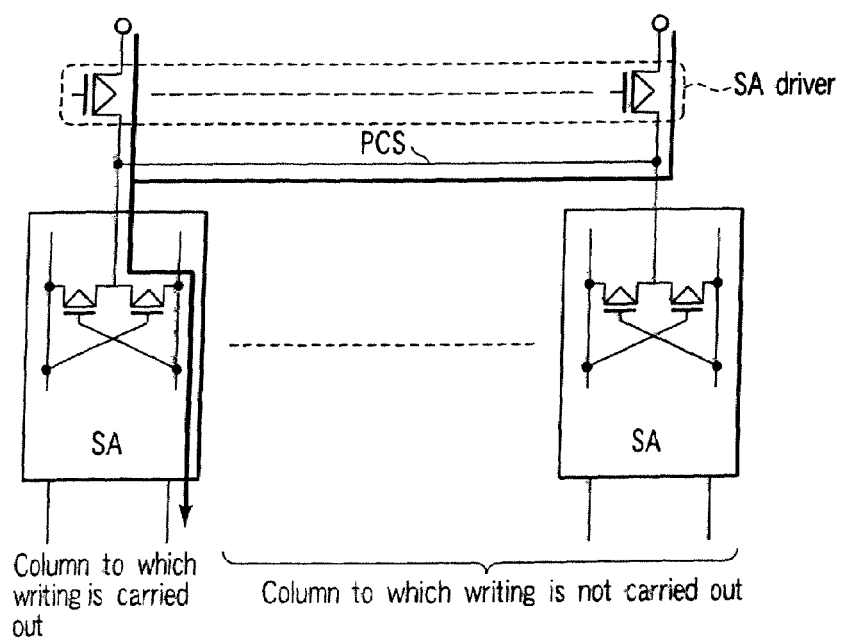
FIG. 38 is a circuit diagram showing an example of a semiconductor memory device in which all sense amplifier circuits in an SA bank are connected to a common source line.

As described above, when the power supply voltage of the memory cell portion is higher than the potential amplitude of the data line and the potential amplitude of the DQ gate, the writing operation becomes difficult. Further, when the sense amplifier circuits of all the columns in the SA bank are connected to the same common source line, if writing is performed in a certain column only in the SA bank, as shown in FIG. 38, efficiency of all the SA drivers connected to the same common source line concentrates in the column to which the writing is carried out, making the writing operation more difficult.

To facilitate the writing operation, for example, a size of the DQ gate may be set large. In this case, however, a size of the sense amplifier becomes large. The large size of the DQ gate causes a stability (spectacle characteristics (MEGANE-TOKUSEI)) problem of the sense amplifier.

Furthermore, the size of a PSA pair transistor or a PSA driver may be made small. In this case, however, reading performance (refreshing performance) will be deteriorated.

Figure 39:
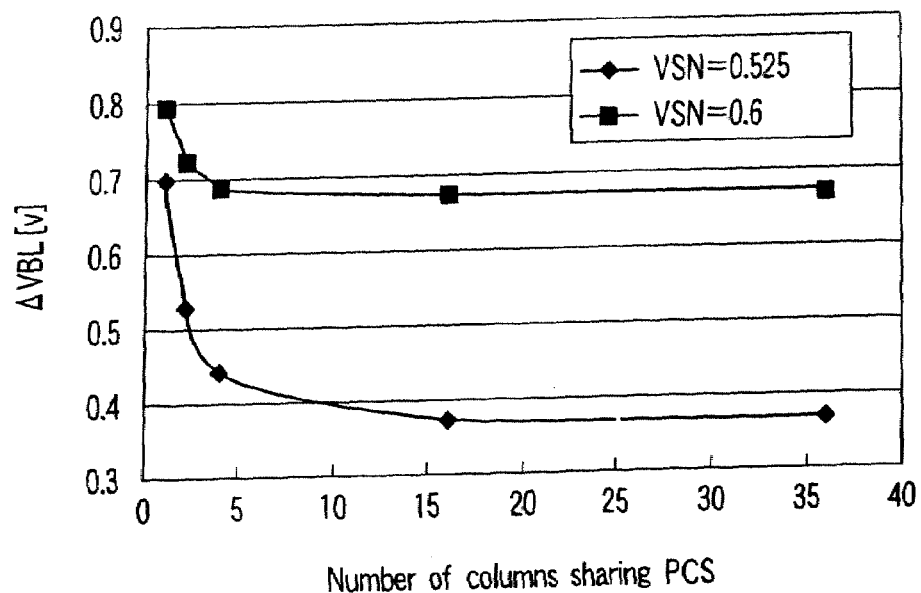
FIG. 39 is a graph showing a relation between the number of columns connected to a common source line PCS and a potential difference ($\Delta$VBL) between a bit line pair BL, /BL when a column selection line CSL is activated.
Figure 40:
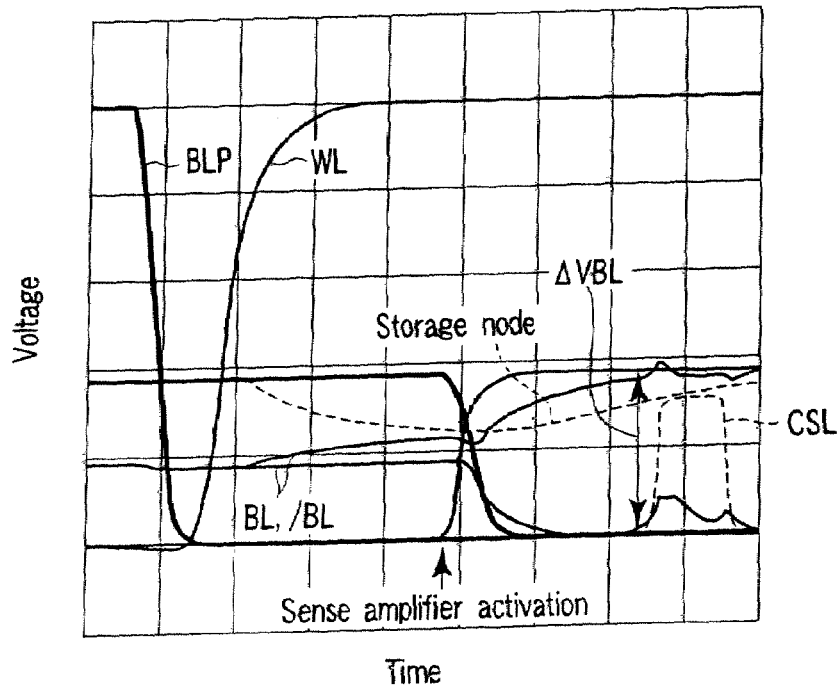
FIG. 40 is a graph showing the potential difference ($\Delta$VBL) between the bit line pair BL, /BL when the column selection line CSL is activated.

FIG. 39 is a graph showing the relation between the number of columns (proportional to the number of PSA drivers connected to PCS) connected to a PSA common source line (PCS) and a potential difference ($\Delta$VBL) between the bit line pair BL, /BL in the time of a column selection signal CSL being activated shown in FIG. 40. Referring to FIG. 39, an initial potential VSN ("VSB=0.525V" and "VSN=0.6V") of a storage node of the memory cell immediately before activation of the word line WL is taken as a parameter.

If the number of columns connected to the PCS is increased, for example, a writing operation becomes difficult when the number of columns to which writing is simultaneously carried out is small (especially in the case of writing to one column) (i.e., a writable minimum value of a pulse width of CSL becomes large). Thus, in FIG. 39, by setting a small PSA transistor size, writing performance is made equal (writable minimum values of pulse width of CSL are equal).

Furthermore, if many columns are connected to the common source line, since the latched bit line pair BL, /BL of all the columns is connected to the common source line (NCS or PCS) via the NSA transistor or the PSA transistor, a potential of the common source line is difficult to change (difficult of float) from a power supply potential (VBLH, VBLL). Thus, to facilitate the writing operation, the PSA transistor size or the like must be made smaller.

As shown in FIG. 39, when the number of columns connected to the PCS is increased (=PSA transistor size is made small), a potential difference $\Delta$VBL in the time of the CSL being activated becomes small. This tendency is more conspicuous as the initial potential VSN of the storage node is smaller (conditions of difficult reading).

That is, when the number of columns (number of SA drivers) connected to the PCS is increased, reading performance is deteriorated if sizes of the PSA transistor and the PSA driver are made small to secure writing performance. Accordingly, it is impossible to design a sense amplifier which simultaneously satisfies the requests of writing and reading operations. The above holds true for the NSA transistor, the NSA driver and the NSA common source line (NCS). However, influences are larger in the case of the PSA transistor, the PSA driver and the PCS.

In other words, to deal with the writing problem while satisfying the reading request, it is effective to make an efficiency difference of the SA driver between the time of reading and the time of writing small. That is, regarding the plurality of columns connected to one common source line, it is only necessary to reduce a difference between the total number of columns (sense amplifier) and the number of columns to which writing is carried out during writing.

Specifically, conventionally, the sense amplifier circuits of all the columns in the SA bank are connected to one common source line in the SA bank. According to the invention, however, a plurality of common source lines are disposed in the SA bank, and the number of columns connected to each common source line is set smaller than the total number of columns in the SA bank. SA drivers of optimal efficiency are arranged in accordance with the number of columns connected to each common source line. The above is more effective when implemented for the PCS.

Incidentally, when a threshold voltage of the NSA transistor or the PSA transistor is lowered, due to a leakage current from the NSA transistor or the PSA transistor, a signal on the bit line is reduced when data is output from the memory cell.

Figure 41:
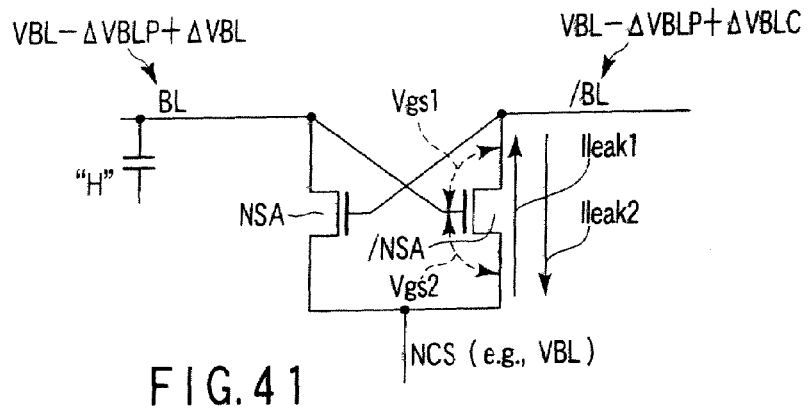
FIG. 41 is a diagram showing an influence of a leakage current of a transistor constituting a sense amplifier circuit NSA.

FIG. 41 shows an influence of a leakage current of the NSA transistor by taking an example in which "H" data is read from the memory cell. Potentials of the bit lines BL, /BL respectively become "VBL−$\Delta$VBLP+$\Delta$VBL", "VBL−$\Delta$VBLP+$\Delta$VBLC" before activation of the sense amplifier circuit in which VBL is a precharge potential of the bit line, $\Delta$VBLP is a potential change of the bit line pair caused by falling noise of a bit line precharge signal BLP when precharging of the bit line is released, $\Delta$VBL is a potential change of the bit line determined by a charge amount read from the memory cell, and $\Delta$VBLC is a potential change of the bit line of the "L" side caused by coupling noise between the bit lines BL and /BL.

Incidentally, the $\Delta$VBLC becomes large with the increase in the charge amount read from the memory cell. Thus, for example, if a potential of the common source line NCS is VBL, a relation between the potential (VBL) of the common source line NCS and the bit line potential (VBL−$\Delta$VBLP+$\Delta$VBLC) of the bit line /BL of the "L" side is changed by a size of the $\Delta$VBLC, i.e., the charge amount read from the memory cell.

In the case of a small $\Delta$VBLC, the potential of the common source line is higher than that of the bit line /BL. Accordingly, a potential between the gate and the source of the sense amplifier transistor /NSA becomes Vgs1, generating a leakage current of Ileak1. Then, by this leakage current, the potential of the bit line /BL rises, reducing a signal amount between the bit lines BL and /BL.

On the other hand, in the case of a large $\Delta$VBLC, the potential of the common source line is lower than that of the bit line /BL. Thus, a potential between the gate and the source of the sense amplifier transistor /NSA becomes Vgs2, generating a leakage current of 1leak2. Then, the potential of the common source line NCS may rise by this leakage current.

The potential of the bit line /BL may fall conversely. However, at least a signal amount between the bit lines BL and /BL is not reduced.

Figure 42:
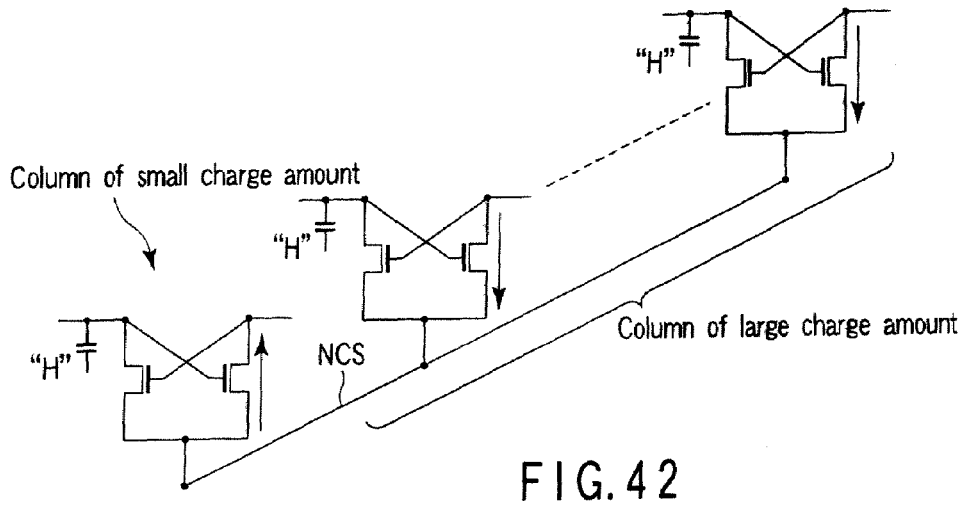
FIG. 42 is a diagram showing a reduction in signal amount between the bit line pair BL and /BL in a column of a small charge amount.

If the number of columns connected to the common source line is large, charge amounts read from the memory cell may be large in many columns while charge amounts may be small in a few columns. That is, this is a situation in which charge holding characteristics of the memory cell connected to a few columns are bad (due to large cell leakage or the like). Then, a potential of the common source line NCS rises by a leakage current of the bit line of the "L" side of many columns of the large charge amounts. In the few columns of the small charge amounts, a leakage current from the common source line NCS to which the potential rose to the bit line of the "L" side occurs, reducing a signal amount between the bit lines BL and /BL as a result (FIG. 42).

That is, in such a situation, the potential of the common source line NCS rises more easily as the number of columns connected to the common source line NCS is larger, and the signal amount between the bit lines BL and /BL reduces more easily. Thus, the disposition of the plurality of common source lines in the SA bank and the setting of the number of columns connected to each common source line smaller than the total number of columns in the SA bank is effective countermeasures to a reduction in the signal amount on the bit line.

Figure 43:
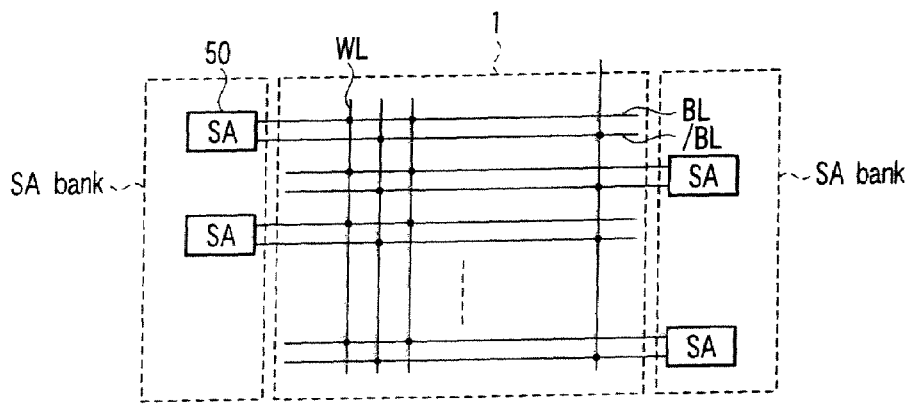
FIG. 43 is a schematic diagram showing a semiconductor memory device according to a twelfth embodiment of the invention.

FIG. 43 is a schematic diagram showing a configuration of the semiconductor memory device according to the twelfth embodiment of the invention. Referring to FIG. 43, a memory cell array 1 in which memory cells MC are arranged in a matrix form is disposed. In the memory cell array 1, a plurality of word lines WL and a plurality of bit line pairs BL, /BL are arranged to intersect each other, and the memory cells are arranged at the intersections (black circles in FIG. 43). A sense amplifier (SA) 50 is connected to the bit line pair BL, /BL.

For example, the SA's 50 are alternately arranged in both sides of the memory cell array 1. Needless to say, the SA 50 may be arranged only in one side of the memory cell array 1.

Figure 44:
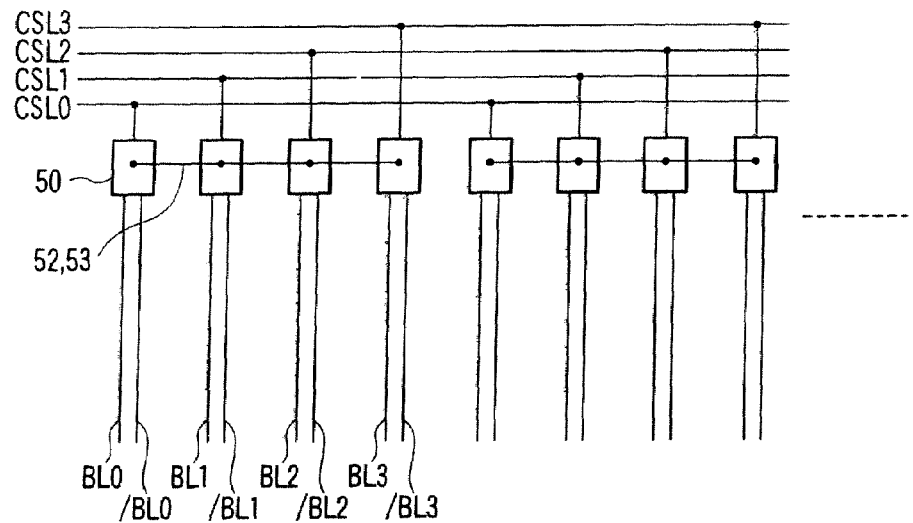
FIG. 44 is a schematic diagram showing a configuration of a sense amplifier bank shown in FIG. 43.

FIG. 44 is a schematic diagram showing a configuration of a SA bank shown in FIG. 43. The embodiment will be described by taking an example in which an SA bank comprises 512 columns, and every 128 columns thereof are selected by the same column selection line CSL (i.e., simultaneously written). It is to be noted that in FIG. 44, the SA 50 is arranged in one side for convenience of explanation. This is not important for the theme of the invention, and needles to say, the SA's 50 may be arranged in both sides.

As shown in FIG. 44, four SA's 50 are respectively connected to four column selection lines CSL0 to CSL3. Further, the four SA's 50 are connected to the same PCS 53 and the same NCS 52.

Additionally, the four SA's 50 connected to the same PCS 53 and the same NCS 52 are selected by different column selection lines CSL.

Figure 45:
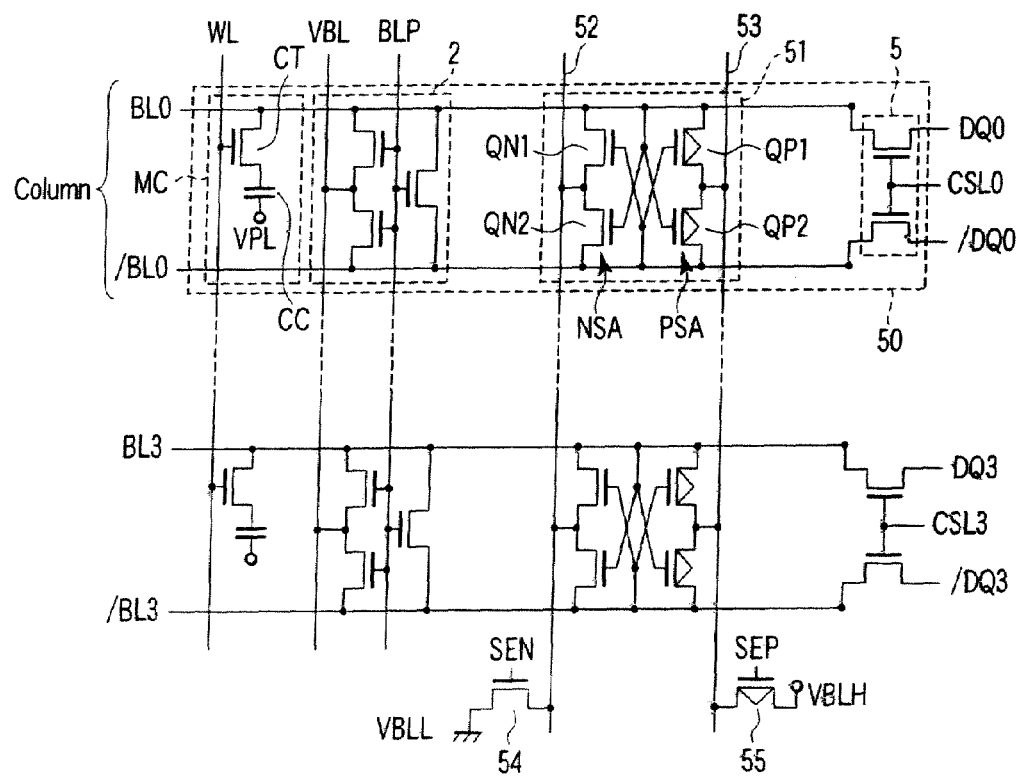
FIG. 45 is a circuit diagram showing a configuration of columns connected to the same PCS 53 and the same NCS 52.

FIG. 45 is a circuit diagram showing a configuration of columns connected to the same PCS 53 and the same NCS 52. A memory cell MC is configured by serially connecting a cell transistor CT and a capacitor CC. A reference voltage VPL is supplied to one terminal of the memory cell MC, and the other terminal is connected to a bit line BL.

A sense amplifier circuit 51 comprises an N-channel sense amplifier (NSA) and a P-channel sense amplifier (PSA). The NSA comprises two N-channel MOS transistors QN1, QN2.

A drain of the transistor QN1 is connected to a bit line BL0. A gate of the transistor QN1 is connected to a bit line /BL0. A source of the transistor QN1 is connected to an NSA common source line (NCS) 52.

A drain of the transistor QN2 is connected to the bit line /BL0. A gate of the transistor QN2 is connected to the bit line BL0. A source of the transistor QN2 is connected to the NCS 52.

The PSA comprises two P-channel MOS transistors QP1, QP2. A drain of the transistor QP1 is connected to the bit line BL0. A gate of the transistor QP1 is connected to the bit line /BL0. A source of the transistor QP1 is connected to a PSA common source line (PCS) 53.

A drain of the transistor QP2 is connected to the bit line /BL0. A gate of the transistor QP2 is connected to the bit line BL0. A source of the transistor QP2 is connected to the PCS 53.

The same applies to configuration of other columns. The bit line pair BL0, /BL0 is selected by a column selection line CSL0. The bit line pair BL1, /BL1 is selected by a column selection line CSL1. The bit line pair BL2, /BL2 is selected by a column selection line CSL2. The bit line pair BL3, /BL3 is selected by a column selection line CSL3.

An NSA driver 54 is connected to the NCS 52. The NSA driver 54 comprises an N-channel MOS transistor. A drain of the NSA driver 54 is connected to the NCS 52. A sense amplifier activation signal SEN is supplied to a gate of the NSA driver 54. A low-level bit line voltage VBLL is supplied to a source of the NSA driver 54.

A PSA driver 55 is connected to the PCS 53. The PSA driver 55 comprises a P-channel MOS transistor. A drain of the PSA driver 55 is connected to the PCS 53. A sense amplifier activation signal SEP is supplied to a gate of the PSA driver 55. A high-level bit line voltage VBLH is supplied to a source of the PSA driver 55.

In the semiconductor memory device thus configured, the number of columns connected to each common source line can be set smaller than the total number of columns in the SA bank. Accordingly, even when an operation voltage of the DQ gate 5 is lower than VBLH as an operation voltage of the sense amplifier circuit 51 and a writing operation is difficult, it is not necessary to reduce a PSA size, and the writing operation can be facilitated while satisfying a request of a reading operation.

If a plurality of columns to which writing is simultaneously carried out are connected to one and the same common source line, SA driver efficiency per a column to which writing is actually carried out (column to which rewriting is carried out by reverse data) is changed depending on data patterns to be written (number of columns to which rewriting is carried out by reverse data). That is, when the number of columns to which rewriting is carried out by the reverse data increase, SA driver efficiency per a column to which writing is carried out becomes weak, deteriorating writing characteristics. However, if the columns connected to the common source line are only those to which writing is not simultaneously carried out, i.e., those selected by different column selection lines CSL as described above, it is possible to maximize the SA driver efficiency per a column to which writing is carried out without any influence of the data patterns. Thus, sense amplifier designing can be facilitated.

In the aforementioned example, the number of columns selected by one column selection line CSL and the number of common source lines are equal, i.e., 128. However, the number of common source lines can be increased. For example, the number of common source lines could be 256. In the case of 256, every two columns selected by different column selection lines are connected to one and the same common source line, making it possible to further reduce a difference in SA driver efficiency between reading and writing.

If the writing operation is difficult because of a voltage relation, by reducing the number of columns connected to the PCS as described above, it is not necessary to reduce the PSA size, and the writing operation can be facilitated while satisfying a request of the reading operation. However, use of the large size PSA without reducing the PSA size means an increase in layout size of the SA bank.

Thus, in actual designing, whether the number of columns connected to the PCS is reduced or not to use a large size PSA must be selected in accordance with a situation of each time. Except for such a case where the writing operation is difficult because of a voltage relation or the like or it becomes impossible to satisfy the request of the reading operation by using the small size PSA, it may be advisable to increase the number of columns connected to the PCS, to reduce the PSA size, thereby reducing the layout size of the SA bank.

Thirteenth Embodiment

A thirteenth embodiment employs a configuration in which a plurality of columns connected to a common source line are contained in column redundancy replacement units in an SA bank.

Figure 46:
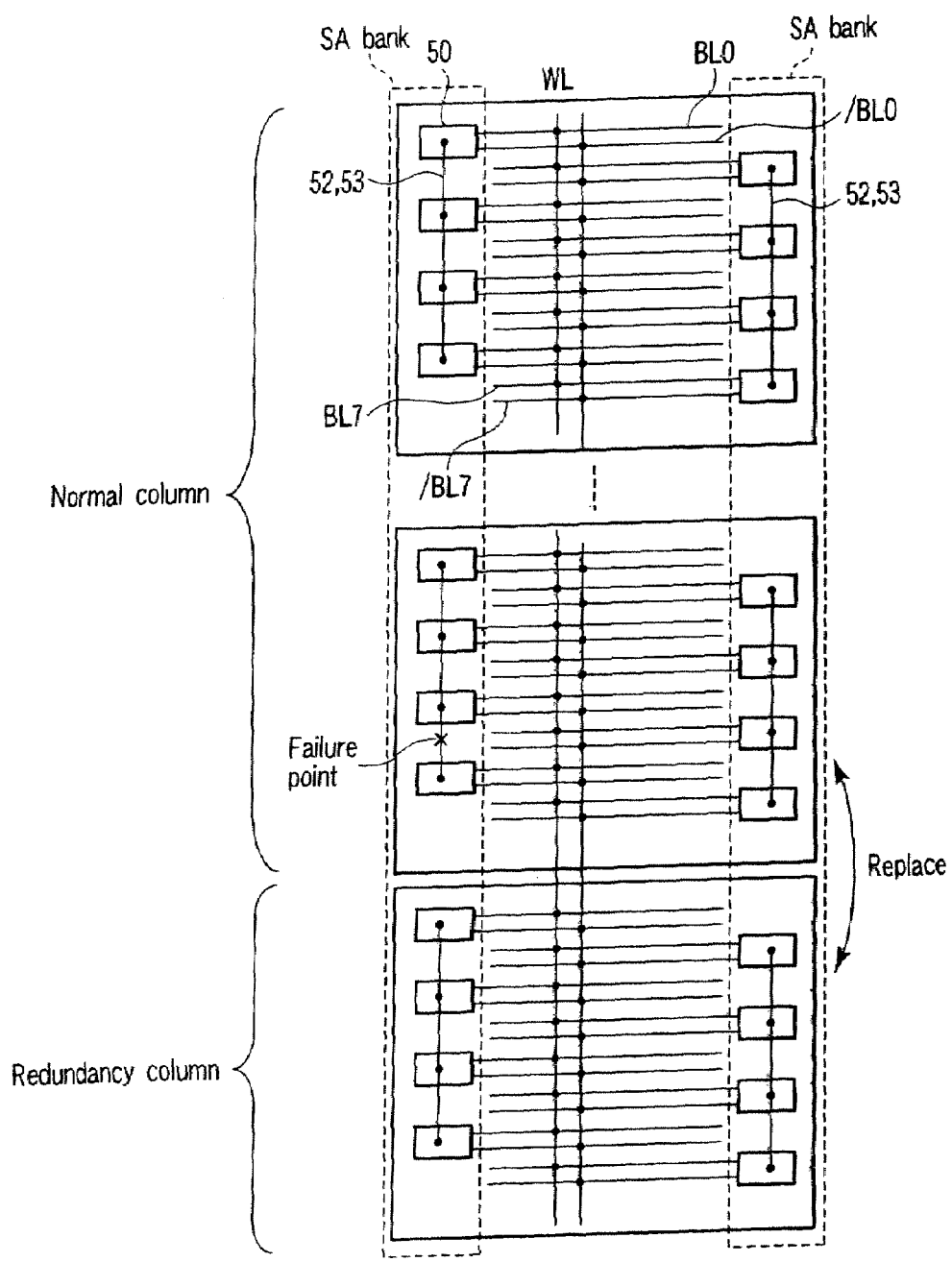
FIG. 46 is a schematic diagram showing a configuration of a semiconductor memory device according to a thirteenth embodiment of the invention.

FIG. 46 is a schematic diagram showing a configuration of a semiconductor memory device according to the thirteenth embodiment of the invention. As an example, a case in which the semiconductor memory device comprises one redundancy circuit for each SA bank will be described.

In the semiconductor memory device shown in FIG. 46, SA's 50 connected to each column in a memory cell array are alternately arranged in both sides of the memory cell array. For example, redundancy replacement units are eight continuous columns. In this case, redundancy replacement units in one side are four columns.

An NCS 52 and a PCS 53 are disposed for every four SA's 50 continuously arranged in one side among the eight columns which are redundancy replacement units. In other words, the four SA's 50 are connected to the same NCS 52 and the same PCS 53.

An NSA driver 54 is connected to each NCS 52 (not shown). A PSA driver 55 is connected to each PCS 53 (not shown).

In the semiconductor device thus configured, the number of columns connected to each common source line can be reduced. Accordingly, effects similar to those of the twelfth embodiment can be obtained. Moreover, the embodiment provides the following effects.

One failure or another may occur in the common source line. Junction leakage caused by a crystal defect generated in an active area (i.e., diffusion layer) connected to the common source line is one of such examples, and the common source line may be cut in the middle.

When such a common source line failure occurs, the columns connected to the common source line are all affected by the failure. Thus, by employing a configuration in which a plurality of columns connected to one and the same common source line are contained in column redundancy replacement units in an SA bank as in the case of the embodiment, even if a failure occurs in the common source line, this problem can be solved by using a redundancy circuit.

It is to be noted that the SA may be arranged only in one side of the memory cell array. In this case, redundancy replacement units, ex., eight columns, are connected to one and the same common source line. Thus, effects similar to the above can be obtained.

Fourteenth Embodiment

According to a fourteenth embodiment, two sense amplifiers included in two adjacent columns in an SA bank are connected to each common source line.

Figure 47:
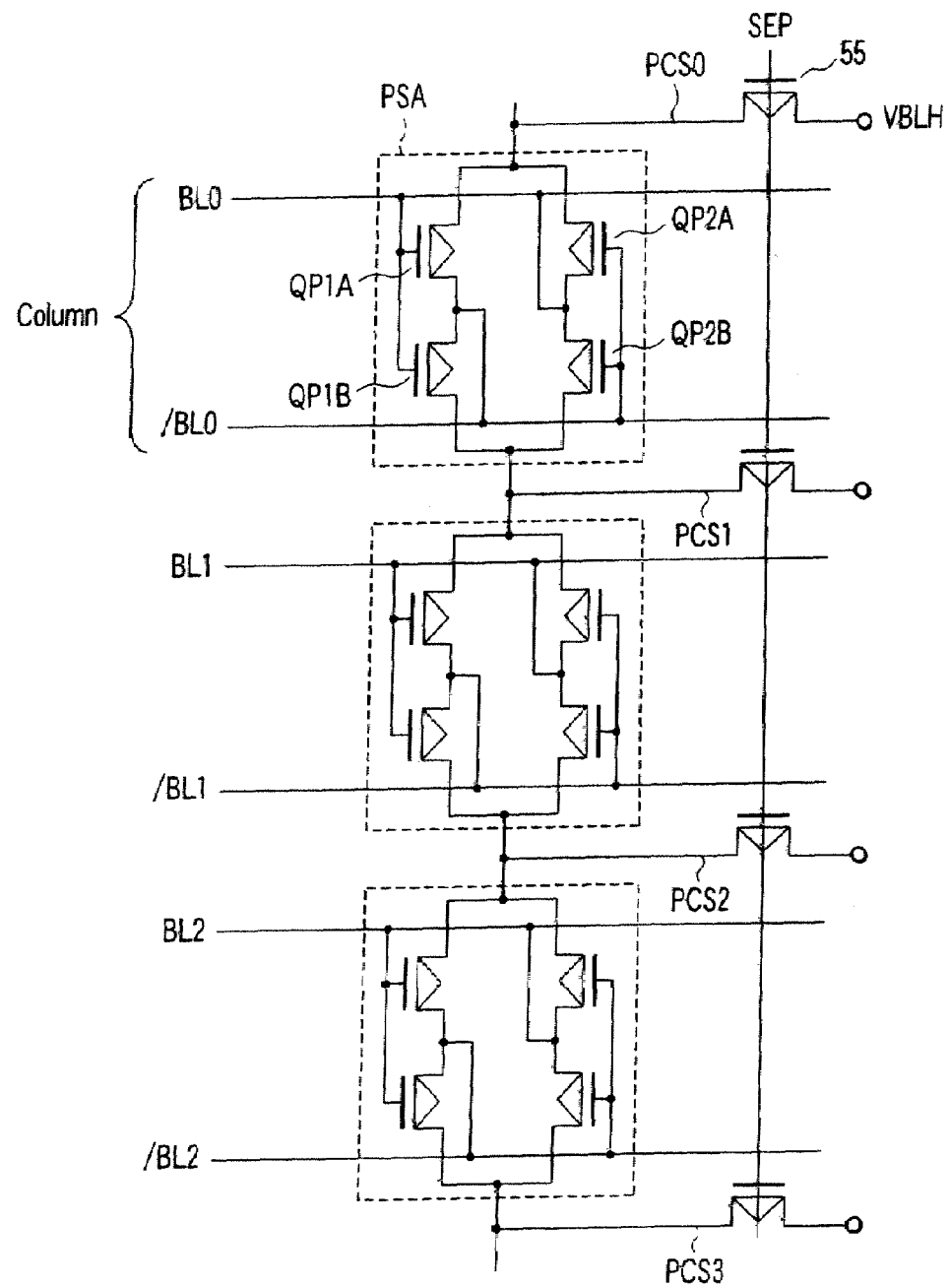
FIG. 47 is a circuit diagram showing a configuration of an SA bank disposed in a semiconductor memory device according to a fourteenth embodiment of the invention.
Figure 48:
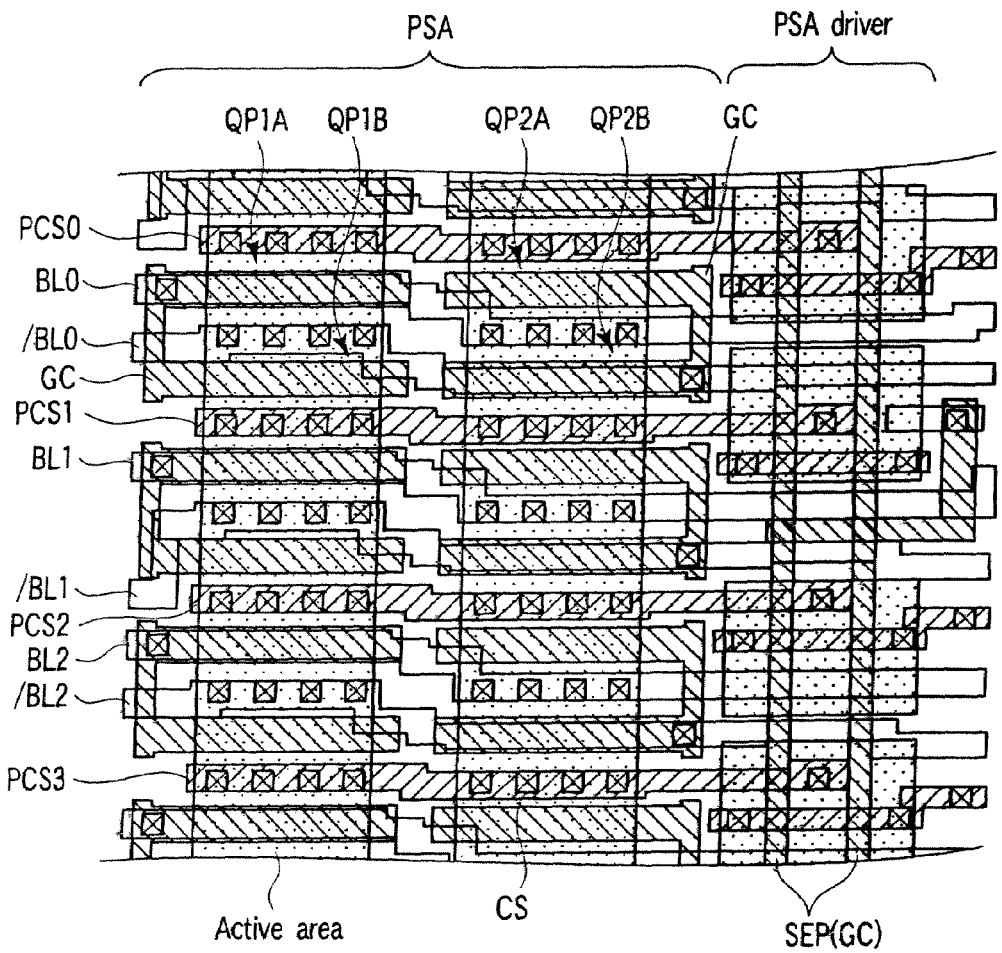
FIG. 48 is a layout diagram showing the configuration of the SA bank shown in FIG. 47.

FIG. 47 is a circuit diagram showing a part of a configuration of an SA bank disposed in a semiconductor memory device of the fourteenth embodiment of the invention. FIG. 48 is a layout diagram showing a part of the configuration of the SA bank shown in FIG. 47.

An active area shown in FIG. 48 is an area for forming a transistor in a substrate isolated by element isolation. Specifically, the active area is included in a well area in which low-concentration impurities are diffused. The active area includes diffusion layers in which high-concentration impurities are diffused in the well area and both sides of a gate. The diffusion layers function as a source and a drain of the transistor.

A P-channel sense amplifier (PSA) comprises four P-channel MOS transistors QP1A, QP1B, QP2A and QP2B. The two P-channel MOS transistors QP1A, QP1B correspond to the P-channel MOS transistor QP2 shown in FIG. 45. The two P-channel MOS transistors QP2A, QP2B correspond to the P-channel MOS transistor QP1 shown in FIG. 45.

That is, according to the embodiment, each transistor of a pair transistor constituting a sense amplifier circuit is drawn by two gate conductors (GC) in layout. Further, nodes of a bit line side of a SA transistor are arranged in the two GC's, and two common source lines arranged outside the two GC's are shared by common source lines of columns in both adjacent sides in the SA bank. One SA driver is connected to the common source line (FIG. 48).

FIGS. 47 and 48 show the PSA and the PCS as an example, and the NSA and the NCS are omitted. However, the NSA and the NCS may be configured as in the case of the PSA and the PCS.

In the semiconductor memory device thus configured, the number of columns connected to one common source line can be dramatically reduced. Thus, effects similar to those of the twelfth embodiment can be obtained.

According to the embodiment, two PCS's are connected to the sense amplifier circuit of each column. However, since the two PCS's are not connected to each other, paying attention to one PCS, the number of connected columns is very small, i.e., only two columns. Thus, a PSA driver efficiency difference for each column is very small between reading and writing.

Furthermore, each transistor of the pair transistor constituting the PSA comprises two gate electrodes (GC). Accordingly, a layout area is very small (normally one GC, and thus a transistor width is very large).

Paying attention to a layout of the active areas (i.e., diffusion layers), a channel portion (overlapped portion of GC and active area) and a layout of a contact (CS) of the two transistors making a pair, arrangement of BL0 (channel portion), /BL0 (CS), PCS0 (CS), and PCS1 (CS) of one transistor and arrangement of /BL0 (channel portion), BL0 (CS), PCS0 (CS), and PCS1 (CS) of the other transistor are in a state of advancing-side-by-side symmetry.

That is, an influence of mask mismatching or the like in each step of a process similarly appears in the pair transistor, making it possible to limit a difference of device characteristics caused by an unbalance or the like of a threshold voltage Vt of the pair transistor to a minimum. Thus, it is possible to realize a sense amplifier of high efficiency in amplifying a very small potential difference.

Incidentally, the SA driver may be arranged in a sense amplifier control circuit or a WL stitch area (in the case of a segmented WL (a layered WL), area in which the SA bank and a sub WL driver area intersect each other), or in a free space formed in the SA bank by setting an arrangement pitch of a layout repetition unit in the SA bank smaller than a pitch between bit lines (Published Japanese Patent No. 3202580 and Jpn. Pat. Appln. KOKAI Publication No. 2002-208277). Then, there will be almost no influence of a transistor size of the SA driver on a size of the entire amplifier circuit (i.e., width of one SA bank).

However, while a large size SA driver can be arranged since the SA driver is arranged on the side of each of the NSA and the PSA (refer to FIG. 48), the embodiment has a disadvantage that the size of the entire sense amplifier is large.

In such dispersed arrangement of the SA drivers, if the sense amplifier circuits and the SA drivers of all the columns are connected to the common source line as in the conventional case, to guarantee a writing operation in an environment in which a power supply voltage of the memory cell and a voltage of the data line are different from each other, a size of each SA driver must be very small.

Then, the advantage that a large SA driver can be arranged cannot be employed efficiently, and a disadvantage of an area increase of the SA bank by newly forming an area for arranging a SA driver is only left. In other words, even if an SA driver arrangement area is formed, a space is formed between the SA drivers in the SA driver arrangement area because the size of each SA driver is small, resulting in low area efficiency.

Needless to say, when the size of the SA driver is reduced, efficiency of the SA driver for each column during reading becomes weak as described above. Thus, reading/refreshing performance may be deteriorated.

On the other hand, in the case of reducing the number of columns connected to the common source line, the number of SA drivers connected to the common source line is reduced. Then, even when the efficiency of the SA driver for each column during reading is made high beyond that of the conventional system (the sense amplifier circuits and the SA driver of all the columns are connected to one common source line) (i.e., size of each of the SA drivers arranged in the dispersed manner is enlarged) to improve the reading/refreshing performance, a size of the SA driver for each column to which writing is carried out during writing does not become relatively large. Thus, it is possible to guarantee a writing operation of a large margin.

Furthermore, the possibility of setting the large size of each of the SA drivers arranged in the dispersed manner leads to effective use of the SA driver arrangement area, and thus layout area efficiency is high. It can therefore be said that the reduction in the number of columns connected to the common source line and the dispersed arrangement of the SA drivers are highly compatible with each other.

Fifteenth Embodiment

According to a fifteenth embodiment, one common source line is disposed for every two adjacent sense amplifiers.

Figure 49:
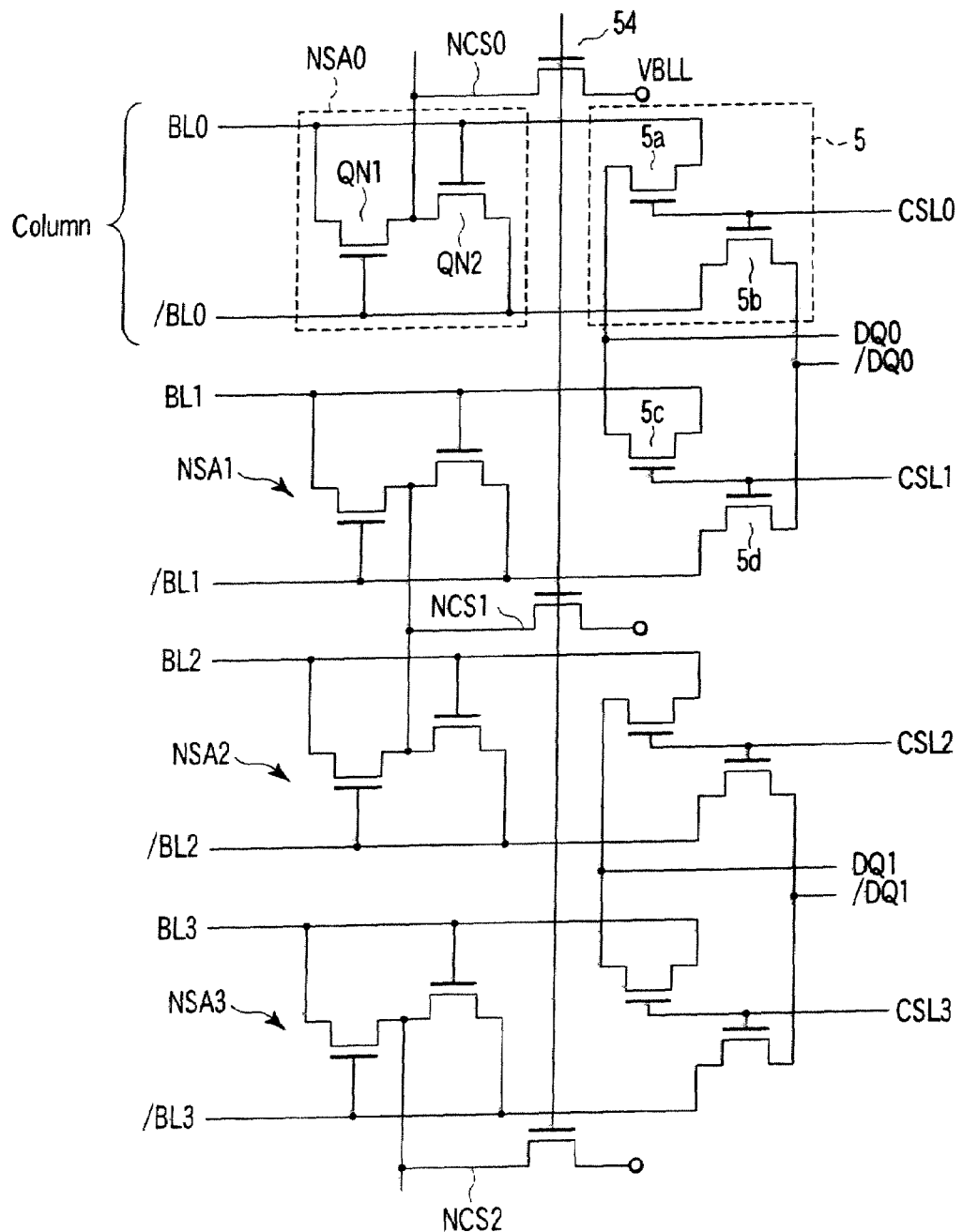
FIG. 49 is a circuit diagram showing a configuration of an SA bank disposed in a semiconductor memory device according to a fifteenth embodiment of the invention.

FIG. 49 is a circuit diagram showing a part of a configuration of an SA bank disposed in a semiconductor memory device of the fifteenth embodiment of the invention. FIG. 50 is a layout diagram showing a part of the configuration of the SA bank shown in FIG. 49.

One NCS is disposed for every two adjacent sense amplifier circuits. In other words, each NCS is connected to the two sense amplifier circuits. An NSA driver 54 is connected to each NCS.

Specifically, the NCS1 is connected to sources of N-channel MOS transistors QN1 and QN2 constituting an NSA1 (N-channel sense amplifier connected to a bit line pair BL1, /BL1). The NCS1 is connected to sources of N-channel MOS transistors QN1 and QN2 of an NSA2 (N-channel sense amplifier connected to a bit line pair BL2, /BL2).

FIGS. 49 and 50 show the NSA and the NCS as an example, and the PSA and the PCS are omitted. However, the PSA and the PCS may be configured as in the case of the NSA and the NCS.

In the semiconductor memory device thus configured, the number of columns connected to one common source line can be dramatically reduced. Thus, effects similar to those of the twelfth embodiment can be obtained.

Incidentally, the data line pair DQ, /DQ (node thereof) of the sense amplifier of a certain column is shared by columns of adjacent sense amplifiers on a side opposed to adjacent sense amplifiers which share a common source line NCS. In other words, the data line DQ, /DQ and the common source line NCS are alternately shared by the columns.

More specifically, data line pairs DQ, /DQ are disposed one each for one of the two bit line pairs BL, /BL connected to the two sense amplifiers which share the common source line NCS and an adjacent bit line pair on a side opposed to the other bit line pair.

Each DQ gate 5 is disposed between the bit line pair BL, /BL and the corresponding data line pair DQ, /DQ. The DQ gate 5 comprises an N-channel MOS transistor 5a for transferring data to the bit line BL, and an N-channel MOS transistor 5b for transferring data to the bit line /BL.

According to the embodiment, as shown in FIG. 50, an active area of a bit line BL0 side of the transistor QN1 and an active area of a bit line BL0 side of the transistor 5a of the corresponding DQ gate 5 are shared. Additionally, an active area of a bit line /BL0 side of the transistor QN2 and an active area of a bit line /BL0 side of the transistor 5b of the corresponding DQ gate 5 are shared.

Further, an active area of a data line DQ0 side of the transistor 5a and an active area of a data line DQ0 side of a transistor 5c of one of the adjacent columns are shared. An active area of a data line /DQ0 side of the transistor 5b and an active area of a data line /DQ0 side of a transistor 5d of one of the adjacent columns are shared.

Paying attention to a layout of the active areas (i.e., diffusion layers), a channel portion (overlapped portion of GC and active area) and a contact (CS) of the two transistors QN1, QN2 making a pair in sense amplifier circuit, arrangement of BL0 (CS), /BL0 (channel portion), and NCS0 (CS) of one of the SA transistors making a pair and arrangement of /BL0 (CS), BL0 (channel portion), and NCS0 (CS) of the other transistor are in a state of advancing-side-by-side symmetry in a bit line extending direction. Further, arrangement of BL0 (CS), CSL0 (channel portion), and DQ0 (CS) of one of the two transistors 5a, 5b making a pair of the DQ gate 5, and arrangement of /BL0 (CS), CSL0 (channel portion), and /DQ (CS) of the other transistor are also in a state of advancing-side-by-side symmetry.

That is, regarding the contact (CS) and the channel portion connected to the source/drain, the two transistors QN1, QN2 (NSA pair transistors) and the two transistors 5a, 5b (DQ gate pair transistors) are respectively in the states of advancing-side-by-side symmetries.

Thus, an influence of mask mismatching or the like in each step of a process similarly appears in the pair transistor, making it possible to limit a difference of device characteristics caused by an unbalance or the like of a threshold voltage Vt of the pair transistor to a minimum. Thus, it is possible to realize a sense amplifier for guaranteeing very stable performance.

Paying attention to the common source line, two active areas connected to the common source line of the pair transistor of the sense amplifier circuit of a certain column are shared with two active areas connected to the common source line of the pair transistor of the sense amplifier circuit of one of the adjacent columns. In other words, only the active areas shared by the adjacent columns are connected to one common source line (in FIG. 48 of the fourteenth embodiment, only the active areas shared by the adjacent columns are connected to one common source line though the layout itself is different).

According to the embodiment, the common source line of one pair transistor of a certain column is shared with the common source line of the pair transistor of one of the adjacent columns. However, pluralities of common source lines present in the SA bank are not interconnected. Thus, paying attention to one common source line, the number of connected columns can be very small, i.e., only two columns.

Thus, regarding a layout in which the active area of the bit line side of the pair transistor constituting the sense amplifier circuit and the active area of the bit line side of the DQ gate transistor are shared, and the active area of the common source line side of the pair transistor and the active area of the DQ line side of the DQ gate transistor are shared with the active area of the common source line side of the pair transistor of the adjacent column and the active area of the DQ line side of the DQ gate transistor of the adjacent column, a layout area becomes very small. This is because, since the pair transistors QN1, QN2 of the sense amplifier NSA and the DQ gate 5 are arranged in parallel, an entire size of a gate direction (size of bit line extending direction) is determined by the larger one either gate-direction sizes of the transistors 5a, 5b constituting the DQ gate 5 and gate-direction sizes of the pair transistors of the sense amplifiers NSA, and a smaller size has no influence at all on the entire size.

For example, if a gate width W of the gate of the transistors 5a, 5b constituting the DQ gate 5 is smaller than that of the gate of the pair transistors QN1, QN2 of the sense amplifier NSA, a width of the entire sense amplifier (width of the SA bank) is not affected by the size of the DQ gate. Thus, the gate width W of the transistors 5a, 5b can be enlarged without paying heed to an influence on the size of the entire sense amplifier.

If the gate width W of the transistors 5a, 5b can be enlarged, it is possible to set a large transistor size of the sense amplifier PSA when writing performance is made equal (writable minimum values of pulse width of CSL are equal), and thus a writing speed can be made faster. Further, by enlarging the transistor size of the sense amplifier PSA, an unbalance of a threshold voltage Vt can be suppressed small.

Accordingly, efficiency of amplifying a very small potential difference can be made high.

Incidentally, according to the embodiment, for designing, the gate width W of the transistors 5a, 5b constituting the DQ gate 5 is equal to that of the pair transistors QN1, QN2 of the sense amplifier NSA. This is also for a layout reason. In this layout, a data line DQ (/DQ) node, a GC of the DQ gate, a bit line BL (/BL) node, a GC which is a bit line /BL (BL) node and a common source line NCS must be arranged in the layout width of one column in the SA bank. However, this is very hard because of a design rule. It is more so because a gate length L of the pair transistors QN1, QN2 of the sense amplifier NSA must be longer to suppress the unbalance of the threshold voltage Vt.

If the transistors arranged in parallel are different in gate width W, a distance between the gates arrayed in parallel must be set large because of the design rule, making difficult laying-out in the width of one column. Accordingly, the gate length L must be shortened, deteriorating the sense amplifier performance. Further, if the shortened gate length L is shorter than a minimum gate length L permitted in designing, the layout of the embodiment itself is impossible.

Conventionally, in the sense amplifier layout of the advancing-side-by-side symmetry, one of the bit lines BL and /BL is laid out by using two layers, i.e., a first metal wiring M1 and a second metal wiring (M2) arranged thereon, whereby the bit lines BL and /BL are crossed. Thus, an influence of a yield of a via contact for interconnecting the wirings M1 and M2 has been strong.

However, without reconnecting both of the bit lines BL and /BL on the sense amplifier circuit by using other wiring layers as shown in FIG. 50, by laying-out with only the wiring M1, a high yield can be realized without any influence of a yield of a via contact. This is possible because gate signals (column selection lines CSL0, CSL1, CSL2, and CSL3) of the DQ gate transistors 5a, 5b making the pair are connected only by GC without using the wiring M1, and the number of signal lines which need to use the wiring M1 is reduced.

Sixteenth Embodiment

According to a sixteenth embodiment, a common source line is disposed for each sense amplifier.

Figure 51:
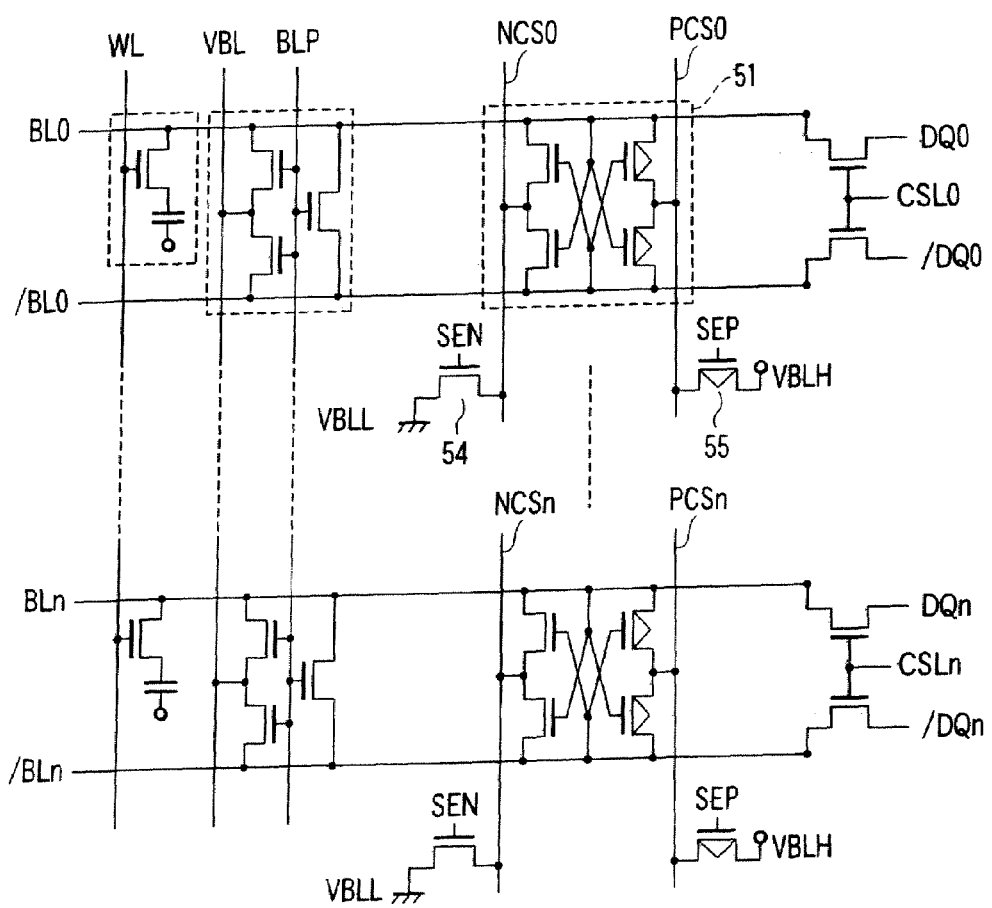
FIG. 51 is a circuit diagram showing a configuration of an SA bank disposed in a semiconductor memory device according to sixteenth embodiment of the invention.

FIG. 51 is a circuit diagram showing a part of a configuration of an SA bank disposed in a semiconductor memory device of the sixteenth embodiment of the invention.

In the SA bank a plurality of bit line pairs BL0 to BLn, /BL0 to /BLn are arranged. A sense amplifier circuit 51 is connected to each bit line pair BL, /BL. NSA common source lines NCS0 to NCSn are connected to the sense amplifier circuit 51. Additionally, PSA common source lines PCS0 to PCSn are connected to the sense amplifier 51. An NSA driver 54 is connected to each NCS. A PSA driver 55 is connected to each PCS.

Thus, if the number of columns connected to the common source line is one, it is possible to make SA driver efficiency per a column completely equal between reading and writing. In a latching state of the sense amplifier, any of the bit line pair BL, /BL of a column other than a column to which writing is carried out is not connected to the common source line via the transistor constituting the sense amplifier circuit. Accordingly, a potential of the common source line can be easily changed from a power supply potential (VBLH, VBLL), and a writing speed can be made faster without reducing the PSA size.

Seventeenth Embodiment

According to a seventeenth embodiment, sense amplifiers connected to adjacent bit line pairs sandwiching a WL stitch area are connected to one and the same common source line.

Figure 52:
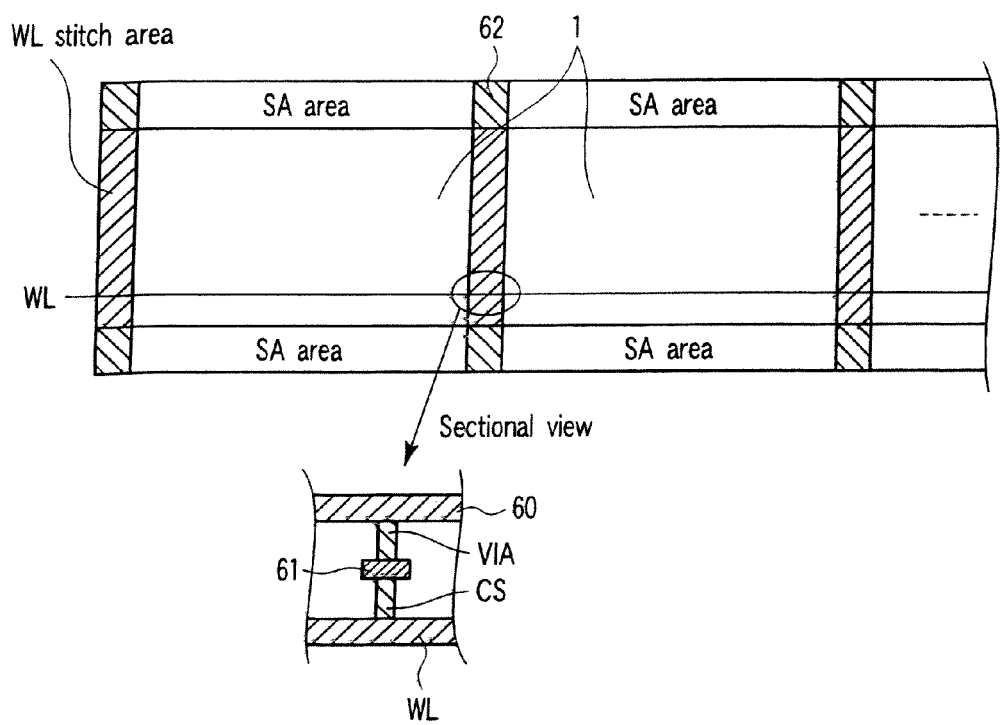
FIG. 52 is a schematic diagram showing a configuration of an SA bank disposed in a semiconductor memory device according to a seventeenth embodiment of the invention.

FIG. 52 is a schematic diagram showing a configuration of an SA bank disposed in a semiconductor memory device according to the seventeenth embodiment of the invention. Sense amplifier (SA) areas in which sense amplifiers are arranged are disposed in both sides of a memory cell array 1.

A plurality of word lines WL are disposed in the memory cell array 1. FIG. 52 shows a sectional view of the WL stitch area. A low-resistance metal wiring 60 is arranged above each word line WL (GC). Each word line WL and the corresponding low-resistance wiring 60 are connected to each other in the WL stitch area. In other words, the WL stitch area is an area for stitching the word line WL with the low-resistance metal wiring 60 arranged in parallel therewith. With this configuration, it is possible to reduce a signal delay of the word line WL.

Specifically, a metal layer 61 is disposed above the word line WL. The word line WL and the metal layer 61 are connected to each other through a contact (CS). The low-resistance metal wiring 60 is disposed above the metal layer 61. The metal layer 61 and the low-resistance metal wiring 60 are connected to each other through a contact (VIA contact). This WL stitch area is disposed for each predetermined number of columns.

Figure 53:
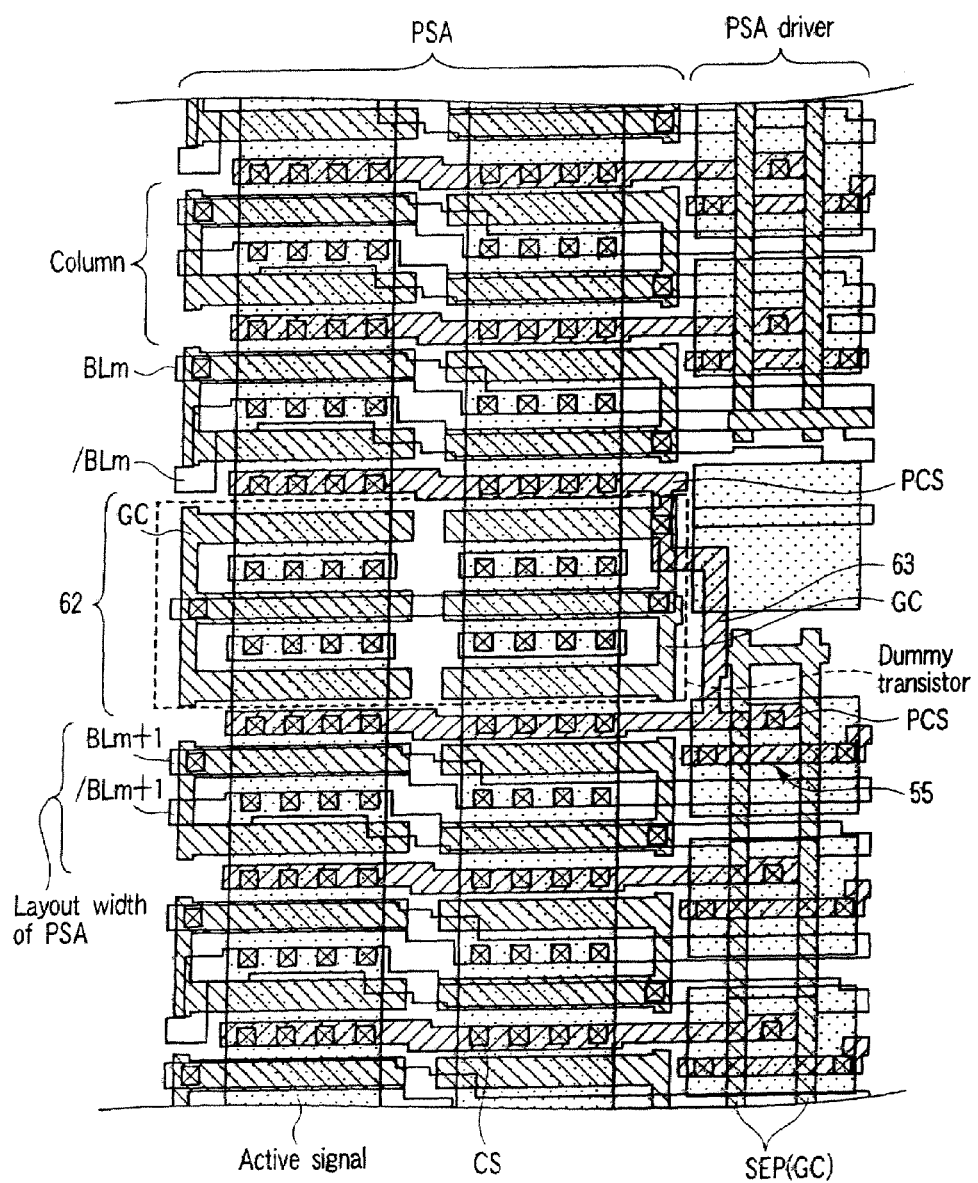
FIG. 53 is a layout diagram showing a configuration of an area 62 shown in FIG. 52.

FIG. 53 is a layout diagram showing a configuration of an area 62 shown in FIG. 52. The area 62 is a free area disposed adjacently to the WL stitch area and between two SA areas.

A PCS is arranged between two adjacent columns. This PCS is connected to PSA of columns of both sides. An area 62 is disposed between a column m including a bit line pair BLm, /BLm and a column m+1 including a bit line pair BLm+1, /BLm+1. This area 62 is a free area (sandwiched between sense amplifier areas) formed in the SA bank by disposing the WL stitch area.

Two PCS's arranged in both sides of the area 62 are connected to each other through a connection wiring 63. Then, one PSA driver 55 is connected to the two PCS's.

In the layout of the semiconductor memory device of the fourteenth or fifteenth embodiment, the common source line nodes are arranged in both ends of the NSA or PSA repetition units, and these nodes are arranged to overlap the common source nodes of the adjacent NSA or PSA repetition units (share the active areas) in the layout. On the other hand, one SA driver is arranged for the overlapped common source line nodes.

The NSA or PSA layout repetition in the area adjacent to the WL stitch area in the SA bank is interrupted. In other words, the common source line nodes of the WL stitch area side of the NSA or PSA of the sense amplifier circuits connected to the adjacent bit line pairs sandwiching the WL stitch area do not overlap each other in the layout. Thus, there is a problem of how SA drivers are arranged for the common source line nodes not overlapped in the layout.

For example, a width of the WL stitch area is not so large. Accordingly, it is often difficult to arrange one SA driver for each of two common source lines in a boundary with the WL stitch area.

Further, if one SA driver is arranged for each of the two common source lines, one SA driver is arranged for an unshared common source line, and thus only in two columns adjacent to the WL stitch area, SA driver efficiency becomes high. Such an SA driver efficiency difference caused by the column position complicates sense amplifier designing more.

A small-size SA driver can be arranged for each node of the two common source lines. In this case, however, a layout cycle of the SA drivers is disturbed, creating a problem of a complex layout structure.

Thus, according to the embodiment, the common source nodes of the two columns adjacent to the WL stitch area are connected to each other, and only one SA driver is arranged for the connected common source line nodes. In this way, the layout cycle of the SA drivers is not disturbed, and only in the two columns adjacent to the WL stitch area, SA driver efficiency does not become high. Moreover, no extra SA driver is arranged in the area adjacent to the WL stitch area in the SA bank. Thus, this area can be effectively used for another purpose.

The embodiment is described by taking the example of the configuration of the fourteenth embodiment. However, the embodiment can be similarly implemented in the case of the fifteenth embodiment.

Incidentally, as shown in FIG. 53, the PSA active area is continuously connected without being interrupted in the area 62.

If a potential of the common source line falls to a certain level because of junction leakage or the like caused by a crystal defect, before a signal is sufficiently output from the memory cell to the bit line after equalizing of the bit line is released, a sense operation may be started (slowly) to cause an erroneous operation. Accordingly, to prevent such an erroneous operation, the common source line may be precharged while the sense amplifier circuit is inactive.

For example, conventionally, the precharge transistor of the common source line is arranged in the area adjacent to the WL stitch area in the SA bank. However, if a configuration is employed in which the common source line is divided in the SA bank and columns connected to the common source lines are contained in column redundancy replacement units as in the case of the thirteenth embodiment, an influence on a yield is not so large even when the precharge transistor of the common source line is removed. In such a case, a free area is accordingly formed in the area adjacent to the WL stitch area in the SA bank, and thus a layout arranging no precharge transistor of the common source line is enabled as shown in FIG. 53.

It has been known that with device miniaturization, a distance from the element isolation area to the transistor channel portion affects transistor characteristics. In the case of a layout in which a precharge transistor of a common source line must be arranged in the area (area 62) adjacent to the WL stitch area in the SA bank and the PSA or the NSA is interrupted in the area 62 as in the conventional case, transistor characteristics differ between the PSA or NSA near the WL stitch area and the PSA or NSA far from the WL stitch area. However, such a problem does not occur in the case of a layout in which the PSA or NSA active area is not interrupted, as shown in FIG. 53.

If the active areas are only connected, the active area of the WL stitch area side (common source line side) becomes large in the sense amplifier nearest the WL stitch area, accordingly increasing a capacity. Thus, in FIG. 53, this is prevented by arranging a dummy transistor in the area 62.

Furthermore, the arrangement of the dummy transistor provides an effect that even in the sense amplifier nearest the WL stitch area, an environment of the gate and adjacent gate can be matched with that of the sense amplifier far from the WL stitch area.

Figure 54:
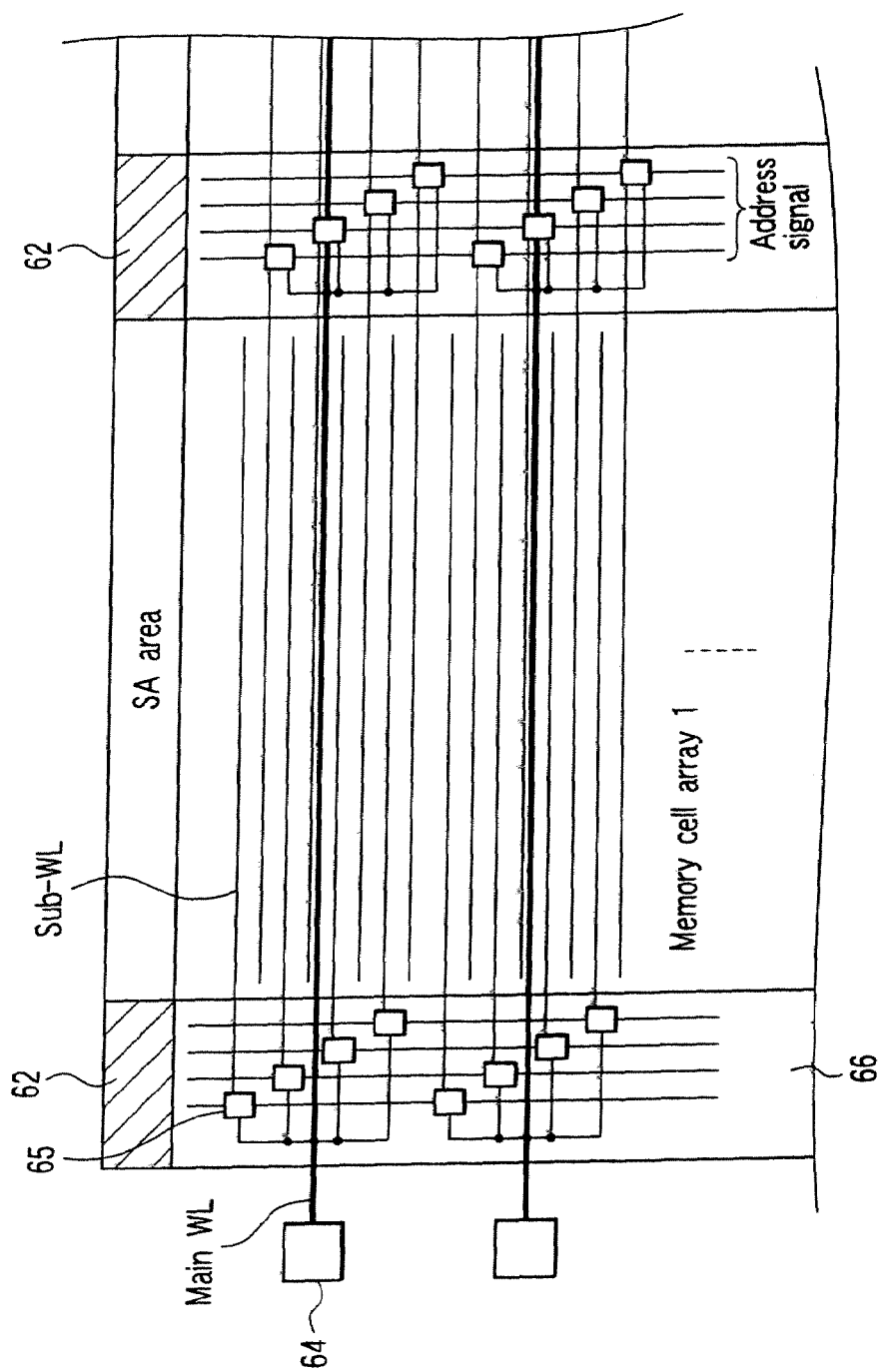
FIG. 54 is a schematic diagram showing a configuration of a semiconductor memory device which uses a layered word line system.

The embodiment can be applied to a layered word line system. FIG. 54 is a schematic diagram showing a configuration of the semiconductor memory device which uses the layered word line system.

In the memory cell array 1, a plurality of main word lines WL (main WL) are arranged. A main WL driver 64 is connected to each main WL. Each main WL is connected to, ex., four sub-word lines WL (sub-WL) via a sub-WL driver 65. An address signal is supplied to the sub-WL driver 65. The sub-WL driver 65 drives the sub-WL based on the address signal.

The sub-WL driver 65 is arranged in a sub-WL driver area 66. The sub-WL driver area 66 is disposed for each predetermined number of columns.

Here, in the semiconductor memory device, a large free area 62 is present because of the arrangement of the sub-WL driver 65. If the configuration shown in FIG. 53 is applied to the semiconductor memory device thus configured, effects similar to the embodiment can be obtained.

Eighteenth Embodiment

Figure 55:
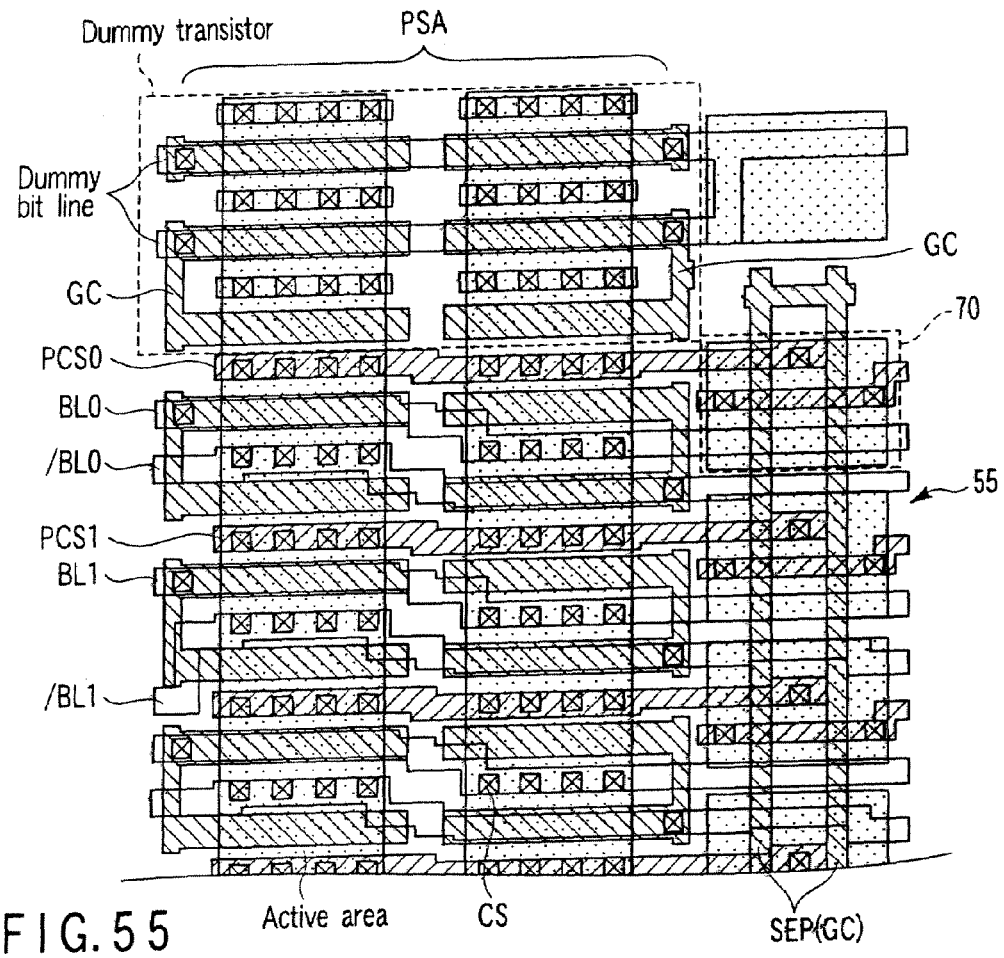
FIG. 55 is a layout diagram showing a configuration of an SA bank disposed in a semiconductor memory device according to an eighteenth embodiment of the invention.

FIG. 55 is a layout diagram showing a partial configuration of an SA bank disposed in a semiconductor memory device according to an eighteenth embodiment of the invention.

In the layout of the semiconductor memory device of the fourteenth embodiment, the NSA or PSA layout repetition is interrupted in the column of the SA bank end (column not connected to the dummy bit line but connected to the effective bit line). That is, the outside common source line (NCS, PCS) connected to the NSA or PSA in the column of the SA bank end is not shared by the adjacent column. Accordingly, there is a problem of how an SA driver is arranged for the outermost unshared common source line in the SA bank.

According to the embodiment, a PSA driver 70 of the same size as that of the PSA driver 55 connected to the other common source line is connected to the outside common source line PCS0 connected to the column of the SA bank end. It is to be noted that transistor sizes mean a gate length L and a gate width W.

In this case, there is a possibility that writing and reading performance will differ between a column other than that of the SA bank end which shares the PSA driver with an adjacent column and the column of the SA bank end.

However, if the performance difference is not so large, it is advisable to set the size of the PSA driver 70 connected to the common source line PCS0 equal to the size of the SA driver 55 connected to the other common source line. Thus, a layout structure will not be made complex.

FIG. 55 shows PSA and PCS as an example, while NSA and NCS are not shown. However, the NSA and the NCS may be configured as in the case of the PSA and the PCS.

The embodiment is described by taking the example of the configuration of the fourteenth embodiment. However, the embodiment can be similarly implemented in the case of the fifteenth embodiment.

Nineteenth Embodiment

According to a nineteenth embodiment, continuous access to columns which share a common source line in the same bank is prevented during a burst operation.

Figure 56:
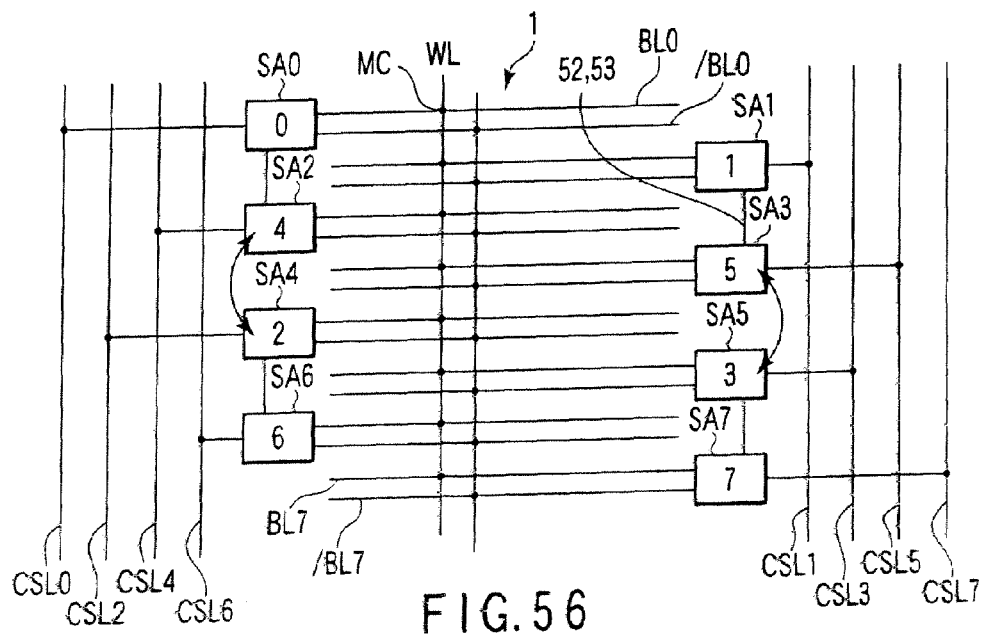
FIG. 56 is a schematic diagram showing a configuration of an SA bank disposed in a semiconductor memory device according to a nineteenth embodiment of the invention.
Figure 58:
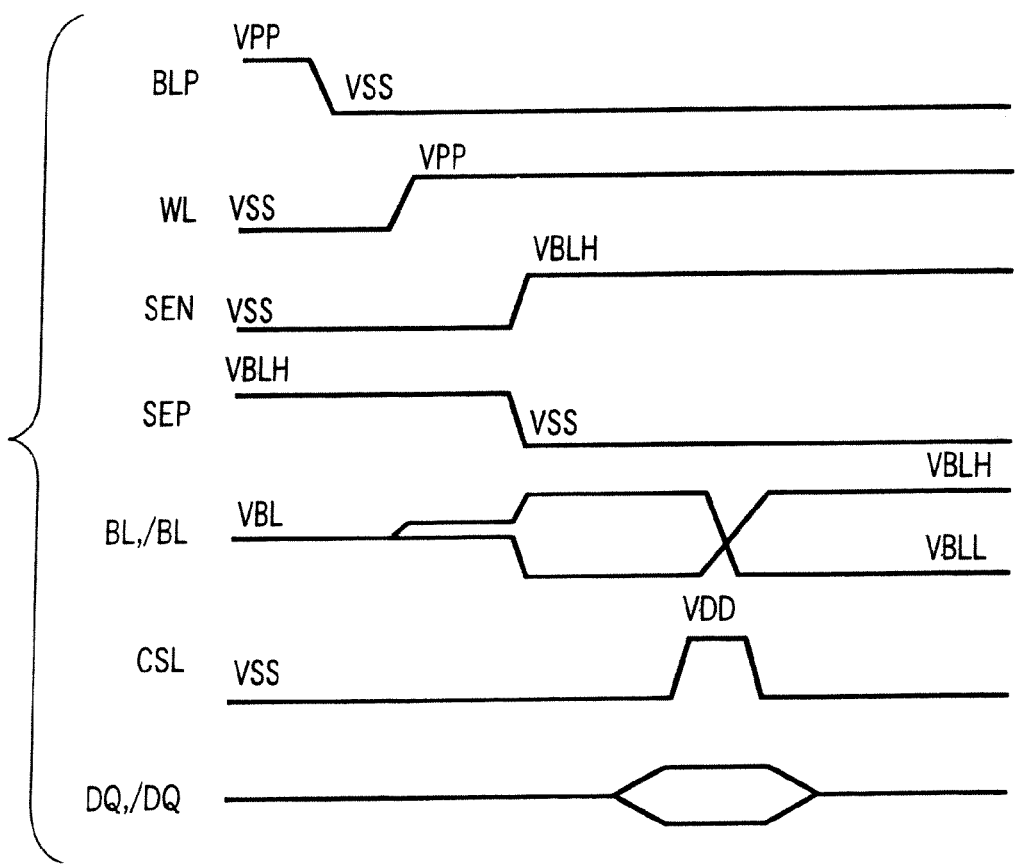
FIG. 58 is a timing chart of the DRAM shown in FIG. 57.
Figure 59:
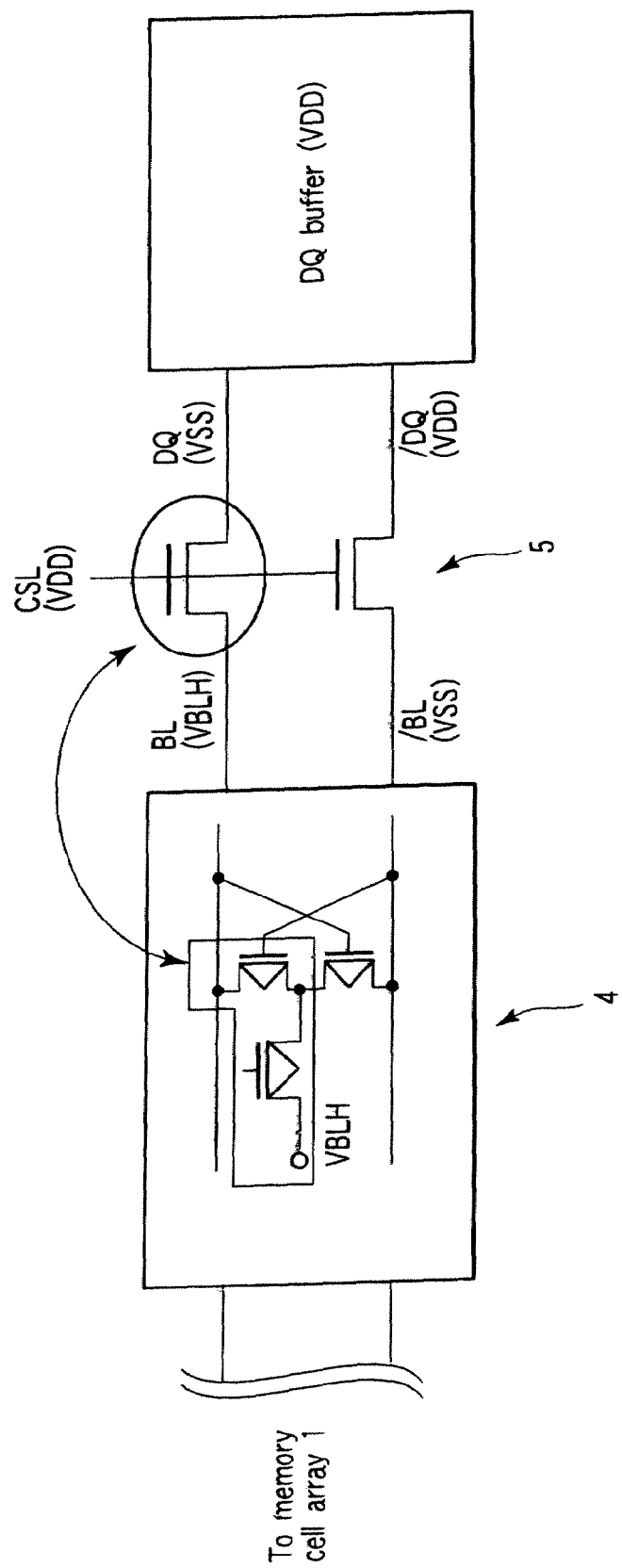
FIG. 59 is a block diagram showing a voltage relation during data writing.
Figure 60:
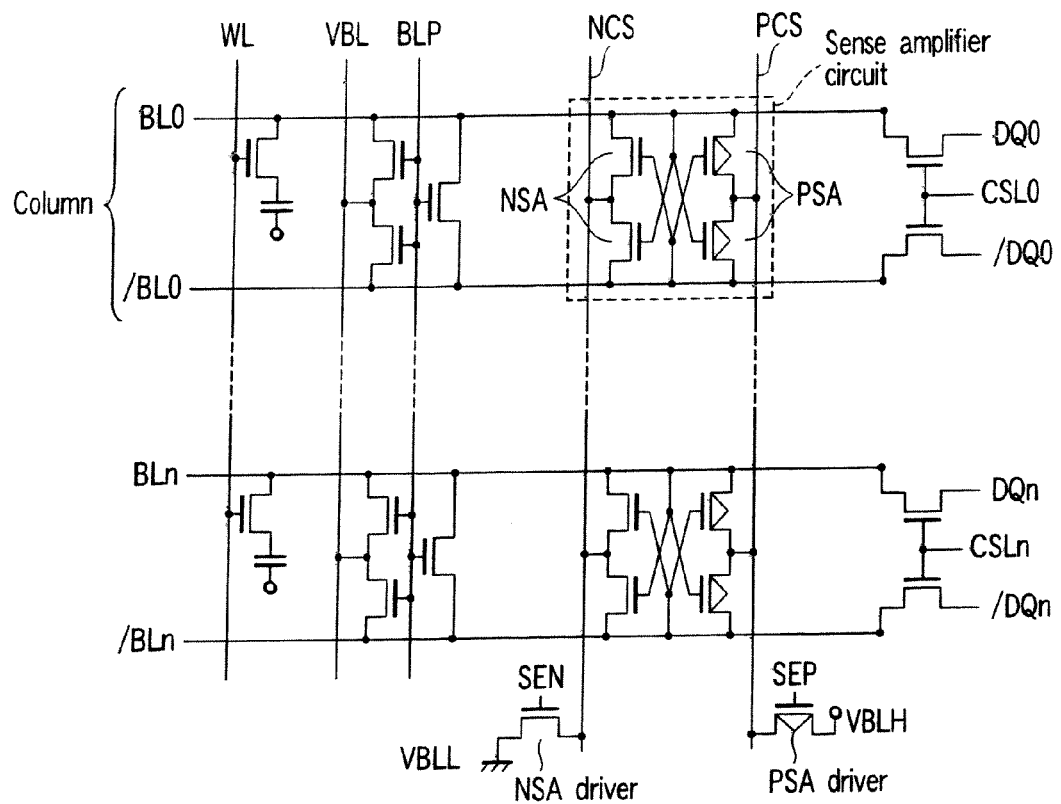
FIG. 60 is a circuit diagram showing an example of a DRAM.
Figure 61:
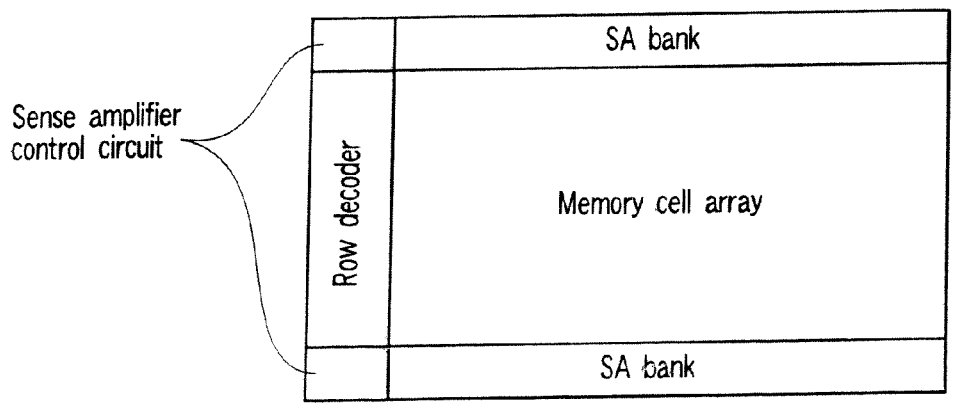
FIG. 61 is a block diagram showing another example of a DRAM.
Figure 62:
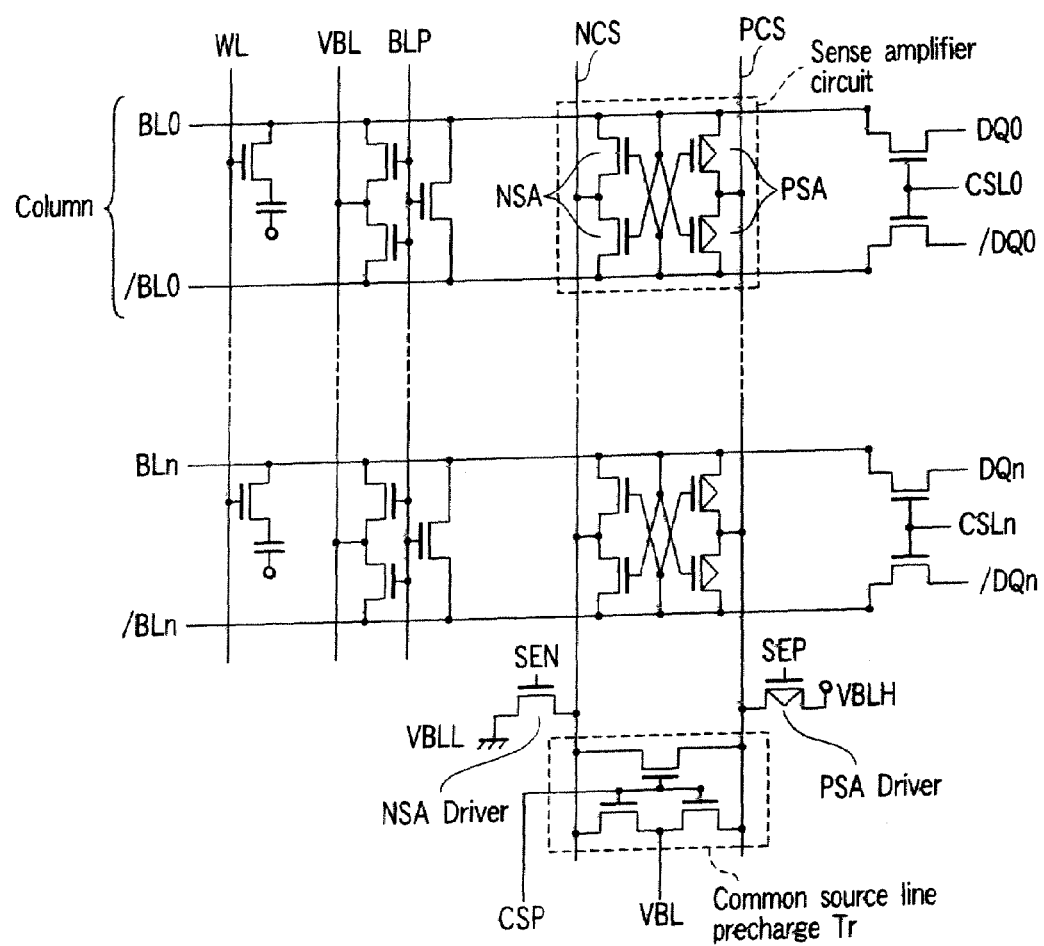
FIG. 62 is a circuit diagram showing yet another example of a DRAM.

FIG. 56 is a schematic diagram showing a partial configuration of an SA bank disposed in a semiconductor memory device according to the nineteenth embodiment of the invention.

For example, eight bit line pairs BL0 to BL7, /BL0 to /BL7 are arranged in a memory cell array 1. In both sides of the memory cell array 1, eight sense amplifiers SA0 to SA7 are arranged corresponding to the bit line pairs BL0 to BL7, /BL0 to /BL7. Specifically, the sense amplifiers SA0 to SA7 are alternately arranged in both sides of the memory cell array 1.

In FIG. 56, although one SA is connected to one CSL, of course, a plurality of SA's may be connected to one CSL.

An NCS 52 and a PCS 53 are arranged one each for two adjacent sense amplifiers SA. An NSA driver 54 (not shown) is connected to each NCS 52. A PSA driver 55 (not shown) is connected to each PCS 53.

A column selection line CSL0 is connected to the sense amplifier SA0 via a DQ gate 5 (not shown). A column selection line CSL2 is connected to the sense amplifier SA4 via the DQ gate 5. A column selection line CSL4 is connected to the sense amplifier SA2 via the DQ gate 5. A column selection line CSL6 is connected to the sense amplifier SA6 via the DQ gate 5.

A column selection line CSL1 is connected to the sense amplifier SA1 via the DQ gate 5. A column selection line CSL3 is connected to the sense amplifier SA5 via the DQ gate 5. A column selection line CSL5 is connected to the sense amplifier SA3 via the DQ gate 5. A column selection line CSL7 is connected to the sense amplifier SA7 via the DQ gate 5.

That is, the column selection line CSL2 connected to the sense amplifier SA2 and the column selection line CSL4 connected to the sense amplifier SA4 are replaced with each other to be connected in layout. Similarly, the column selection line CSL3 connected to the sense amplifier SA3 and the column selection line CSL5 connected to the sense amplifier SA5 are replaced to be connected in layout.

The semiconductor memory device performs a burst operation for executing continuous writing (or reading) in a plurality of columns. Here, for example, it is assumed that the number of continuously activated column selection lines CSL is four at the maximum. That is, the burst operation is carried out in units of the column selection lines CSL0 to CSL3 and the column selection lines CSL4 to CSL7. Numerals in the sense amplifiers shown in FIG. 56 represent orders of the sense amplifiers SA (i.e., columns) to be accessed.

When the column selection lines CSL0 to CSL3 are continuously activated, the sense amplifier SA0, the sense amplifier SA1, the sense amplifier SA4, and the sense amplifier SA5 are accessed in this order. When the column selection lines CSL4 to 7 are activated, the sense amplifier SA2, the sense amplifier SA3, the sense amplifier SA6, and the sense amplifier SA7 are accessed in this order.

In the semiconductor memory device thus configured, in the same SA bank, continuous access to two columns which share the common source lines 52, 53 is prevented. In the burst operation, before a writing operation in a column to which writing is carried out first is completely finished, a writing operation may probably be started in a column to which writing is carried out later.

In the case of continuous access to the two columns which share the common source line, efficiency of the SA drivers 54, 55 is dispersed for the columns, making a writing speed slow. Thus, the writing speed can be made faster by preventing the continuous access to the two columns which share the common source line.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor memory device comprising:
a memory cell array which has a plurality of memory cells arranged in a matrix form;
a plurality of bit line pairs which transfer data among the memory cells;
a sense amplifier bank which includes a plurality of sense amplifiers, the plurality of sense amplifiers including a plurality of sense amplifier circuits, and the plurality of sense amplifier circuits being connected respectively to the plurality of bit line pairs to amplify data transferred to the bit line pairs;
a plurality of word lines connected to the memory cells;
a plurality of wirings disposed respectively corresponding to the plurality of word lines and above the plurality of word lines; and
a plurality of stitch portions which connect the plurality of word lines to the plurality of wirings every predetermined intervals,
wherein two active areas in which the sense amplifier circuit is formed respectively in both sides of a stitch area corresponding to each of the stitch portions in the sense amplifier bank are connected to each other, and a dummy transistor is disposed on the connected active areas.

* * * * *